US011450734B2

(12) United States Patent
Kubouchi et al.

(10) Patent No.: US 11,450,734 B2
(45) Date of Patent: Sep. 20, 2022

(54) SEMICONDUCTOR DEVICE AND FABRICATION METHOD FOR SEMICONDUCTOR DEVICE

(71) Applicant: FUJI ELECTRIC CO., LTD., Kanagawa (JP)

(72) Inventors: Motoyoshi Kubouchi, Matsumoto (JP); Kosuke Yoshida, Matsumoto (JP); Soichi Yoshida, Matsumoto (JP); Koh Yoshikawa, Matsumoto (JP); Nao Suganuma, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 9 days.

(21) Appl. No.: 16/899,523

(22) Filed: Jun. 11, 2020

(65) Prior Publication Data

US 2020/0395215 A1 Dec. 17, 2020

(30) Foreign Application Priority Data

Jun. 17, 2019 (JP) ............................ JP2019-111761
Jan. 17, 2020 (JP) ............................ JP2020-006044
May 18, 2020 (JP) ............................ JP2020-087040

(51) Int. Cl.
*H01L 29/06* (2006.01)
*H01L 21/22* (2006.01)
(Continued)

(52) U.S. Cl.
CPC ........ *H01L 29/0615* (2013.01); *H01L 21/221* (2013.01); *H01L 21/26526* (2013.01);
(Continued)

(58) Field of Classification Search
CPC ............ H01L 29/0623; H01L 29/0619; H01L 29/0603; H01L 29/0607; H01L 29/0611;
(Continued)

(56) References Cited

U.S. PATENT DOCUMENTS 7,973,363 B2 * 7/2011 Hara .................. H01L 29/0657 257/341
10,204,979 B2 2/2019 Mizushima
(Continued)

FOREIGN PATENT DOCUMENTS

JP H08167715 A 6/1996
JP H10270370 A 10/1998
(Continued)

*Primary Examiner* — Eduardo A Rodela

(57) ABSTRACT

A semiconductor device includes an edge terminal structure portion provided between the active portion and an end portion of the semiconductor substrate on an upper surface of the semiconductor substrate, in which the edge terminal structure portion has a first high concentration region of the first conductivity type which has a donor concentration higher than a doping concentration of the bulk donor in a region between the upper surface and a lower surface of the semiconductor substrate, an upper surface of the first high concentration region is located on an upper surface side of the semiconductor substrate, and a lower surface of the first high concentration region is located on a lower surface side of the semiconductor substrate.

34 Claims, 46 Drawing Sheets

(51) Int. Cl.

| | |
|---|---|
| ***H01L 27/06*** | (2006.01) |
| ***H01L 29/10*** | (2006.01) |
| ***H01L 29/32*** | (2006.01) |
| ***H01L 21/324*** | (2006.01) |
| ***H01L 29/861*** | (2006.01) |
| ***H01L 29/739*** | (2006.01) |
| ***H01L 21/66*** | (2006.01) |
| ***H01L 21/265*** | (2006.01) |
| ***H01L 29/40*** | (2006.01) |

(52) U.S. Cl.
CPC ............ *H01L 21/324* (2013.01); *H01L 22/12* (2013.01); *H01L 27/0664* (2013.01); *H01L 29/0611* (2013.01); *H01L 29/0619* (2013.01); *H01L 29/0623* (2013.01); *H01L 29/1095* (2013.01); *H01L 29/32* (2013.01); *H01L 29/407* (2013.01); *H01L 29/7397* (2013.01); *H01L 29/8613* (2013.01)

(58) Field of Classification Search
CPC ............... H01L 29/0615; H01L 29/063; H01L 29/0693; H01L 29/1095; H01L 29/66333; H01L 29/7395; H01L 2924/13055; H01L 2924/01002
See application file for complete search history.

(56) References Cited

U.S. PATENT DOCUMENTS

2002/0130331 A1* 9/2002 Nemoto ................ H01L 29/872 257/109
2008/0142899 A1* 6/2008 Morris ................ H01L 29/0623 257/371
2013/0037851 A1 2/2013 Gejo
2015/0162407 A1 6/2015 Laven
2015/0179441 A1* 6/2015 Onozawa ............ H01L 29/7395 257/109
2015/0221756 A1 8/2015 Vellei
2015/0349066 A1 12/2015 Caspary
2016/0035821 A1* 2/2016 Pfirsch .................. H01L 29/407 257/139
2016/0204097 A1 7/2016 Laven
2018/0019319 A1 1/2018 Baburske
2018/0122895 A1 5/2018 Jelinek
2018/0286971 A1 10/2018 Philippou
2018/0350961 A1 12/2018 Naito
2019/0123185 A1 4/2019 Vellei
2019/0123186 A1 4/2019 Philippou
2019/0305083 A1 10/2019 Dainese
2019/0305087 A1 10/2019 Philippou
2020/0295076 A1* 9/2020 Lee ..................... H01L 27/1463

FOREIGN PATENT DOCUMENTS

JP 2005252212 A 9/2005
JP 2007266520 A 10/2007
JP 2013038329 A 2/2013
JP 2018030440 A 3/2018
WO 2012081664 A1 5/2014
WO 2018030440 A1 2/2018
WO 2019181852 A1 9/2019
WO 2020080295 A1 4/2020

* cited by examiner

100

100 b-b c−c

100

100 c−c

S508 c−c

S508

SEMICONDUCTOR DEVICE AND FABRICATION METHOD FOR SEMICONDUCTOR DEVICE

The contents of the following Japanese patent applications are incorporated herein by reference:

NO. 2019-111761 filed on Jun. 17, 2019, and

NO. 2020-006044 filed on Jan. 17, 2020, and

NO. 2020-087040 filed on May 18, 2020.

BACKGROUND

1. Technical Field

The present invention relates to a semiconductor device and a fabrication method for the semiconductor device.

2. Related Art

Up to now, a structure has been proposed where a P type guard ring is provided in an outer peripheral part of an N type semiconductor substrate on which a semiconductor device such as an insulated gate bipolar transistor (IGBT) is formed, and a breakdown voltage is improved (for example, see Patent Literature 1).

Patent Literature 1: Japanese Unexamined Patent Application Publication No. 8-167715

A fluctuation of the breakdown voltage is preferably small in a semiconductor device.

SUMMARY

To address the above-described issue, according to an aspect of the present invention, there is provided a semiconductor device including a semiconductor substrate in which a bulk donor of a first conductivity type is entirely distributed. The semiconductor device may include an active portion provided in the semiconductor substrate. The semiconductor device may include an edge terminal structure portion provided in the semiconductor substrate, and provided between the active portion and an end portion of the semiconductor substrate on an upper surface of the semiconductor substrate. The edge terminal structure portion may have a first high concentration region of the first conductivity type which has a donor concentration higher than a doping concentration of the bulk donor in a region between the upper surface and a lower surface of the semiconductor substrate. An upper surface of the first high concentration region may be located on an upper surface side of the semiconductor substrate. A lower surface of the first high concentration region may be located on a lower surface side of the semiconductor substrate.

The first high concentration region may be arranged on the upper surface side of the semiconductor substrate, and have a hydrogen peak portion where a hydrogen concentration shows a peak in a hydrogen concentration distribution in a depth direction.

The hydrogen peak portion may contain helium.

The edge terminal structure portion may have a plurality of guard rings of a second conductivity type in contact with the upper surface of the semiconductor substrate.

The edge terminal structure portion may have a second high concentration region that is provided between two of the mutually adjacent guard rings, the second high concentration region having a donor concentration higher than the doping concentration of the bulk donor.

The hydrogen peak portion may be arranged to be located lower than the second high concentration region.

The hydrogen peak portion may be arranged between a lower end of each of the guard rings and the lower surface of the semiconductor substrate.

The first high concentration region may be in contact with the guard ring.

The active portion may have a base region of the second conductivity type which is arranged on the upper surface side of the semiconductor substrate. The active portion may have a well region that has a higher doping concentration than the base region, and is also provided to be deeper than the base region. A distance between the hydrogen peak portion and the second high concentration region in the depth direction may be lower than a maximum value of a distance between the well region and each point of the closest guard ring to the well region.

The hydrogen peak portion may be arranged in the second high concentration region.

The second high concentration region may contain hydrogen implanted from the upper surface of the semiconductor substrate. The hydrogen peak portion may contain hydrogen implanted from the lower surface of the semiconductor substrate. A hydrogen concentration distribution of the second high concentration region in the depth direction may have a first peak where a hydrogen concentration shows a peak. The first peak may be overlapped with the hydrogen peak portion. The hydrogen peak portion may be arranged between the first peak and the upper surface of the semiconductor substrate.

The second high concentration region may contain a hydrogen donor.

Between the two mutually adjacent guard rings, the second high concentration region may be provided from a position shallower than the lower end of each of the guard rings to a position deeper than the lower end of each of the guard rings.

The second high concentration region may be in contact with the upper surface of the semiconductor substrate.

The second high concentration region may have an upper part in contact with the upper surface of the semiconductor substrate, and a lower part that is provided as a separate part from the upper part, and is provided from the position shallower than the lower end of each of the guard rings to the position deeper than the lower end of each of the guard rings.

The first high concentration region may have a hydrogen donor.

The bulk donor may be phosphorus or antimony. The first high concentration region may be provided in a range that does not reach the active portion. The first high concentration region may have an inner part, and an outer part that is provided on an outer side relative to the inner part, and has a longer length of the semiconductor substrate in the depth direction than the inner part. A bulk acceptor of a second conductivity type may be entirely distributed in the semiconductor substrate. The bulk acceptor may be boron.

A dose amount of the donor of the second high concentration region may be equal to or lower than $5\times10^{11}/cm^2$.

The dose amount of the donor of the second high concentration region may be equal to or higher than $1\times10^{11}/cm^2$.

A peak value of the donor concentration in the second high concentration region may be 10 times as high as the doping concentration of the bulk donor or higher.

The peak value of the donor concentration in the second high concentration region may be 10 times as high as a minimum value of the donor concentration in the first high concentration region or higher.

A distance between a lower end of the second high concentration region and an upper end of the first high concentration region may be equal to or lower than 50 μm.

The distance between the lower end of the second high concentration region and the upper end of the first high concentration region may be equal to or higher than 15 μm.

A depth position of the lower end of the second high concentration region may be away from the upper surface of the semiconductor substrate by 2 μm or more.

The active portion may have a fourth high concentration region of the first conductivity type in which the donor concentration is higher than the doping concentration of the bulk donor in a region between the upper surface and the lower surface of the semiconductor substrate. An upper surface of the fourth high concentration region may be located on the upper surface side of the semiconductor substrate. A lower surface of the fourth high concentration region may be located on the lower surface side of the semiconductor substrate. The donor concentration of the fourth high concentration region may be different from the donor concentration of the first high concentration region.

The active portion may have the fourth high concentration region of the first conductivity type in which the donor concentration is higher than the doping concentration of the bulk donor in the region between the upper surface and the lower surface of the semiconductor substrate. The upper surface of the fourth high concentration region may be located on the upper surface side of the semiconductor substrate. The lower surface of the fourth high concentration region may be located on the lower surface side of the semiconductor substrate. An upper end position of the fourth high concentration region may be different from an upper end position of the first high concentration region.

The first high concentration region may also be provided in the active portion. The active portion may have the base region of the second conductivity type which is arranged on the upper surface side of the semiconductor substrate. The active portion may have a low concentration region of the second conductivity type which is arranged between the base region and the first high concentration region and has a lower doping concentration than the base region.

In the edge terminal structure portion, the first high concentration region and the second high concentration region may be continuously provided.

The first high concentration region may also be provided in the active portion. The active portion may have the base region of the second conductivity type which is arranged on the upper surface side of the semiconductor substrate. The active portion may have the low concentration region of the second conductivity type which is arranged between the base region and the first high concentration region and has a lower doping concentration than the base region. In the edge terminal structure portion, the first high concentration region may be provided up to a position above a lower end of the guard ring.

According to a second aspect of the present invention, a fabrication method for a semiconductor device is provided. The fabrication method may include a measurement step to measure a thickness of a semiconductor substrate in which a bulk donor of a first conductivity type is entirely distributed. The fabrication method may include a first hydrogen implantation step to adjust an implantation condition in accordance with the thickness of the semiconductor substrate, and implant hydrogen ions from a lower surface of the semiconductor substrate to an upper surface side of the semiconductor substrate. The fabrication method may include an anneal step to anneal the semiconductor substrate and form, in a passage region through which the hydrogen ions have passed, a first high concentration region of the first conductivity type in which a donor concentration is higher than a doping concentration of the bulk donor.

The first hydrogen implantation step may include adjusting an implantation depth of the hydrogen ions in accordance with the thickness of the semiconductor substrate.

The first hydrogen implantation step may include adjusting acceleration energy of the hydrogen ions in accordance with the thickness of the semiconductor substrate.

The first hydrogen implantation step may include adjusting a characteristic of a shielding member arranged on the lower surface of the semiconductor substrate in accordance with the thickness of the semiconductor substrate.

The first hydrogen implantation step may include adjusting a dose amount of the hydrogen ions in accordance with the thickness of the semiconductor substrate.

The anneal step may include adjusting an anneal condition of the semiconductor substrate in accordance with the thickness of the semiconductor substrate.

The fabrication method may include a second hydrogen implantation step to implant hydrogen ions from the lower surface of the semiconductor substrate to a region on a lower surface side of the semiconductor substrate before the anneal step. The second hydrogen implantation step may include adjusting the implantation condition of the hydrogen ions in accordance with the thickness of the semiconductor substrate.

The summary clause does not necessarily describe all necessary features of the embodiments of the present invention. The present invention may also be a sub-combination of the features described above.

DESCRIPTION OF EXEMPLARY EMBODIMENTS

Figure 1:
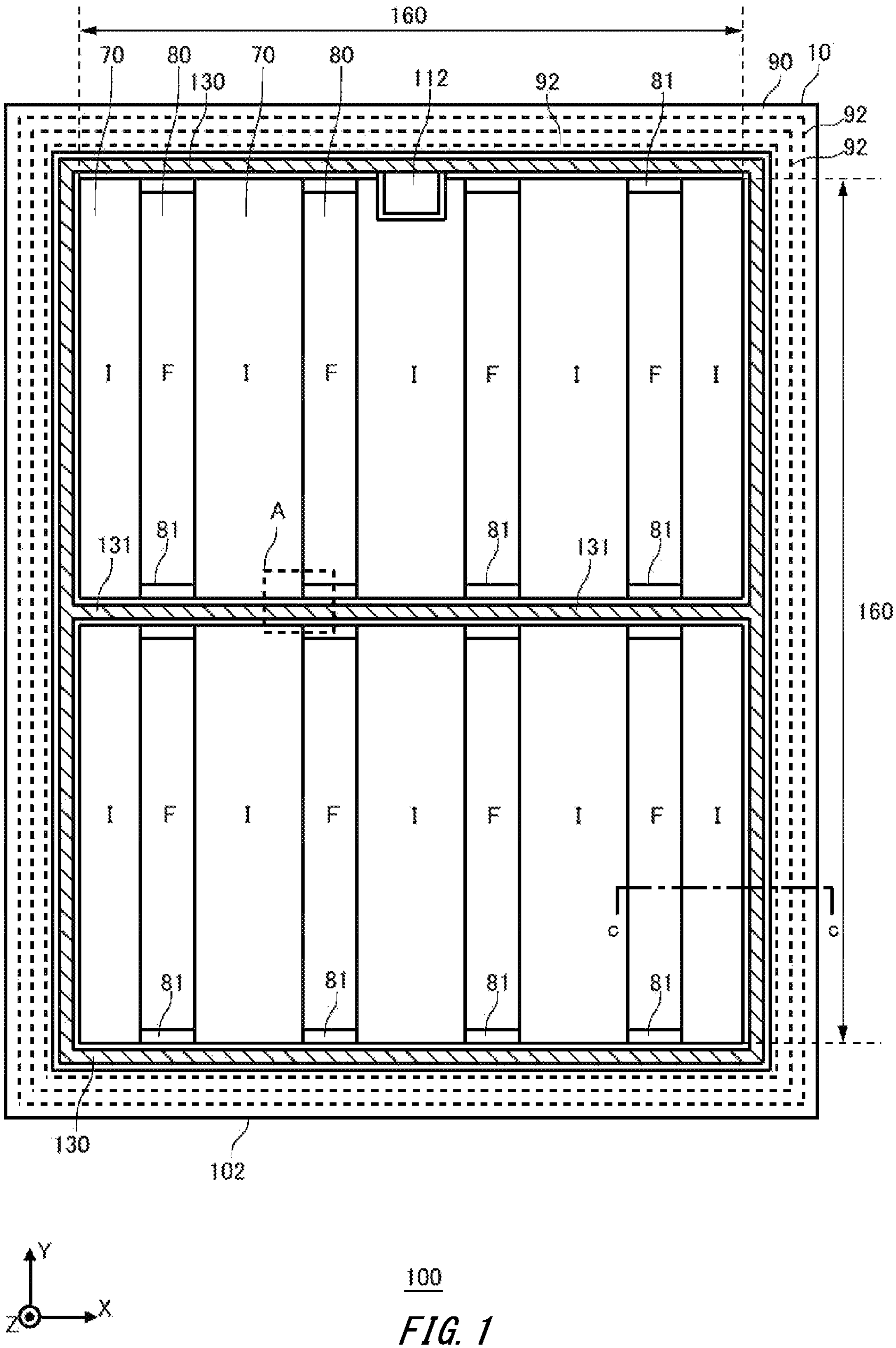
FIG. 1 is a top view illustrating an example of a semiconductor device 100 according to an embodiment of the present invention.

Hereinafter, the present invention will be described by way of embodiments, but the following embodiments are not intended to limit the invention according to the claims. In addition, not all combinations of features described in the embodiments necessarily have to be essential to solving means of the invention.

One side in a direction parallel to a depth direction of a semiconductor substrate is referred to as an "upper" side, and the other side is referred to as a "lower" side in the present specification. One surface out of two main surfaces of a substrate, a layer, or other members is referred to as an upper surface, and the other surface is referred to as a lower surface. The "upper" and "lower" directions are not limited to the gravitational direction or a direction at the time of mounting of a semiconductor device.

According to the present specification, technical matters may be described using orthogonal coordinate axes of an X axis, a Y axis and a Z axis in some cases. The orthogonal coordinate axes merely identify relative positions of components, and are not intended to limit particular directions. For example, the Z axis is not intended to solely represent a height direction to a ground surface. It is noted that a+Z axis direction and a −Z axis direction are in mutually opposite directions. In a case where a Z axis direction is stated without stating plus and minus, the Z axis direction means a direction in parallel with the +Z axis direction and the −Z axis direction.

According to the present specification, orthogonal axes in parallel with an upper surface and a lower surface of the semiconductor substrate are set as the X axis and the Y axis. In addition, an axis perpendicular to the upper surface and the lower surface of the semiconductor substrate is set as the Z axis. According to the present specification, the Z axis direction may be referred to as a depth direction in some cases. In addition, according to the present specification, a direction in parallel with the upper surface and the lower surface of the semiconductor substrate, including the X axis and the Y axis, may be referred to as a horizontal direction in some cases.

In a case where a term "the same" or "equal" is described according to the present specification, a case where an error derived from a production tolerance may also be included. The error is, for example, within 10%.

According to the present specification, descriptions are provided while a conductivity type of a doping region in which impurities are doped is set as a P type or an N type. According to the present specification, the impurities may particularly mean either an N type donor or a P type acceptor in some cases, and may be referred to as a dopant in some cases. According to the present specification, doping means that the donor or the acceptor is introduced to the semiconductor substrate to be transformed into a semiconductor showing an N type conductivity type or a P type conductivity type.

According to the present specification, a doping concentration means a donor concentration or an acceptor concentration in a thermal equilibrium state. According to the present specification, a net doping concentration means an added-up net concentration including charge polarities while the donor concentration is set as a positive ion concentration, and the acceptor concentration is set as a negative ion concentration. In one example, when the donor concentration is set as $N_D$, and the acceptor concentration is set as $N_A$, the net doping concentration in any position is set as $N_D$-$N_A$.

The donor has a function for supplying electrons to a semiconductor. The acceptor has a function for receiving electrons from a semiconductor. The donor and the acceptor are not limited to the impurities themselves. For example, a VOH defect in which a vacancy (V), oxygen (O), and hydrogen (H) that are present in the semiconductor are combined functions as the donor for supplying electrons.

In a case where a P+ type or an N+ type is described in the present specification, it means that the doping concentration is higher than the P type or the N type, and in a case where a P− type or an N− type is described, it means that the doping concentration is lower than the P type or the N type. In addition, in a case where a P++ type or an N++ type is described in the present specification, it means that the doping concentration is higher than the P+ type or the N+ type.

A chemical concentration in the present specification refers to an impurity atomic density that is measured irrespective of an electrical activation state. The chemical concentration can be measured by secondary ion mass spectrometry (SIMS), for example. The above-described net doping concentration can be measured by a voltage-capacitance measurement method (CV method). In addition, a carrier concentration measured by a spreading resistance profiling method (SRP method) may be set as the net doping concentration. The carrier concentration measured by the CV method or the SRP method may be set as a value in the thermal equilibrium state. In addition, since the donor concentration is sufficiently higher than the acceptor concentration in the N type region, the carrier concentration in this region may also be set as the donor concentration. Similarly, in the P type region, the carrier concentration in the region may also be set as the acceptor concentration.

In addition, in a case where a donor, acceptor, or net doping concentration distribution has a peak, the peak value may be set as the donor, acceptor, or net doping concentration in the region. In a case, for example, where the donor, acceptor, or net doping concentration is substantially uniform, an average value of the donor, acceptor, or net doping concentration in the region may be set as the donor, acceptor, or net doping concentration.

The carrier concentration measured by the SRP method may also be lower than the donor or acceptor concentration. In a range where a current flows when a spreading resistance is measured, a carrier mobility of the semiconductor substrate may be lower than a value of a carrier mobility in a crystalline state in some cases. A reduction in the carrier mobility may occur when carriers scatter due to an interruption (disorder) of a crystalline structure caused by a lattice defect or the like.

The donor or acceptor concentration calculated from the carrier concentration measured by the CV method or the SRP method may be lower than a chemical concentration of an element showing the donor or acceptor. In one example, a donor concentration of phosphorus or arsenic serving as the donor in a silicon semiconductor or an acceptor concentration of boron serving as the acceptor is approximately 99% of these chemical concentrations. On the other hand, a donor concentration of hydrogen serving as the donor in the silicon semiconductor is approximately 0.1% to 10% of a chemical concentration of hydrogen.

FIG. 1 is a top view illustrating an example of a semiconductor device 100 according to an embodiment of the present invention. FIG. 1 illustrates positions obtained by projecting the respective members onto an upper surface of a semiconductor substrate 10. FIG. 1 illustrates only some of members of the semiconductor device 100, and other members are omitted.

The semiconductor device 100 includes the semiconductor substrate 10. The semiconductor substrate 10 has an end side 102 in a top view. In a case where the top view is simply mentioned in the present specification, it means viewing from an upper surface side of the semiconductor substrate 10. The semiconductor substrate 10 in this example has two pairs of the end sides 102 mutually facing in the top view. In FIG. 1, the X axis and the Y axis are in parallel with any of the end sides 102. In addition, the Z axis is perpendicular to the upper surface of the semiconductor substrate 10.

An active portion 160 is provided in the semiconductor substrate 10. The active portion 160 is a region where a main current flows in the depth direction between the upper surface and the lower surface of the semiconductor substrate 10 when the semiconductor device 100 operates. An emitter electrode is provided above the active portion 160, but is omitted in FIG. 1.

At least one of a transistor portion 70 including a transistor element such as an IGBT and a diode portion 80 including a diode element such as a freewheeling diode (FWD) is provided in the active portion 160. In the example of FIG. 1, the transistor portions 70 and the diode portions 80 are alternately arranged on the upper surface of the semiconductor substrate 10 in a predetermined array direction (X axis direction in this example). In another example, only one of the transistor portion 70 and the diode portion 80 may also be provided in the active portion 160.

In FIG. 1, a region where the transistor portion 70 is arranged is assigned with a sign "I", and a region where the diode portion 80 is arranged is assigned with a sign "F". According to the present specification, a direction perpendicular to the array direction in the top view may be referred to as an extending direction (Y axis direction in FIG. 1) in some cases. Each of the transistor portion 70 and the diode portion 80 may have a longitudinal side in the extending direction. In other words, a length of the transistor portion 70 in the Y axis direction is larger than a width in the X axis direction. Similarly, a length of the diode portion 80 in the Y axis direction is larger than a width in the X axis direction. The extending direction of the transistor portion 70 and the diode portion 80 may be the same as a longitudinal direction of each of trench portions which will be described below.

The diode portion 80 has an N+ type cathode region in the region in contact with the lower surface of the semiconductor substrate 10. According to the present specification, the region where the cathode region is provided is referred to as the diode portion 80. In other words, the diode portion 80 is a region overlapped with the cathode region in the top view. On the lower surface of the semiconductor substrate 10, a P+ type collector region may be provided in a region other than the cathode region. According to the present specification, an extended region 81 obtained by extending the diode portion 80 in the Y axis direction up to a gate runner which will be described below may be included in the diode portion 80 too in some cases. The collector region is provided on a lower surface of the extended region 81.

The transistor portion 70 has the P+ type collector region in the region in contact with the lower surface of the semiconductor substrate 10. In addition, in the transistor portion 70, gate structures each including an N type emitter region, a P type base region, a gate conductive portion, and a gate dielectric film are periodically arranged on the upper surface side of the semiconductor substrate 10.

The semiconductor device 100 may have one or more pads above the semiconductor substrate 10. The semiconductor device 100 in this example has a gate pad 112. The semiconductor device 100 may also have pads such as an anode pad, a cathode pad, and a current detection pad. Each pad is arranged in the vicinity of the end side 102. The region in the vicinity of the end side 102 refers to a region between the end side 102 and the emitter electrode in the top view. At the time of mounting of the semiconductor device 100, each pad may be connected to an external circuit via a wiring such as a wire.

The gate pad 112 is applied with a gate potential. The gate pad 112 is electrically connected to a conductive portion of a gate trench portion in the active portion 160. The semiconductor device 100 includes a gate runner that connects the gate pad 112 to the gate trench portion. In FIG. 1, diagonal hatching is applied to the gate runner.

The gate runner in this example has an outer peripheral gate runner 130 and an active-side gate runner 131. The outer peripheral gate runner 130 is arranged between the active portion 160 and the end side 102 of the semiconductor substrate 10 in the top view. The outer peripheral gate runner 130 in this example surrounds the active portion 160 in the top view. A region surrounded by the outer peripheral gate runner 130 in the top view may also be set as the active portion 160. In addition, the outer peripheral gate runner 130 is connected to the gate pad 112. The outer peripheral gate runner 130 is arranged above the semiconductor substrate 10. The outer peripheral gate runner 130 may be a metallic wiring including aluminum or the like.

The active-side gate runner 131 is provided in the active portion 160. When the active-side gate runner 131 is provided in the active portion 160, it is possible to suppress a fluctuation of a wiring length from the gate pad 112 for each region of the semiconductor substrate 10.

The active-side gate runner 131 is connected to the gate trench portion in the active portion 160. The active-side gate runner 131 is arranged above the semiconductor substrate 10. The active-side gate runner 131 may be a wiring formed of a semiconductor such as polysilicon in which impurities are doped.

The active-side gate runner 131 may be connected to the outer peripheral gate runner 130. The active-side gate runner 131 in this example is provided extending in the X axis direction to transverse the active portion 160 from the outer peripheral gate runner 130 on one side to the outer peripheral gate runner 130 on the other side substantially in the center in the Y axis direction. In a case where the active portion 160 is divided by the active-side gate runner 131, the transistor portions 70 and the diode portions 80 may be alternately arranged in each of the divided regions in the X axis direction.

In addition, the semiconductor device 100 may also include a temperature sensing unit that is not illustrated in the drawing and serves as a PN junction diode formed of polysilicon or the like, and a current detection unit that is not illustrated in the drawing and configured to simulate an operation of the transistor portion included in the active portion 160.

The semiconductor device 100 in this example includes an edge terminal structure portion 90 between the active portion 160 and the end side 102. The edge terminal structure portion 90 in this example is arranged between the outer peripheral gate runner 130 and the end side 102. The edge terminal structure portion 90 mitigates an electric field concentration on an upper surface side of the semiconductor substrate 10. The edge terminal structure portion 90 includes a plurality of guard rings 92. Each of the guard rings 92 is a P type region in contact with the upper surface of the semiconductor substrate 10. The guard ring 92 may surround the active portion 160 in the top view. The plurality of guard rings 92 are arranged at a predetermined interval between the outer peripheral gate runner 130 and the end side 102. The guard ring 92 arranged on an outer side may surround the guard ring 92 arranged on an inner side next to the outer side. The outer side refers to a side close to the end side 102, and the inner side refers to a side close to the outer peripheral gate runner 130. When the plurality of guard rings 92 are provided, a depletion layer on an upper surface side of the active portion 160 can extend onto the outer side, and it is possible to improve a breakdown voltage of the semiconductor device 100. The edge terminal structure portion 90 may also further include at least one of a field plate and a RESURF annularly provided to surround the active portion 160.

Figure 2:
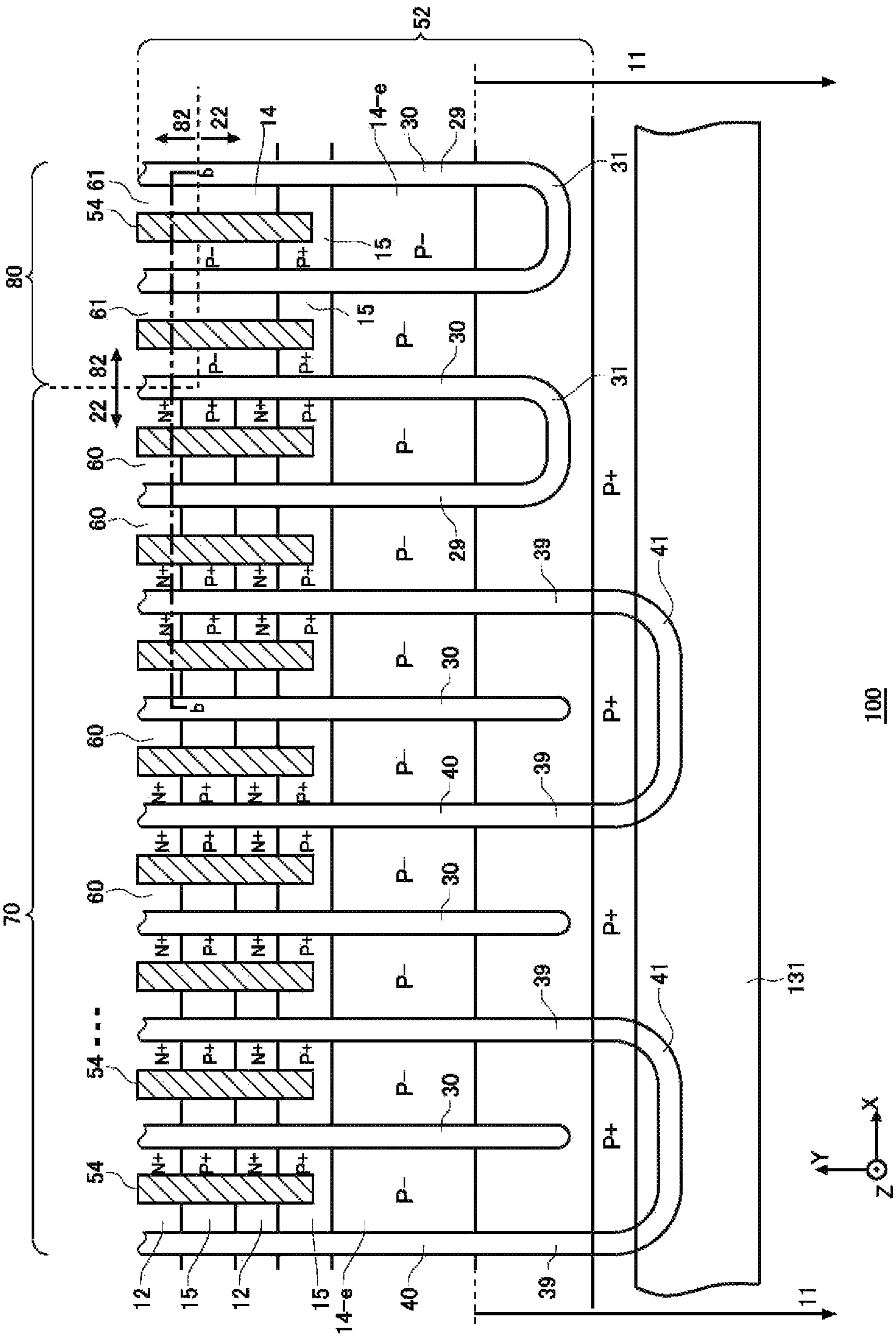
FIG. 2 is an enlarged view of a region A in FIG. 1.

FIG. 2 is an enlarged view of a region A in FIG. 1. The region A is a region including the transistor portion 70, the diode portion 80, and the active-side gate runner 131. The semiconductor device 100 in this example includes a gate trench portion 40, a dummy trench portion 30, a well region 11, an emitter region 12, a base region 14, and a contact region 15 that are provided inside the semiconductor substrate 10 on the upper surface side. Each of the gate trench portion 40 and the dummy trench portion 30 is an example of a trench portion. In addition, the semiconductor device 100 in this example includes an emitter electrode 52 and an active-side gate runner 131 that are provided above the upper surface of the semiconductor substrate 10. The emitter electrode 52 and the active-side gate runner 131 are provided while being separated from each other.

An interlayer dielectric film is provided between the emitter electrode 52 and the active-side gate runner 131 and the upper surface of the semiconductor substrate 10, but is omitted in FIG. 1. In the interlayer dielectric film in this example, a contact hole 54 is provided penetrating through an interlayer dielectric film. In FIG. 2, diagonal hatching is applied to each of the contact holes 54.

The emitter electrode 52 is provided above the gate trench portion 40, the dummy trench portion 30, the well region 11, the emitter region 12, the base region 14, and the contact region 15. The emitter electrode 52 passes through the contact hole 54, and comes into contact with the emitter region 12, the contact region 15, and the base region 14 on the upper surface of the semiconductor substrate 10. In addition, the emitter electrode 52 passes through the contact hole provided in the interlayer dielectric film, and is connected to a dummy conductive portion in the dummy trench portion 30. The emitter electrode 52 may be connected to the dummy conductive portion of the dummy trench portion 30 at a distal end of the dummy trench portion 30 in the Y axis direction.

The active-side gate runner 131 passes through the contact hole provided in the interlayer dielectric film, and comes into contact with the gate trench portion 40. The active-side gate runner 131 may be connected to a gate conductive portion of the gate trench portion 40 at a distal end portion 41 of the gate trench portion 40 in the Y axis direction. The active-side gate runner 131 is not connected to the dummy conductive portion in the dummy trench portion 30.

The emitter electrode 52 is formed of a material including a metal. FIG. 2 illustrates a range where the emitter electrode 52 is provided. For example, a region of at least a part of the emitter electrode 52 is formed of aluminum or an aluminum-silicon alloy including, for example, a metallic alloy such as AlSi or AlSiCu. The emitter electrode 52 may have a barrier metal formed of titanium, a titanium compound, or the like in a lower layer of the region formed of aluminum or the like. Furthermore, the contact hole may also have therein a plug formed by implanting tungsten or the like to come into contact with the barrier metal, aluminum, and the like.

The well region 11 is provided such that it is overlapped with the active-side gate runner 131. The well region 11 is also provided extending at a predetermined width in a range which is not overlapped with the active-side gate runner 131. The well region 11 in this example is provided such that it is away from an end of the contact hole 54 in the Y axis direction towards the active-side gate runner 131 side. The well region 11 is a second conductivity type region where the doping concentration is higher than the base region 14. The base region 14 in this example is of the P− type, and the well region 11 is of the P+ type.

Each of the transistor portion 70 and the diode portion 80 has a plurality of trench portions arrayed in the array direction. In the transistor portion 70 in this example, one or more of the gate trench portions 40 and one or more of the dummy trench portions 30 are alternately provided along the array direction. In the diode portion 80 in this example, the plurality of dummy trench portions 30 are provided along the array direction. The gate trench portion 40 is not provided in the diode portion 80 in this example.

The gate trench portion 40 in this example may include two linear parts 39 (trench parts that are linear along the extending direction) extending along the extending direction perpendicular to the array direction, and the distal end portion 41 that connects the two linear parts 39. The extending direction in FIG. 2 is the Y axis direction.

At least a part of the distal end portion 41 is preferably provided to be curved in the top view. When the distal end portion 41 connects mutual end portions of the two linear parts 39 in the Y axis direction, it is possible to mitigate electric field concentrations at the end portions of the linear parts 39.

In the transistor portion 70, the dummy trench portion 30 is provided between the respective linear parts 39 of the gate trench portions 40. Between the respective linear parts 39, one piece of the dummy trench portion 30 may be provided, or plural pieces of the dummy trench portions 30 may also be provided. The dummy trench portion 30 may have a linear shape extending in the extending direction, and may also have linear parts 29 and a distal end portion 31 similarly as in the gate trench portion 40. The semiconductor device 100 illustrated in FIG. 2 includes both the dummy trench portion 30 having the linear shape without including the distal end portion 31, and the dummy trench portion 30 including the distal end portion 31.

A diffusion depth of the well region 11 may be deeper than depths of the gate trench portion 40 and the dummy trench portion 30. The end portions of the gate trench portion 40 and the dummy trench portion 30 in the Y axis direction are provided in the well region 11 in the top view. In other words, in the end portion of each trench portion in the Y axis direction, a bottom portion of each trench portion in the depth direction is covered with the well region 11. Thus, the electric field concentration in the bottom portion in each trench portion can be mitigated.

A mesa portion is provided between each of the trench portions in the array direction. The mesa portion refers to a region sandwiched by the trench portions inside the semiconductor substrate 10. In one example, an upper end of the mesa portion is the upper surface of the semiconductor substrate 10. A depth position at a lower end of the mesa portion is the same as a depth position at a lower end of the trench portion. The mesa portion in this example is provided extending on the upper surface of the semiconductor substrate 10 in the extending direction (Y axis direction) along the trench. In this example, a mesa portion 60 is provided in the transistor portion 70, and a mesa portion 61 is provided in the diode portion 80. In a case where the mesa portion is simply mentioned in the present specification, the mesa portion refers to each of the mesa portion 60 and the mesa portion 61.

The base region 14 is provided in each mesa portion. Among the base regions 14 exposed on the upper surface of the semiconductor substrate 10 in the mesa portion, the region arranged to be the closest to the active-side gate runner 131 is set as a base region 14-*e*. FIG. 2 illustrates the base region 14-*e* arranged in one end portion of each mesa portion in the extending direction, but the base region 14-*e* is also arranged in the other end portion of each mesa portion. In each of the mesa portions, in a region sandwiched by the base regions 14-*e* in the top view, at least one of the first conductivity type emitter region 12 and the second conductivity type contact region 15 may be provided. The emitter region 12 in this example is of the N+ type, and the contact region 15 is of the P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The contact region 15 exposed on the upper surface of the semiconductor substrate 10 may be provided in the mesa portion 60 in contact with the gate trench portion 40.

Each of the contact region 15 and the emitter region 12 in the mesa portion 60 is provided from one trench portion to the other trench portion in the X axis direction. In one example, the contact region 15 and the emitter region 12 of the mesa portion 60 are alternately arranged along the extending direction of the trench portion (Y axis direction).

In another example, the contact region 15 and the emitter region 12 of the mesa portion 60 may also be provided in stripes along the extending direction of the trench portion (Y axis direction). For example, the emitter region 12 is provided in a region in contact with the trench portion, and the contact region 15 is provided in a region sandwiched by the two emitter regions 12 respectively in contact with adjacent trench portions.

The emitter region 12 is not provided in the mesa portion 61 of the diode portion 80. The base region 14 and the contact region 15 may be provided on an upper surface of the mesa portion 61. In a region sandwiched by the base regions 14-*e* on the upper surface of the mesa portion 61, the contact region 15 may be provided in contact with each of the base regions 14-*e*. The base region 14 may be provided in a region sandwiched by the contact regions 15 on the upper surface of the mesa portion 61. The base region 14 may be arranged in an entire region sandwiched by the contact regions 15.

The contact hole 54 is provided above each of the mesa portions. The contact hole 54 is arranged in a region sandwiched by the base regions 14-*e*. The contact hole 54 in this example is provided above each of the regions including the contact region 15, the base region 14, and the emitter region 12. The contact hole 54 is not provided in regions corresponding to the base region 14-*e* and the well region 11. The contact hole 54 may be provided in a center in the array direction of the mesa portions 60 (X axis direction).

In the diode portion 80, in a region adjacent to the lower surface of the semiconductor substrate 10, an N+ type cathode region 82 is provided. A P+ type collector region 22 may be provided on the lower surface of the semiconductor substrate 10 in a region where the cathode region 82 is not provided. In FIG. 2, a boundary between the cathode region 82 and the collector region 22 is represented by a dotted line.

The cathode region 82 is arranged to be away from the well region 11 in the Y axis direction. Thus, a distance between the P type region (the well region 11) that has a relatively high doping concentration and is also formed up to a deep position and the cathode region 82 is ensured, and the breakdown voltage can be improved. An end portion of the cathode region 82 in the Y axis direction in this example is arranged to be farther away from the well region 11 than an end portion of the contact hole 54 in the Y axis direction. In another example, the end portion of the cathode region 82 in the Y axis direction may also be arranged between the well region 11 and the contact hole 54.

Figure 3:
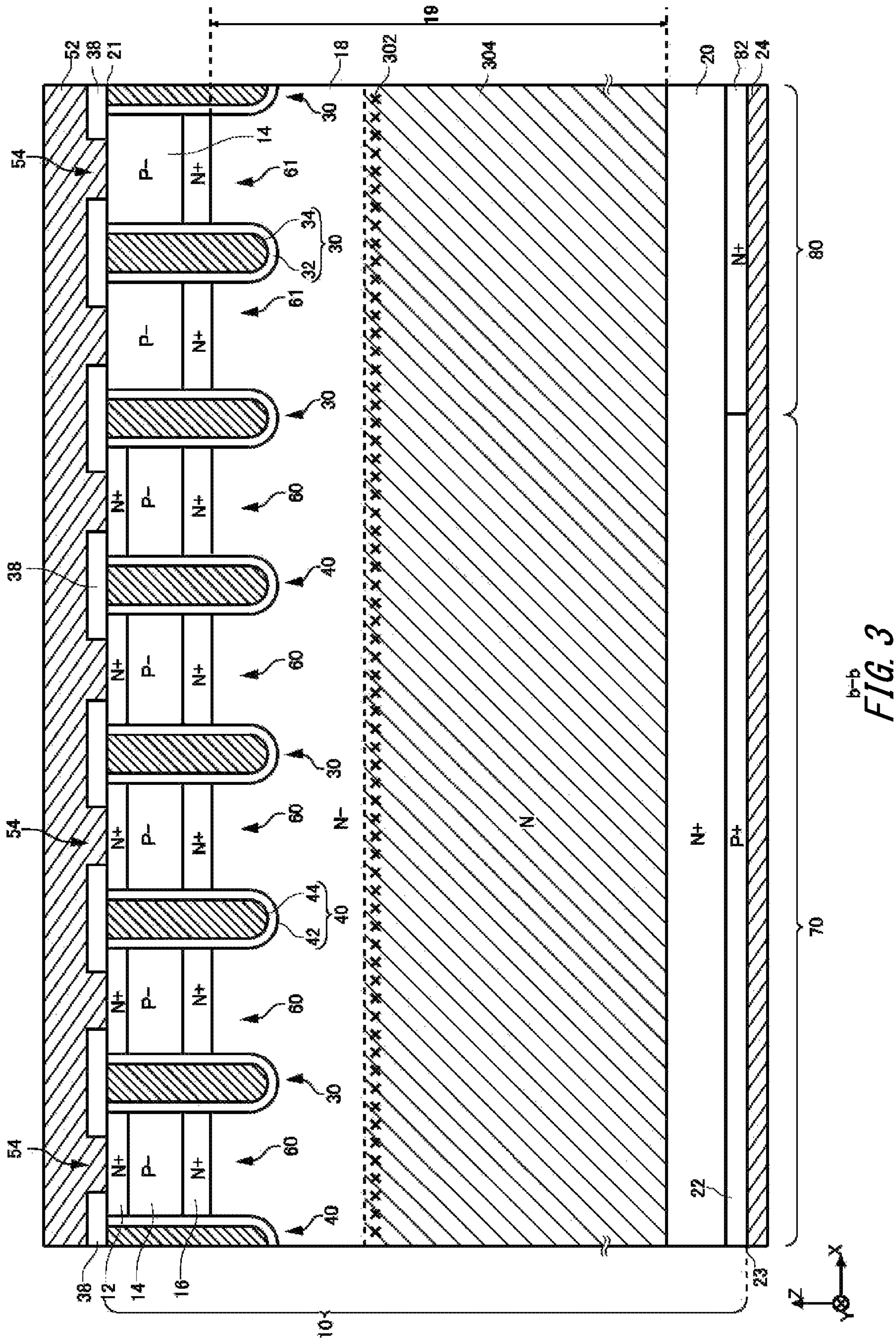
FIG. 3 is a drawing illustrating an example of a cross section taken along b-b in FIG. 2.

FIG. 3 is a drawing illustrating an example of a cross section taken along b-b in FIG. 2. A cross section taken along b-b is an XZ plane passing through the emitter region 12 and the cathode region 82. The semiconductor device 100 in this example has the semiconductor substrate 10, an interlayer dielectric film 38, the emitter electrode 52, and a collector electrode 24 in the cross section. The interlayer dielectric film 38 is provided on the upper surface of the semiconductor substrate 10. The interlayer dielectric film 38 is a film including at least one layer of a dielectric film made of silicate glass or the like to which impurities such as boron or phosphorus are doped, a thermally-oxidized film, and other dielectric films. The contact hole 54 described with reference to FIG. 2 is provided in the interlayer dielectric film 38.

The emitter electrode 52 is provided above the interlayer dielectric film 38. The emitter electrode 52 passes through the contact hole 54 of the interlayer dielectric film 38, and comes into contact with an upper surface 21 of the semiconductor substrate 10. The collector electrode 24 is provided on a lower surface 23 of the semiconductor substrate 10. The emitter electrode 52 and the collector electrode 24 are formed of a metallic material such as aluminum. According to the present specification, a direction that links the emitter electrode 52 and the collector electrode 24 (Z axis direction) is referred to as a depth direction.

The semiconductor substrate 10 includes an N− type bulk doping region 18. The bulk doping region 18 is a region where a doping concentration of the bulk doping region 18 is matched with a donor concentration of a bulk donor. The bulk donor will be described below. The bulk doping region 18 is provided in each of the transistor portion 70 and the diode portion 80.

In the mesa portion 60 of the transistor portion 70, the N+ type emitter region 12 and the P− type base region 14 are provided in the stated order from the upper surface 21 side of the semiconductor substrate 10. The bulk doping region 18 is provided below the base region 14. A N+ type accumulation region 16 may be provided in the mesa portion 60. The accumulation region 16 is arranged between the base region 14 and the bulk doping region 18.

The emitter region 12 is exposed on the upper surface 21 of the semiconductor substrate 10, and also provided in contact with the gate trench portion 40. The emitter region 12 may be in contact with the trench portions on both sides of the mesa portion 60. The emitter region 12 has a higher doping concentration than the bulk doping region 18.

The base region 14 is provided below the emitter region 12. The base region 14 in this example is provided in contact with the emitter region 12. The base region 14 may be in contact with the trench portions on both sides of the mesa portion 60.

The accumulation region 16 is provided below the base region 14. The accumulation region 16 is an N+ type region where the doping concentration is higher than the bulk doping region 18. When the high concentration accumulation region 16 is provided between the bulk doping region 18 and the base region 14, a carrier injection enhancement effect (IE effect) is increased, and an on-voltage can be reduced. The accumulation region 16 may be provided so as to cover the entire lower surface of the base region 14 in each of the mesa portions 60.

In the mesa portion 61 of the diode portion 80, the P− type base region 14 is provided in contact with the upper surface 21 of the semiconductor substrate 10. The bulk doping region 18 is provided below the base region 14. In the mesa portion 61, the accumulation region 16 may also be provided below the base region 14.

In each of the transistor portion 70 and the diode portion 80, an N+ type buffer region 20 may be provided under the bulk doping region 18. A doping concentration of the buffer region 20 is higher than the doping concentration of the bulk doping region 18. The buffer region 20 has one or a plurality of donor concentration peaks where the donor concentration is higher than the bulk doping region 18. The plurality of donor concentration peaks are arranged at different positions in the depth direction of the semiconductor substrate 10. The donor concentration peak of the buffer region 20 may be a concentration peak of hydrogen (protons) or phosphorus, for example. The buffer region 20 may function as a field stop layer that avoids a situation where the depletion layer spreading from a lower end of the base region 14 reaches the P+ type collector region 22 and the N+ type cathode region 82.

In the transistor portion 70, the P+ type collector region 22 is provided under the buffer region 20. An acceptor concentration of the collector region 22 is higher than an acceptor concentration of the base region 14. The collector region 22 may contain the same acceptor as that of the base region 14, or may also contain a different acceptor. The acceptor of the collector region 22 is boron, for example.

In the diode portion 80, the N+ type cathode region 82 is provided under the buffer region 20. A donor concentration of the cathode region 82 is higher than the donor concentration of the bulk doping region 18. A donor of the cathode region 82 is, for example, hydrogen or phosphorus. It is noted that the elements serving as the donor and the acceptor in each region are not limited to the above-described examples. The collector region 22 and the cathode region 82 are exposed on a lower surface 23 of the semiconductor substrate 10, and connected to the collector electrode 24. The collector electrode 24 may be in contact with the entire lower surface 23 of the semiconductor substrate 10. The emitter electrode 52 and the collector electrode 24 are formed of a metallic material such as aluminum.

One or more of the gate trench portions 40 and one or more of the dummy trench portions 30 are provided on the upper surface 21 side of the semiconductor substrate 10. Each trench portion penetrates through the base region 14 from the upper surface 21 of the semiconductor substrate 10 and reaches the bulk doping region 18. In a region where at least any of the emitter region 12, the contact region 15, and the accumulation region 16 is provided, each trench portion also penetrates through these doping regions and reaches the bulk doping region 18. The penetration of the trench portions through the doping regions is not limited to such a fabrication that after the doping regions are formed, the trench portions are formed in the stated order. Such a fabrication that after the trench portions are formed, the doping regions are formed between the trench portions is also included in the penetration of the trench portions through the doping regions.

As described above, the gate trench portion 40 and the dummy trench portion 30 are provided in the transistor portion 70. In the diode portion 80, the dummy trench portion 30 is provided, and the gate trench portion 40 is not provided. A boundary between the diode portion 80 and the transistor portion 70 in the X axis direction in this example is the boundary between the cathode region 82 and the collector region 22.

The gate trench portion 40 has a gate trench, a gate dielectric film 42, and a gate conductive portion 44 that are provided on the upper surface 21 of the semiconductor substrate 10. The gate dielectric film 42 is provided to cover the inner wall of the gate trench. The gate dielectric film 42 may be formed by oxidizing or nitriding the semiconductor on the inner wall of the gate trench. The gate conductive portion 44 is provided inside the gate trench on an inner side relative to the gate dielectric film 42. In other words, the gate dielectric film 42 insulates the gate conductive portion 44 from the semiconductor substrate 10. The gate conductive portion 44 is formed of a conductive material such as polysilicon.

The gate conductive portion 44 may be provided to be longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When the gate conductive portion 44 is applied with a predetermined gate voltage, a channel based on an electron inversion layer is formed on a front layer of a boundary face in contact with the gate trench portion 40 in the base region 14.

The dummy trench portion 30 may have the same structure as the gate trench portion 40 in the cross section. The dummy trench portion 30 has a dummy trench, a dummy dielectric film 32, and a dummy conductive portion 34 that are provided on the upper surface 21 of the semiconductor substrate 10. The dummy conductive portion 34 may be connected to an electrode different from the gate pad. For example, the dummy conductive portion 34 may also be connected to a dummy pad that is not illustrated in the drawing and is connected to an external circuit different from the gate pad, and perform control different from that of the gate conductive portion 44. In addition, the dummy conductive portion 34 may also be electrically connected to the emitter electrode 52. The dummy dielectric film 32 is provided to cover an inner wall of the dummy trench. The dummy conductive portion 34 is provided inside the dummy trench, and also provided on an inner side relative to the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 in this example are covered by the interlayer dielectric film 38 on the upper surface 21 of the semiconductor substrate 10. It is noted that bottom portions of the dummy trench portion 30 and the gate trench portion 40 may have a curved surface shape (curved line shape in the cross section) that is convex downward.

The first conductivity type (N type) bulk donor is entirely distributed in the semiconductor substrate 10. The bulk donor is a donor based on a dopant substantially uniformly contained in an ingot at the time of fabrication of the ingot serving as a base of the semiconductor substrate 10. The bulk donor in this example is an element other than hydrogen. The dopant of the bulk donor is, for example, phosphorus or antimony, but is not limited to this. The bulk donor in this example is phosphorus. The bulk donor is also contained in the P type region. The semiconductor substrate 10 may be a wafer sliced from a semiconductor ingot, or may also be a chip obtained by cutting the wafer into individual pieces. The semiconductor ingot may be fabricated by any of a Czochralski method (CZ method), a magnetic field-applied Czochralski method (MCZ method), and a float zone (FZ method). The ingot in this example is fabricated by the MCZ method. The bulk doping region 18 is a region where a doping concentration of the bulk doping region 18 is matched with a donor concentration of a bulk donor. For example, a donor concentration of the bulk donor may be between 90% and 100% of a chemical concentration of the dopant of the bulk donor.

The semiconductor substrate 10 has a hydrogen peak portion 302 that is arranged on the upper surface 21 side of the semiconductor substrate 10, where a hydrogen concentration in a hydrogen concentration distribution of the semiconductor substrate 10 in the depth direction shows a peak. The upper surface 21 side of the semiconductor substrate 10 refers to a region between a central position of the semiconductor substrate 10 in the depth direction and the upper surface 21. In addition, the lower surface 23 side refers to a region between the central position of the semiconductor substrate 10 in the depth direction and the lower surface 23. The hydrogen peak portion 302 may have a donor concentration distribution on which a peak shape of the hydrogen concentration distribution is reflected. A donor concentration in a peak part of the hydrogen peak portion 302 is higher than the donor concentration of the bulk donor.

Hydrogen ions such as protons are implanted to the hydrogen peak portion 302 from the lower surface 23 of the semiconductor substrate 10. In a passage region through which hydrogen ions have passed, a lattice defect where a vacancy such as a single vacancy (V) or a di-vacancy (VV) is a main constituent is formed. An atom adjacent to the vacancy has a dangling bond. The lattice defect also contains an interstitial atom, a dislocation, and the like, and may also contain a donor and an acceptor in a broad sense, but according to the present specification, the lattice defect in which the vacancy is the main constituent may be referred to as a vacancy type lattice defect, a vacancy type defect, or simply a lattice defect in some cases. In addition, due to the hydrogen ion implantation to the semiconductor substrate 10, when a large number of lattice defects are formed, a crystallinity of the semiconductor substrate 10 may be intensely interrupted in some cases. According to the present specification, this interruption of the crystallinity may be referred to as a disorder in some cases. In addition, when hydrogen implanted in the hydrogen peak portion 302 diffuses, the vacancy (V) and oxygen (O) and hydrogen (H) present in the passage region are combined to form a VOH defect. The VOH defect functions as an electron supplying donor. Thus, in a region between the hydrogen peak portion 302 and the lower surface 23 of the semiconductor substrate 10, an N type first high concentration region 304 where the donor concentration is higher than the doping concentration of the bulk donor is formed. According to the present specification, the VOH defect may be simply referred to as a hydrogen donor in some cases. The first high concentration region 304 in this example contains the hydrogen donor. The bulk doping region 18 and the first high concentration region 304 may be collectively referred to as a drift region 19 in some cases. The drift region 19 may be a region where the depletion layer spreads when the semiconductor device 100 is applied with a voltage, and a half or more of the applied voltage is supported.

The first high concentration region 304 has an upper surface or an upper end arranged on the upper surface 21 side of the semiconductor substrate 10, and a lower surface or a lower end arranged on the lower surface 23 side of the semiconductor substrate 10. The first high concentration region 304 includes the hydrogen peak portion 302. The first high concentration region 304 may be continuously provided from the hydrogen peak portion 302 to the lower surface 23. It is however noted that in a region where the buffer region 20, the collector region 22, or the cathode region 82 is provided in a region from the hydrogen peak portion 302 to the lower surface 23, a configuration may be adopted where the first high concentration region 304 is not provided. The first high concentration region 304 in this example is provided in a region from the hydrogen peak portion 302 to the buffer region 20.

In addition, the first high concentration region 304 may be provided above the hydrogen peak portion 302 too. A peak of the hydrogen concentration has a predetermined full width at half maximum in the depth direction. For this reason, hydrogen is also implanted to a position higher than the hydrogen peak portion 302 where the hydrogen concentration becomes the maximum value, and the vacancy type defect is formed. For this reason, the first high concentration region 304 is also formed above the hydrogen peak portion 302. It is however noted that the first high concentration region 304 above the hydrogen peak portion 302 has a small width in the Z axis direction as compared with the first high concentration region 304 below the hydrogen peak portion 302.

The hydrogen peak portion 302 may also have a lifetime adjustment function. In other words, a lifetime of the carrier may show a local minimum value in the vicinity of the hydrogen peak portion 302. In a case where a vacancy type defect density formed in the vicinity of the hydrogen peak portion 302 is sufficiently high as compared with an oxygen concentration present in the vicinity of the hydrogen peak portion 302, a density of the remaining vacancy type defects without being transformed into the hydrogen donor is increased. When the remaining vacancy type defect and the carrier are recombined, the lifetime of the carrier is shortened. The hydrogen peak portion 302 may have the lifetime adjustment function in some cases. In addition, in a case where the vacancy type defect density formed in the hydrogen peak portion 302 is not sufficiently high as compared with the oxygen concentration present in the hydrogen peak portion 302, almost all of the vacancy type defects are transformed into the hydrogen donor. The hydrogen peak portion 302 may function as a donor transformation region where the donor concentration is high without having the lifetime adjustment function in some cases.

Figure 4:
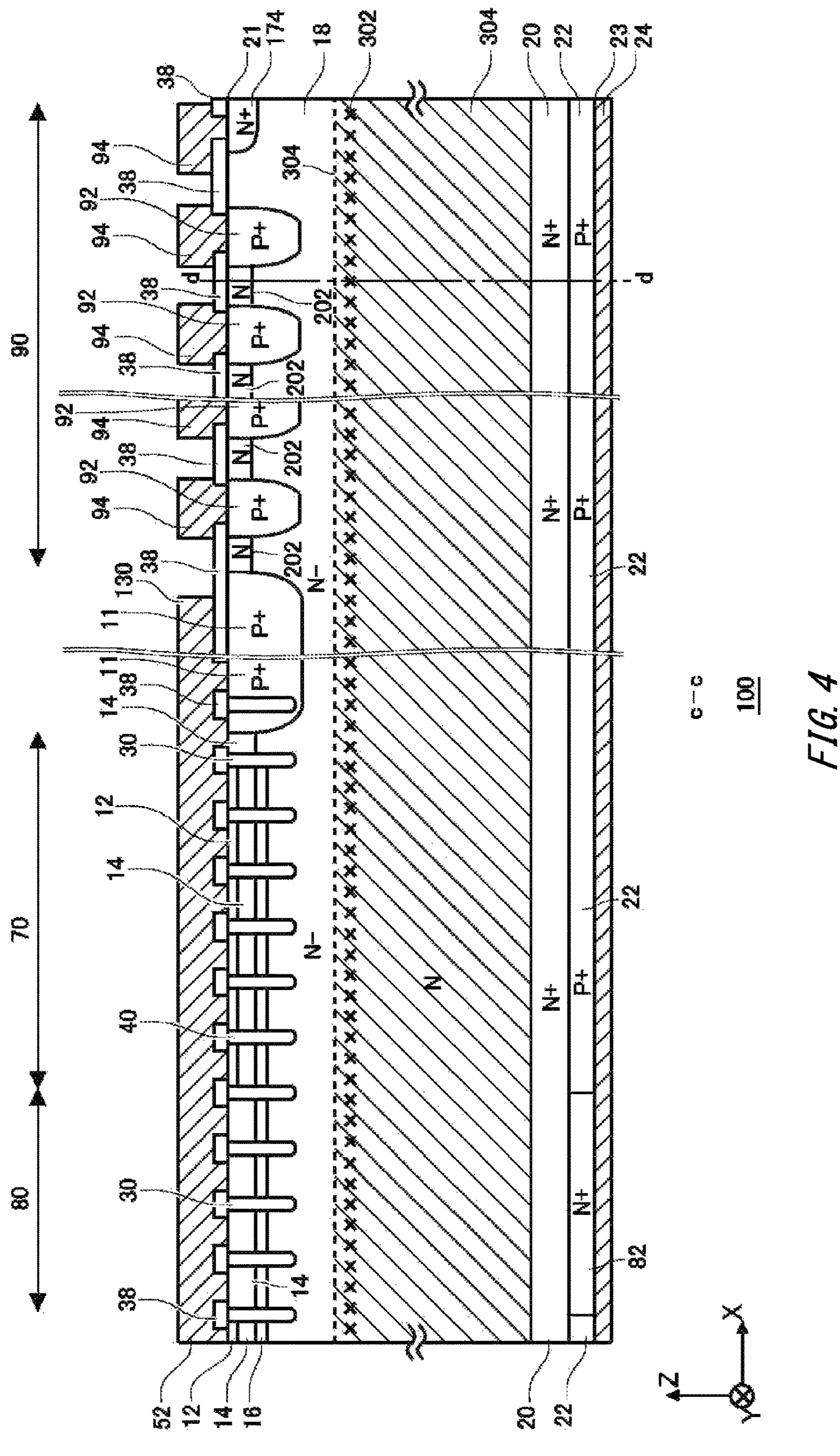
FIG. 4 is a drawing illustrating an example of a cross section taken along c-c in FIG. 1.

FIG. 4 is a drawing illustrating an example of a cross section taken along c-c in FIG. 1. A cross section taken along c-c is an XZ plane passing through the edge terminal structure portion 90, the transistor portion 70, and the diode portion 80. Structures of the transistor portion 70 and the diode portion 80 are the same as the transistor portion 70 and the diode portion 80 described with reference to FIG. 2 and FIG. 3. FIG. 4 illustrates simplified structures of the gate trench portion 40 and the dummy trench portion 30.

In the semiconductor substrate 10, the well region 11 is provided between the edge terminal structure portion 90 and the transistor portion 70. The well region 11 is a P+ type region in contact with the upper surface 21 of the semiconductor substrate 10. The well region 11 may be provided up to a position deeper than lower ends of the gate trench portion 40 and the dummy trench portion 30. A part of the gate trench portion 40 and the dummy trench portion 30 may be arranged inside the well region 11.

The interlayer dielectric film 38 that covers the well region 11 may be provided on the upper surface 21 of the semiconductor substrate 10. An electrode and a wiring such as the emitter electrode 52 and the outer peripheral gate runner 130 are provided above the interlayer dielectric film 38. The emitter electrode 52 is provided extending from a position above the active portion 160 to a position above the well region 11. The emitter electrode 52 may be connected to the well region 11 via a contact hole provided in the interlayer dielectric film 38.

The outer peripheral gate runner 130 is arranged between the emitter electrode 52 and the edge terminal structure portion 90. The emitter electrode 52 and the outer peripheral gate runner 130 are arranged to be separated from each other, but in FIG. 4, a gap between the emitter electrode 52 and the outer peripheral gate runner 130 is omitted. The outer peripheral gate runner 130 is electrically insulated from the well region 11 by the interlayer dielectric film 38.

The plurality of guard rings 92, a plurality of second high concentration regions 202, a plurality of field plates 94, and a channel stopper 174 are provided in the edge terminal structure portion 90. In addition, the hydrogen peak portion 302 and the first high concentration region 304 described with reference to FIG. 3 are also provided in at least a part of the edge terminal structure portion 90. The first high concentration region 304 may be provided below the guard ring 92. The hydrogen peak portion 302 and the first high concentration region 304 of the edge terminal structure portion 90 may be provided to be continuous to the hydrogen peak portion 302 and the first high concentration region 304 of the transistor portion 70 and the diode portion 80. The hydrogen peak portion 302 and the first high concentration region 304 may be provided across the entire edge terminal structure portion 90 in the X axis direction.

The hydrogen peak portion 302 in this example is provided to be located lower than each of the second high concentration regions 202 (in other words, in a position deeper than the second high concentration region 202 as viewed from the upper surface 21). The hydrogen peak portion 302 may be arranged in a position deeper than a lower end of the guard ring 92. In other words, the hydrogen peak portion 302 may be arranged between the lower end of the guard ring 92 and the lower surface 23 of the semiconductor substrate 10. The hydrogen peak portion 302 may be arranged in a position deeper than the lower end of the well region 11. The hydrogen peak portion 302 may be arranged in a position deeper than the lower end of the trench portion.

The first high concentration region 304 illustrated in FIG. 4 is not in contact with the guard ring 92, but the first high concentration region 304 may also be in contact with the lower end of the guard ring 92. The first high concentration region 304 may be provided up to a position between two of the guard rings 92. The first high concentration region 304 may be in contact, or may also not be in contact, with the well region 11. The first high concentration region 304 may be in contact, or may also not be in contact, with the trench portion. The first high concentration region 304 may be provided below the second high concentration region 202.

The first high concentration region 304 may be in contact with the well region 11. The first high concentration region 304 may be in contact with the trench portion. A configuration may be adopted where the first high concentration region 304 is not in contact with any of the emitter region 12, the base region 14, and the accumulation region 16. In another example, the first high concentration region 304 may also be in contact with the accumulation region 16. The first high concentration region 304 may also be in contact with the base region 14. The first high concentration region 304 may not be in contact, or may also not be in contact, with the channel stopper 174.

The lengths of the first high concentration regions 304 in the depth direction may be the same, or may also be different, in the entire edge terminal structure portion 90. The lengths of the first high concentration regions 304 in the depth direction may be the same, or may also be different, in the edge terminal structure portion 90 and the active portion 160.

In a region in contact within the lower surface 23 in the edge terminal structure portion 90, the collector region 22 may be provided. Each of the guard rings 92 may be provided so as to surround the active portion 160 on the upper surface 21. The plurality of guard rings 92 may have a function for spreading the depletion layer generated in the active portion 160 to the outside of the semiconductor substrate 10. Thus, the electric field concentration inside the semiconductor substrate 10 can be avoided, and it is possible to improve the breakdown voltage of the semiconductor device 100.

The guard ring 92 in this example is a P+ type semiconductor region formed by the ion implantation in the vicinity of the upper surface 21. The guard ring 92 can be formed by selectively implanting a P type dopant such as boron from the upper surface 21 of the semiconductor substrate 10, and performing heat treatment. A depth of a bottom portion of the guard ring 92 may be deeper than depths of bottom portions of the gate trench portion 40 and the dummy trench portion 30. The depth of the bottom portion of the guard ring 92 may be same as, or may also be different from, a depth of a bottom portion of the well region 11.

An upper surface of the guard ring 92 is covered by the interlayer dielectric film 38. The field plate 94 is formed of a metal such as aluminum or a conductive material such as polysilicon. The field plate 94 may also be formed of an aluminum-silicon alloy including, for example, a metallic alloy such as AlSi or AlSiCu. The field plate 94 may be formed of the same material as the outer peripheral gate runner 130 or the emitter electrode 52. The field plate 94 is provided on the interlayer dielectric film 38. The field plate 94 in this example is connected to the guard ring 92 via a through-hole provided in the interlayer dielectric film 38.

The channel stopper 174 is provided to be exposed on the upper surface 21 and the side wall in the vicinity of the end side 102 of the semiconductor substrate 10. The channel stopper 174 is an N type region where a doping concentration is higher than the bulk doping region 18. The channel stopper 174 has a function of terminating the depletion layer generated in the active portion 160 in the vicinity of the end side 102 of the semiconductor substrate 10. It is noted that at least a part of the field plate 94, the outer peripheral gate runner 130, and the emitter electrode 52 is covered by a protective film such as a polyimide or nitride film, but the protective film may be omitted in the drawings of the present specification in some cases.

The second high concentration region 202 is an N type region where the donor concentration is higher than the doping concentration of the bulk donor. The second high concentration region 202 is provided between the two adjacent guard rings 92. The second high concentration region 202 may be in contact with the upper surface 21 of the semiconductor substrate 10. The second high concentration region 202 in this example is provided from the upper surface 21 in a range shallower than the lower end of the guard ring 92. In another example, the second high concentration region 202 may also be provided up to a position deeper than the lower end of the guard ring 92. The second high concentration region 202 may also be provided between the well region 11 and the guard ring 92.

The second high concentration region 202 may be formed by implanting a donor from the upper surface 21 of the semiconductor substrate 10 while the field plate 94 is used as a mask, and performing heat treatment. In this case, at least a part of the second high concentration region 202 is formed in a region that is not covered by the field plate 94. At least a part of the second high concentration region 202 in this example is not overlapped with the field plate 94 in the Z axis direction. The donor implanted to the second high concentration region 202 may be phosphorus, may be hydrogen, or may also be other donors. In a case where the second high concentration region 202 is deeply formed, the donor may be implanted to a plurality of depth positions by changing acceleration energy of the donor.

In another example, the second high concentration region 202 may be formed by implanting the donor from the upper surface 21 of the semiconductor substrate 10 while the field plate 94 is not used as the mask, and performing heat treatment. In this case, the ion implantation of boron is selectively performed as a P type dopant, and the guard ring is formed by heat treatment. Thereafter, the ion implantation of phosphorus is performed as a N type dopant, and the second high concentration region 202 is formed by heat treatment. A temperature of the heat treatment after the P type dopant is implanted is higher than a temperature of the heat treatment after the N type dopant is implanted. A dose amount of the ion implantation of the N type dopant may be lower than a dose amount of the P type dopant. In this case, for the ion implantation of the N type dopant, the N type dopant may be implanted to the region too where the guard ring is formed, or the N type dopant may also be selectively implanted so as to avoid the region where the guard ring is formed.

In the example of FIG. 4, the second high concentration region 202 and the first high concentration region 304 are arranged to be away from each other in the Z axis direction. A region having the same donor concentration as the bulk donor concentration may be provided between the second high concentration region 202 and the first high concentration region 304. The first high concentration region 304 may also reach the upper surface 21.

It is noted that when heat treatment is performed at a high temperature for a long period of time after hydrogen is implanted, the hydrogen donor disappears, or the lifetime adjustment function in the hydrogen peak portion 302 disappears. For this reason, the hydrogen implantation and heat treatment processes are preferably performed in a late stage of a fabrication process of the semiconductor device 100. For example, when hydrogen is implanted after the protective film is formed above the field plate 94 or the like, it is possible to suppress the disappearance of the hydrogen donor.

When the doping concentration on the upper surface 21 side of the edge terminal structure portion 90 fluctuates, a spread degree of the depletion layer in the edge terminal structure portion 90 also fluctuates. In a case here the second high concentration region 202 and the first high concentration region 304 are not provided, the bulk doping region 18 at the bulk donor concentration occupies a large region on the upper surface 21 side of the edge terminal structure portion 90. Since the bulk donor concentration is the concentration of the donor contained from the fabrication time of the semiconductor substrate 10, a fluctuation relatively easily occurs.

In contrast, the second high concentration region 202 and the first high concentration region 304 are formed by the ion implantation or the like. Since the concentration of the ion implantation is relatively easily controlled, a fluctuation of the donor concentrations of the second high concentration region 202 and the first high concentration region 304 is relatively small. For this reason, when the second high concentration region 202 and the first high concentration region 304 are provided, the fluctuation in the spread degree of the depletion layer extending to the edge terminal structure portion 90 in the X axis direction from the lower side of the well region 11 can be reduced, and a breakdown voltage fluctuation of the semiconductor device 100 can be reduced. In addition, when the second high concentration region 202 and the first high concentration region 304 are provided, it is possible to suppress the excessive spread of the depletion layer in the edge terminal structure portion 90 in the X axis direction.

Figure 5:
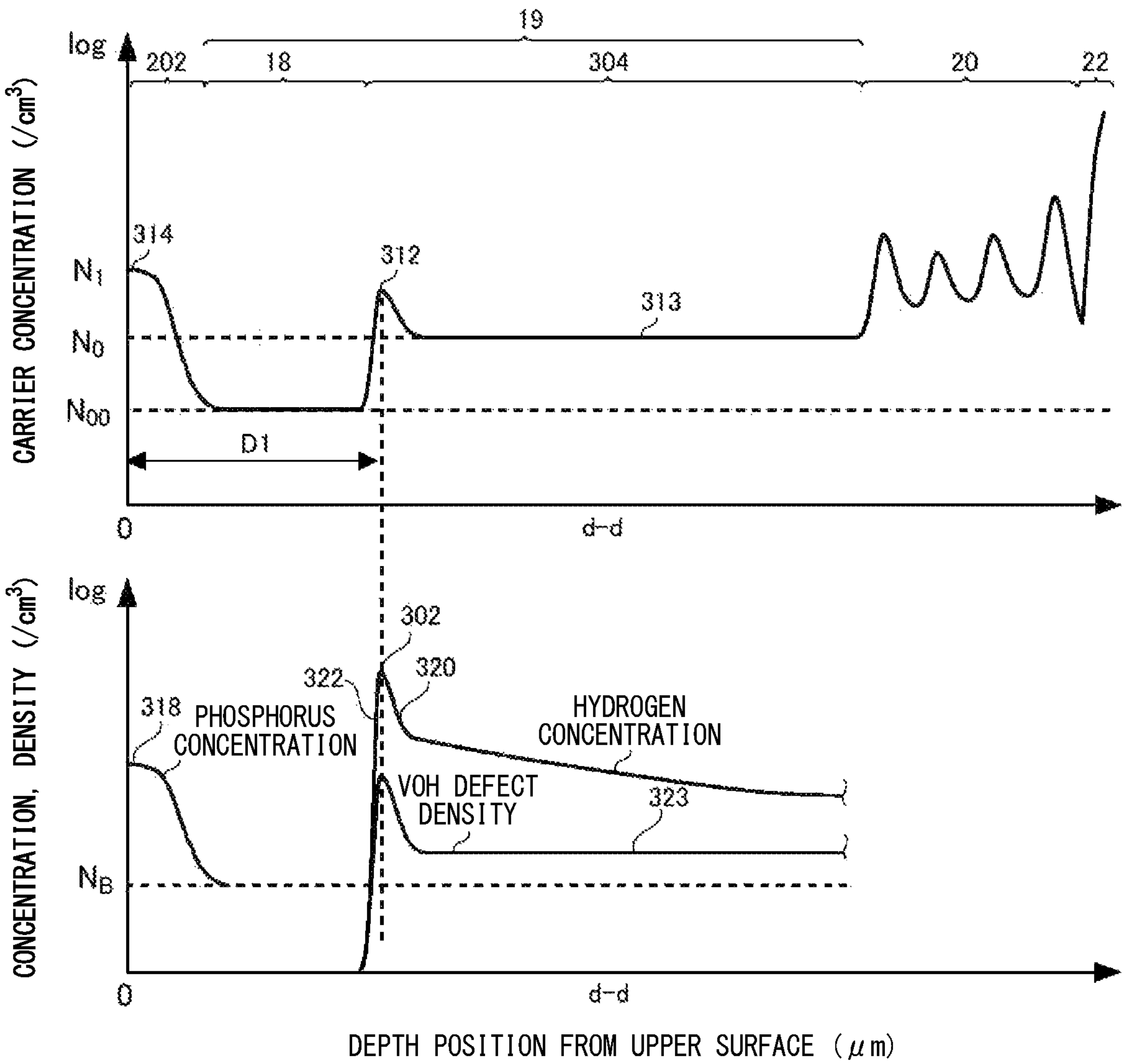
FIG. 5 illustrates an example of a carrier concentration distribution, a donor concentration distribution, and a defect density distribution on a line d-d illustrated in FIG. 4.

FIG. 5 illustrates an example of a carrier concentration distribution, a donor concentration distribution, and a defect density distribution on a line d-d illustrated in FIG. 4. In the edge terminal structure portion 90, the line d-d passes through the second high concentration region 202, the bulk doping region 18, the first high concentration region 304, the buffer region 20, and the collector region 22. A carrier concentration distribution may be the same as the net doping concentration distribution as described above.

In this example, the bulk donor is phosphorus. In addition, the second high concentration region 202 is formed by implanting phosphorus from the upper surface 21 of the semiconductor substrate 10. An upper stage of FIG. 5 illustrates the carrier concentration distribution, and a lower stage of FIG. 5 illustrates a phosphorus concentration distribution in the second high concentration region 202, and a hydrogen concentration distribution and a VOH defect density distribution in the first high concentration region 304. In this example, the bulk donor concentration is set as $N_B$. The bulk donor concentration is substantially uniform across the whole in the depth direction. The bulk donor concentration may use a minimum value of the concentration of the donor distributed in the entire semiconductor substrate 10. For example, in a case where phosphorus is distributed in the entire semiconductor substrate 10, the bulk donor concentration may be set as a minimum value of the concentration of phosphorus in the semiconductor substrate 10.

The phosphorus concentration distribution in the second high concentration region 202 has a first peak 318 where the phosphorus concentration becomes a local maximum value. A depth position of the first peak 318 corresponds to an implantation position of phosphorus. The hydrogen concentration distribution in the first high concentration region 304 becomes the local maximum value in the hydrogen peak portion 302. Since hydrogen is implanted from the lower surface 23 of the semiconductor substrate 10, a slope 322 of the hydrogen concentration distribution on the upper surface 21 side relative to the hydrogen peak portion 302 has a larger inclination than a slope 320 of the hydrogen concentration distribution on the lower surface 23 side relative to the hydrogen peak portion 302. In this example, the phosphorus concentration and the hydrogen concentration are chemical concentrations of phosphorus and hydrogen.

The VOH defect density distribution may be a distribution on which the hydrogen concentration distribution is reflected, or a distribution having a similar figure to the hydrogen concentration distribution. For example, the local maximum, the local minimum, a position of an infection point such as a kink of each distribution may be arranged in substantially the same depth positions. Substantially the same depth positions may also have an error smaller than a full width at half maximum of the peak of the hydrogen concentration distribution, for example. It is noted that the VOH defect density distribution may also include a flat portion 323 where the density is substantially uniform on the lower surface 23 side relative to the hydrogen peak portion 302. The VOH defect density distribution may be matched with a distribution of the first high concentration region 304. For example, the concentration of the VOH defect density distribution may be set as the first high concentration region 304.

The VOH defect is a defect in which hydrogen, oxygen, and the vacancy type defect are combined. For this reason, the VOH defect density distribution may be subjected to rate control by a distribution of an element having a low concentration or density among hydrogen, oxygen, and the vacancy type defect in some cases. In a case where oxygen is substantially uniformly distributed in the semiconductor substrate 10, when the vacancy concentration is relatively low, the VOH defect density distribution has the flat portion 323. In another example, similarly as in the slope 320 of the hydrogen concentration distribution, the VOH defect density may be gradually reduced towards the lower surface 23 side. For example, in a case where the hydrogen concentration is relatively low in a part other than the hydrogen peak portion 302, the hydrogen concentration distribution is reflected on the VOH defect density distribution.

The carrier concentration distribution in this example has a peak 312 in the same depth position as the hydrogen peak portion 302. In addition, the second high concentration region 202 has a peak 314 in the same depth position as the same depth position as the first peak 318 of the phosphorus concentration distribution. In a case where distance D1 between the peak 312 and the peak 314 is sufficiently large, the bulk doping region 18 having a base carrier concentration $N_{00}$ according to the bulk donor concentration $N_B$ is provided between the peak 312 and the peak 314. The distance D1 is a distance between an apex of the peak 312 and an apex of the peak 314. The distance D1 may also be a distance between an apex of the first peak 318 and an apex of the hydrogen peak portion 302. According to the present specification, the distance D1 may be set as a distance between the hydrogen peak portion 302 and the second high concentration region 202 in the Z axis direction in some cases.

The first high concentration region 304 may have a flat portion 313 where the carrier concentration is substantially uniform between the peak 312 and the buffer region 20. In the flat portion 313, the carrier concentration may also fluctuate in a range from a minimum value $N_0$ of the carrier concentration between the peak 312 and the buffer region 20 or higher, to a value 2 times as high as the minimum value $N_0$ or lower. In the flat portion 313, the carrier concentration may fluctuate in a range from the minimum value $N_0$ or higher, to a value 1.5 times as high as the minimum value $N_0$ or lower, and the carrier concentration may also fluctuate in a range from the minimum value $N_0$ or higher, to a value 1.2 times as high as the minimum value $N_0$ or lower. A length of the flat portion 313 in the Z axis direction may be a half or more of a length of the first high concentration region 304 in the Z axis direction. In addition, in the first high concentration region 304, the carrier concentration may also be gradually reduced from the peak 312 towards the buffer region 20.

Similarly, in the flat portion 323 too, the VOH defect density may also fluctuate in a range from a minimum value of the VOH defect density between the hydrogen peak portion 302 and the buffer region 20 or higher, to a value 2 times as high as the minimum value or lower. In the flat portion 313, the VOH defect density may fluctuate in a range from the minimum value or higher, to a value 1.5 times as high as the minimum value or lower, and the VOH defect density may also fluctuate in a range from the minimum value or higher, to a value 1.2 times as high as the minimum value or lower. A length of the flat portion 323 in the Z axis direction may be a half or more of a length of the first high concentration region 304 in the Z axis direction.

A peak value $N_1$ of the carrier concentration in the second high concentration region 202 is higher than the minimum value $N_0$ of the carrier concentration in the first high concentration region 304. The peak value $N_1$ may be 2 times as high as the minimum value $N_0$ or higher, may be 5 times as high as the minimum value $N_0$ or higher, may be 10 times as high as the minimum value $N_0$ or higher, or may also be 20 times as high as the minimum value $N_0$ or higher. The peak value $N_1$ may be 10 times as high as the base carrier concentration $N_{00}$ or higher, or may also be 100 times as high as the base carrier concentration $N_{00}$ or higher. The base carrier concentration $N_{00}$ is the doping concentration of the bulk donor.

In the example illustrated in FIG. 5, it can be seen that the hydrogen concentration in the first high concentration region 304 is higher than the doping concentration of the bulk donor $N_B$ over the first high concentration region 304. Also in the example illustrated in FIG. 5, it can be seen that the carrier concentration in the flat portion 313 is substantially uniform in the depth direction, and the hydrogen concentration distribution has a larger inclination than the carrier concentration in the flat portion 313.

Figure 6:
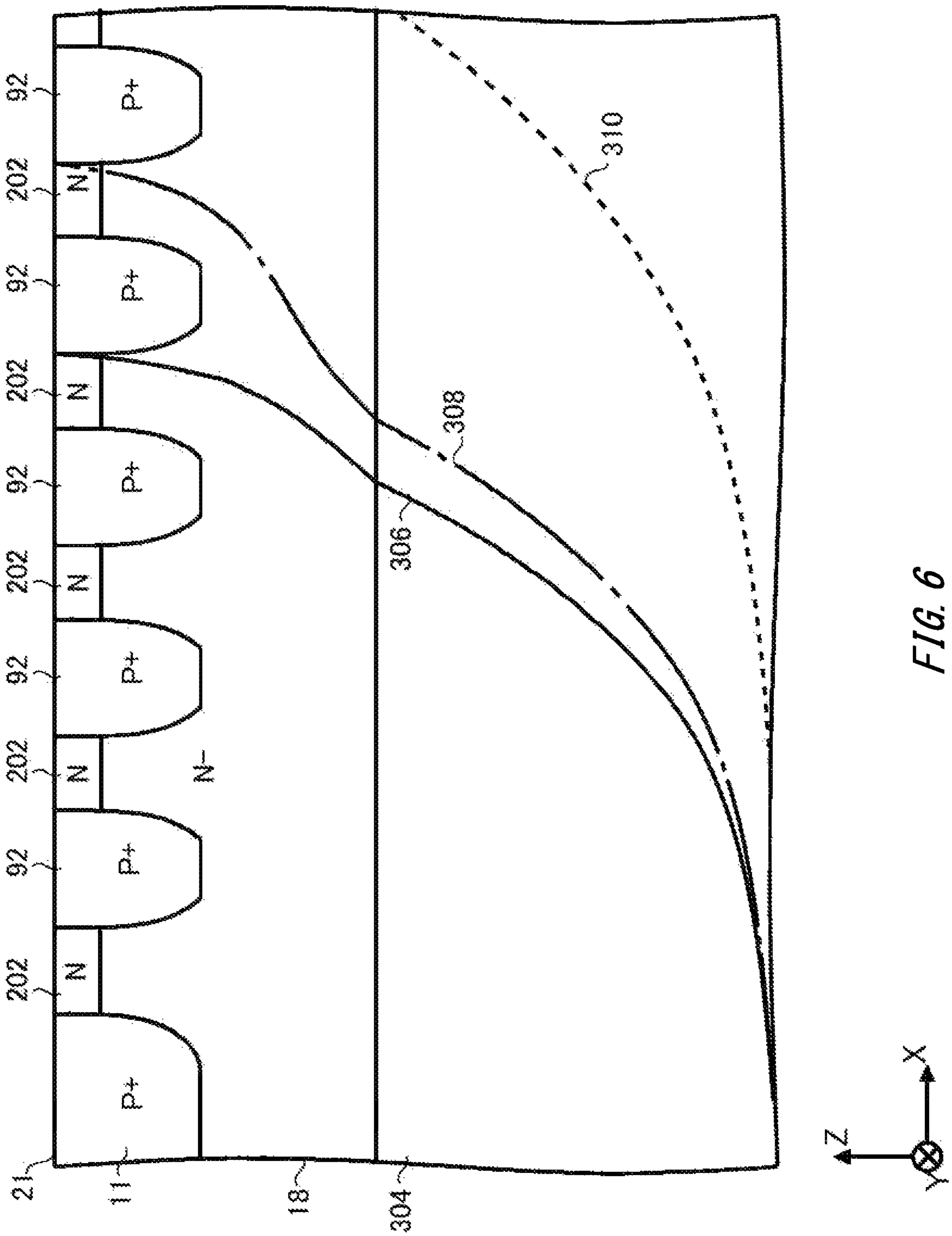
FIG. 6 is a drawing illustrating an example of an equipotential surface in an edge terminal structure portion 90.

FIG. 6 is a drawing illustrating an example of an equipotential surface in the edge terminal structure portion 90. In FIG. 6, the hydrogen peak portion 302 is omitted. In addition, hatching is omitted in the first high concentration region 304.

FIG. 6 illustrates an equipotential surface 306 in a case where the second high concentration region 202 and the first high concentration region 304 are provided, an equipotential surface 308 in a case where the first high concentration region 304 is provided without providing the second high concentration region 202, and an equipotential surface 310 in a case here the second high concentration region 202 and the first high concentration region 304 are not provided. Each of the equipotential surface 306, the equipotential surface 308, and the equipotential surface 310 is an equipotential surface at a predetermined potential $V_O$.

In a case here the second high concentration region 202 and the first high concentration region 304 are not provided, the equipotential surface 310 spreads in the depth direction and an outer peripheral direction of the semiconductor substrate 10. The spread of the equipotential surface 310 is decided by the donor concentration of the bulk donor. Since the donor concentration of the bulk donor is set to be low, as compared with the equipotential surface 306 and the equipotential surface 308, the spread of the equipotential surface 310 is large in both the depth direction and the outer peripheral direction of the semiconductor substrate.

In a case where the first high concentration region 304 is provided without providing the second high concentration region 202, the donor concentration of the bulk donor is lower than a donor concentration of the first high concentration region 304. For this reason, with regard to the equipotential surface 308, a curvature changes on a boundary surface between the bulk doping region 18 and the first high concentration region 304. Thus, as compared with the first high concentration region 304, the equipotential surface 308 spreads on an outer periphery side of the semiconductor device 100 in the bulk doping region 18. However, in the first high concentration region 304, the spread of the equipotential surface 308 in the depth direction and the outer peripheral direction of the semiconductor substrate 10 is suppressed as compared with the equipotential surface 310. This is because the donor concentration of the first high concentration region 304 is higher than the bulk donor concentration. Thus, the spread of the equipotential surface 308 in the outer peripheral direction in the bulk doping region 18 can be significantly narrowed as compared with the equipotential surface 310.

In a case where the second high concentration region 202 and the first high concentration region 304 are provided, the doping concentration of the second high concentration region 202 is higher than the doping concentration of the bulk doping region 18. For this reason, the spread of the equipotential surface 306 onto the outer periphery side of the semiconductor device 100 is suppressed as compared with the equipotential surface 308. Thus, the equipotential surface 306 further approaches the well region 11 than the equipotential surface 308. Thus, the excess spread of the depletion layer in the edge terminal structure portion 90 in a lateral direction can be suppressed. For this reason, a length of the edge terminal structure portion 90 in the outer peripheral direction can be shortened, and the area of the upper surface 21 of the semiconductor device 100 can be reduced.

Figure 7:
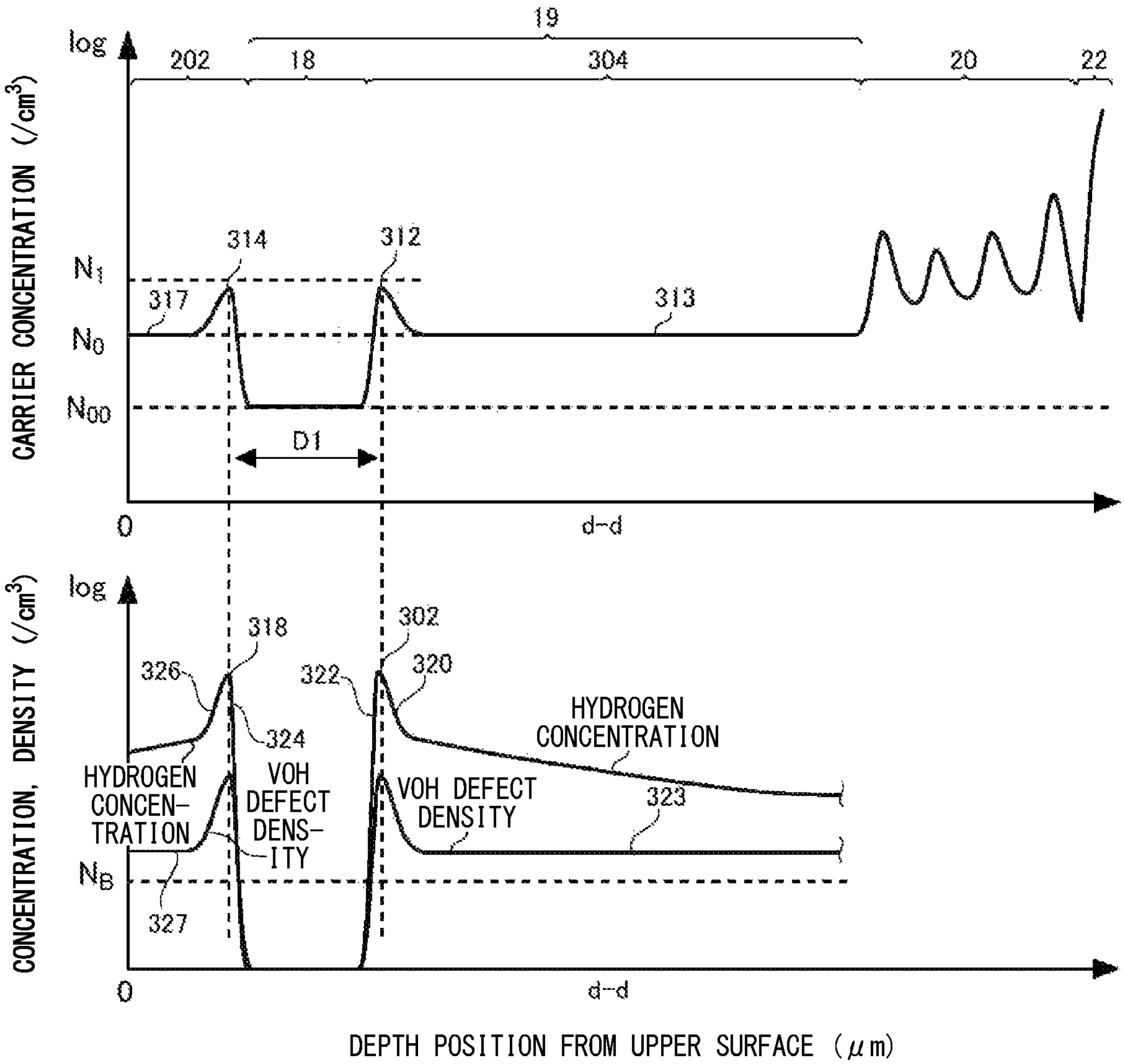
FIG. 7 illustrates other examples of the carrier concentration distribution, the donor concentration distribution, and the defect density distribution on the line d-d illustrated in FIG. 4.

FIG. 7 illustrates other examples of the carrier concentration distribution, the donor concentration distribution, and the defect density distribution on the line d-d illustrated in FIG. 4. The second high concentration region 202 in this example is formed by implanting hydrogen from the upper surface 21 of the semiconductor substrate 10. In other words, the second high concentration region 202 contains the hydrogen donor such as the VOH defect. Each of the distributions other than the second high concentration region 202 is the same as the example in FIG. 5.

The hydrogen concentration distribution in the second high concentration region 202 takes a local maximum value in the first peak 318. Since hydrogen is implanted from the upper surface 21 of the semiconductor substrate 10, a slope 324 of the hydrogen concentration distribution on the lower surface 23 side relative to the first peak 318 has an inclination larger than a slope 326 of the hydrogen concentration distribution on the upper surface 21 side relative to the first peak 318.

In the second high concentration region 202 too, the VOH defect density distribution may be a distribution having a similar figure to the hydrogen concentration distribution. For example, positions of the local maximum, the local minimum, and the infection point such as the kink of each distribution may be arranged in substantially the same depth positions. The VOH defect density distribution may have a flat portion 327 where the dense is substantially uniform in the hydrogen concentration distribution on the upper surface 21 side relative to the first peak 318. In another example, similarly as in the slope 326 of the hydrogen concentration distribution, the VOH defect density in the second high concentration region 202 may also be gradually reduced towards the upper surface 21 side.

The carrier concentration distribution in this example has the peak 314 in the same depth position as the first peak 318 of the hydrogen concentration distribution in the second high concentration region 202. A region having the base carrier concentration $N_{00}$ according to the bulk donor concentration $N_B$ may be provided between the peak 312 and the peak 314. The carrier concentration distribution may have a flat portion 317 where the carrier concentration is substantially uniform between the peak 314 and the upper surface 21.

In the flat portion 317, the carrier concentration may also fluctuate in a range from the minimum value $N_0$ of the carrier concentration between the peak 314 and the upper surface 21 or higher, to a value 2 times as high as the minimum value $N_0$ or lower. In the flat portion 317, the carrier concentration may fluctuate in a range from the minimum value $N_0$ or higher, to a value 1.5 times as high as the minimum value $N_0$ or lower, and the carrier concentration may also fluctuate in a range from the minimum value $N_0$ or higher, to a value 1.2 times as high as the minimum value $N_0$ or lower. Similarly in the flat portion 327 too, the VOH defect density may also fluctuate in a range from a minimum value of the VOH defect density of the hydrogen concentration distribution between the first peak 318 and the upper surface 21 or higher, to a value 2 times as high as the minimum value or lower. In the flat portion 327, the VOH defect density may fluctuate in a range from the minimum value or higher, to a value 1.5 times as high as the minimum value or lower, and the VOH defect density may also fluctuate in a range from the minimum value or higher, to a value 1.2 times as high as the minimum value or lower. In addition, in the second high concentration region 202, the carrier concentration may also be gradually reduced from the peak 314 towards the upper surface 21.

The carrier concentration of the second high concentration region 202 at the peak 314 may be the same as, or may also be different from, the carrier concentration of the first high concentration region 304 at the peak 312. The carrier concentration of the second high concentration region 202 at the peak 314 is higher than the minimum value $N_0$ of the carrier concentration in the second high concentration region 202. The carrier concentration at the peak 314 may be 2 times as high as of the minimum value No or higher, may be 5 times as high as the minimum value $N_0$ or higher, or may also be 10 times as high as the minimum value $N_0$ or higher. The carrier concentration at the peak 314 may be 10 times as high as the base carrier concentration $N_{00}$ or higher, or may also be 100 times as high as the base carrier concentration $N_{00}$ or higher.

Figure 8:
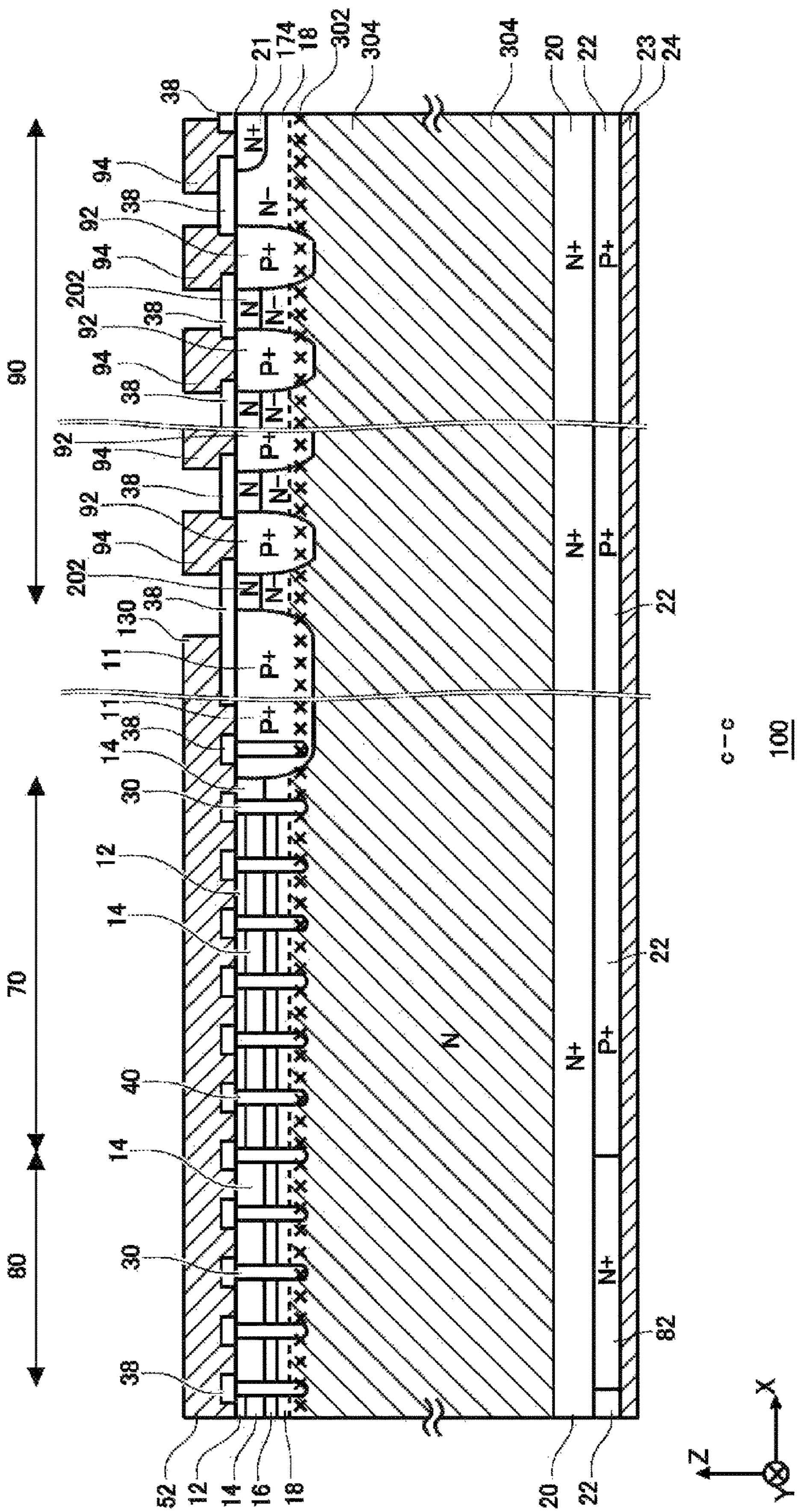
FIG. 8 is a drawing illustrating another example of the cross section taken along c-c in FIG. 1.

FIG. 8 is a drawing illustrating another example of the cross section taken along c-c in FIG. 1. In the semiconductor device 100 in this example, a range where the first high concentration region 304 is provided in the depth direction differs from the example illustrated in FIG. 4. The position of the hydrogen peak portion 302 in the depth direction may differ from the example illustrated in FIG. 4 too. The other structures are the same as the example illustrated in FIG. 4.

The first high concentration region 304 in this example is in contact with the guard ring 92. The first high concentration region 304 is in contact with at least the lower end of the guard ring 92. The first high concentration region 304 may be provided between the mutually adjacent two guard ring 92 too. The first high concentration region 304 in this example is not in contact with the second high concentration region 202. The first high concentration region 304 may be provided on the upper surface 21 side relative to the bottom surface of the trench portion. That is, the first high concentration region 304 may be provided up to a mesa portion sandwiched by the adjacent trench portions. The bulk doping region 18 at the bulk donor concentration may be provided between the first high concentration region 304 and the second high concentration region 202.

A configuration may be adopted where the hydrogen peak portion 302 in this example is not in contact with the guard ring 92. In other words, the hydrogen peak portion 302 may be arranged to be located lower than the guard ring 92. In another example, the hydrogen peak portion 302 may also be in contact with the guard ring 92. The first high concentration region 304 may also reach the upper surface 21.

According to this example, since the lower end of the guard ring 92 is covered by the first high concentration region 304, it is possible to reduce the donor concentration fluctuation in the region where the electric field tends to concentrate. For this reason, it is possible to further reduce the breakdown voltage fluctuation.

Figure 9:
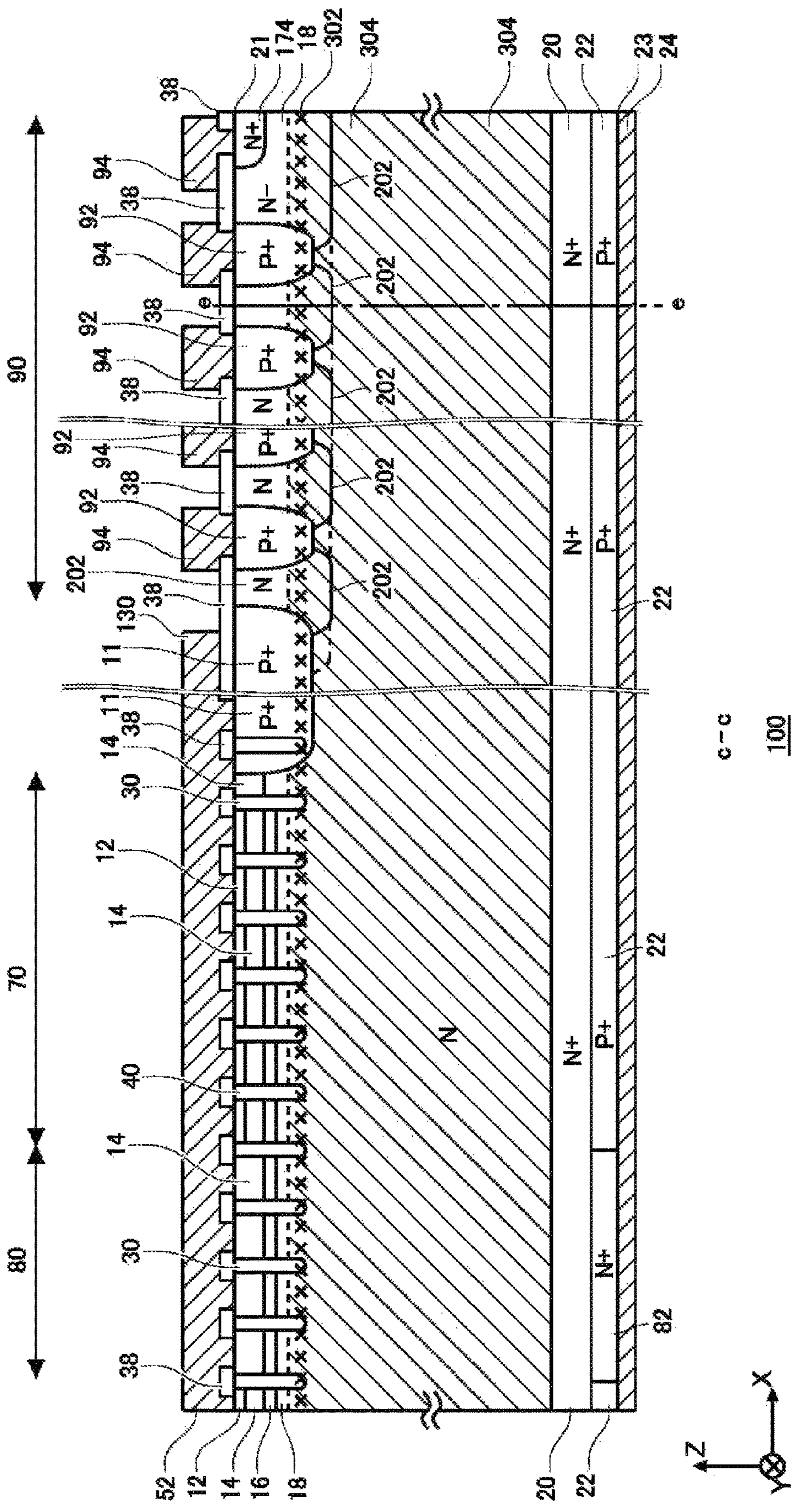
FIG. 9 is a drawing illustrating another example of the cross section taken along c-c in FIG. 1.

FIG. 9 is a drawing illustrating another example of the cross section taken along c-c in FIG. 1. In the semiconductor device 100 in this example, a range where the second high concentration region 202 and the first high concentration region 304 are provided in the depth direction differs from the example illustrated in FIG. 4 or FIG. 8. The other structures are the same as the example illustrated in FIG. 4 or FIG. 8.

A part of the second high concentration region 202 and a part of the first high concentration region 304 in this example are provided in the same region. A lower end of the second high concentration region 202 is arranged in a range of the first high concentration region 304, and an upper end of the first high concentration region 304 is arranged in a range of the second high concentration region 202. According to the above-described configuration, the second high concentration region 202 and the first high concentration region 304 are connected to each other, and it is possible to reduce the region of the bulk donor concentration in the edge terminal structure portion 90. For this reason, it is possible to further reduce the breakdown voltage fluctuation.

The second high concentration region 202 may be formed up to a position deeper than the lower end of the guard ring 92. Thus, the second high concentration region 202 and the first high concentration region 304 can be easily connected to each other. In another example, the second high concentration region 202 may also be formed up to a position shallower than the lower end of the guard ring 92. The hydrogen peak portion 302 in this example is arranged in the second high concentration region 202. The hydrogen peak portion 302 may be provided in a position in contact with the guard ring 92. Thus, the first high concentration region 304 can be formed up to a position close to the upper surface 21, and the second high concentration region 202 and the first high concentration region 304 can be easily connected to each other.

In the edge terminal structure portion 90, the bulk doping region 18 at the bulk donor concentration may also remain on a further outer side relative to the guard ring 92 arranged on the outermost side, or the bulk doping region 18 does not remain, and the second high concentration region 202 may also be provided. In this example, the bulk doping region 18 does not remain. In the example of FIG. 9, the second high concentration region 202 does not cover a part of the lower end of the guard ring 92. As represented by a broken line in FIG. 9, the second high concentration region 202 may also cover the entire guard ring 92. The first high concentration region 304 may also reach the upper surface 21.

Figure 10:
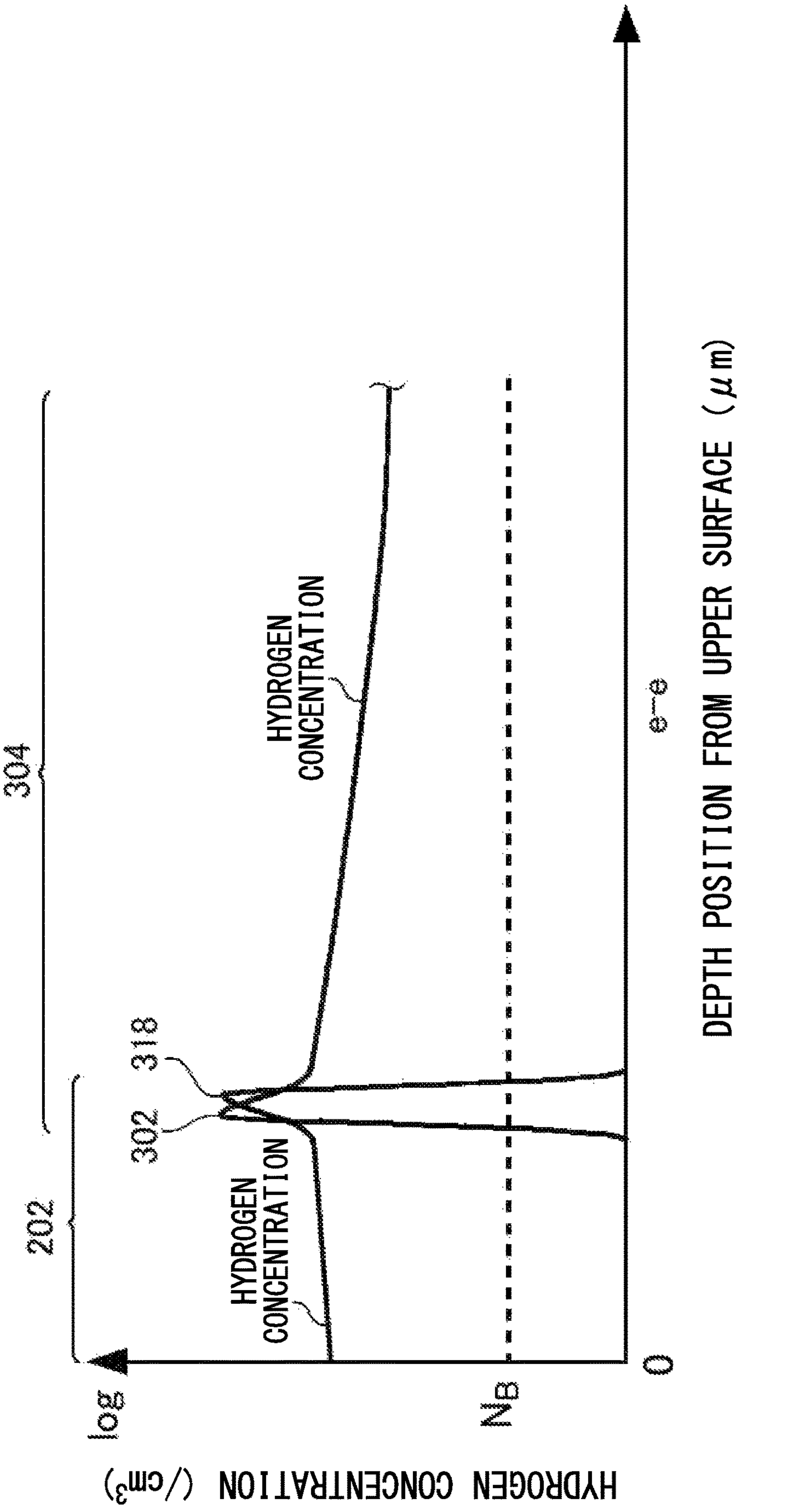
FIG. 10 illustrates an example of a hydrogen concentration distribution on a line e-e in FIG. 9.

FIG. 10 illustrates an example of a hydrogen concentration distribution on a line e-e in FIG. 9. FIG. 10 illustrates a chemical concentration distribution of hydrogen. In this example, an example is illustrated where the second high concentration region 202 is formed of the hydrogen donor, but the second high concentration region 202 may also be formed of a donor other than hydrogen, such as phosphorus.

In this example, the first peak 318 of the hydrogen concentration distribution by hydrogen implanted from the upper surface 21 is overlapped with the hydrogen peak portion 302 of the hydrogen concentration distribution by hydrogen implanted from the lower surface 23. The overlap of the peaks refers to a state where a range of a full width at half maximum of one of the peaks includes an apex of the other peak.

The hydrogen concentration distribution may have a single peak where the first peak 318 is superimposed on the hydrogen peak portion 302 in a position where the second high concentration region 202 and the first high concentration region 304 are overlapped with each other. The hydrogen concentration distribution may be gradually reduced from the peak to the upper surface 21, and may be gradually reduced from the peak to the buffer region 20.

In addition, the carrier concentration distribution in this example may have a single peak in the depth positions of the first peak 318 and the hydrogen peak portion 302. The carrier concentration distribution may have the flat portion 317 on the upper surface 21 side relative to the peak (see FIG. 7), and have the flat portion 313 on the lower surface 23 side relative to the peak (see FIG. 7).

In addition, the VOH defect density distribution in this example may have a single peak in the depth positions of the first peak 318 and the hydrogen peak portion 302. The VOH defect density distribution may have the flat portion 327 on the upper surface 21 side relative to the peak (see FIG. 7), and the flat portion 323 (see FIG. 7) have the lower surface 23 side relative to the peak.

Figure 11:
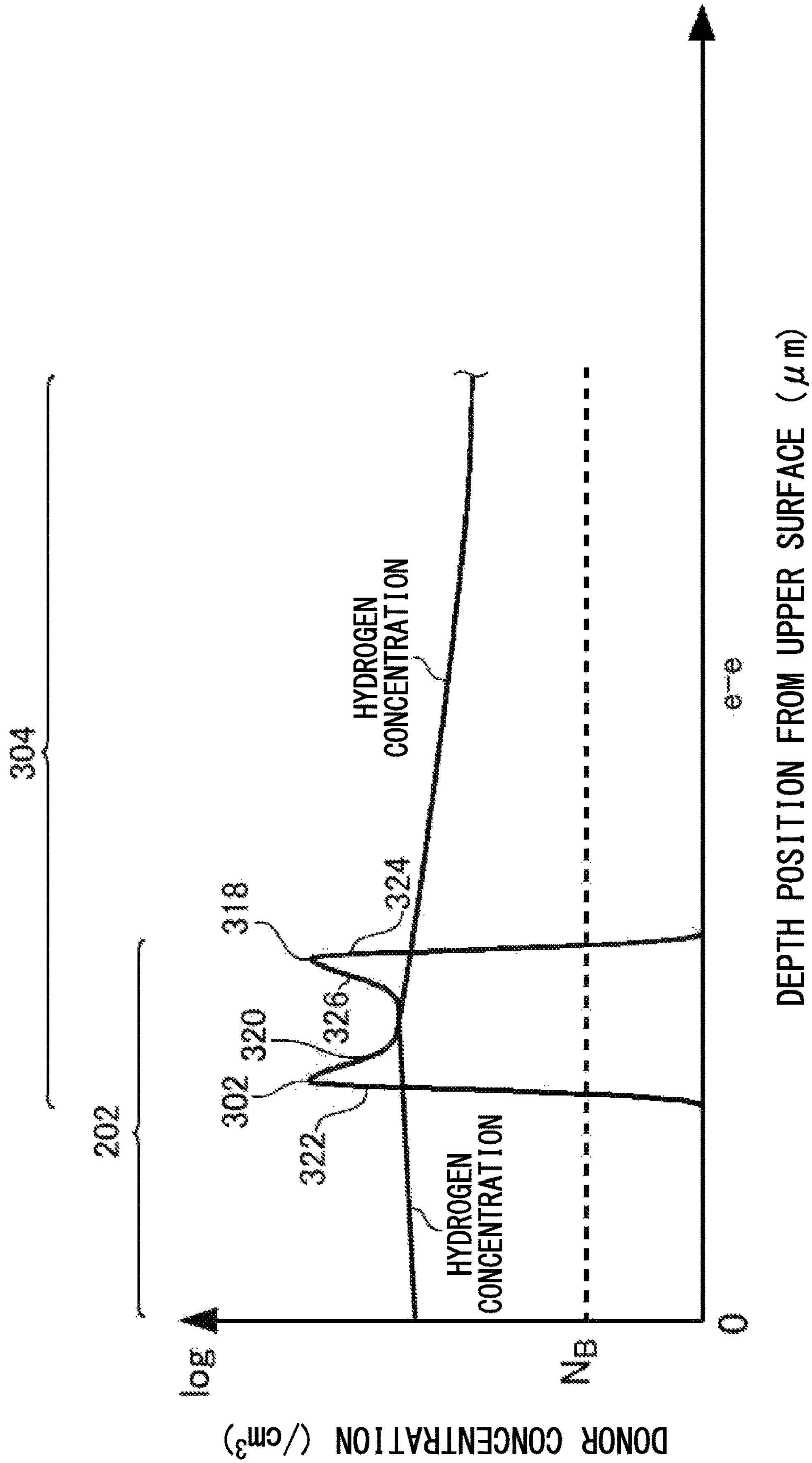
FIG. 11 illustrates another example of the hydrogen concentration distribution on the line e-e in FIG. 9.

FIG. 11 illustrates another example of the hydrogen concentration distribution on the line e-e in FIG. 9. FIG. 11 illustrates a chemical concentration distribution of hydrogen. In this example, an example is illustrated where the second high concentration region 202 is formed of the hydrogen donor, but the second high concentration region 202 may be formed of a donor other than hydrogen, such as phosphorus.

In this example, the first peak 318 of the hydrogen concentration distribution by hydrogen implanted from the upper surface 21, and the hydrogen peak portion 302 of the hydrogen concentration distribution by hydrogen implanted from the lower surface 23 are arranged to be away from each other. It is however noted that the first peak 318 is provided in a position overlapped with the first high concentration region 304, and the hydrogen peak portion 302 is provided in a position overlapped with the second high concentration region 202. In other words, the hydrogen peak portion 302 is arranged between the first peak 318 and the upper surface 21 of the semiconductor substrate 10.

The slope 326 of the first peak 318 on the upper surface 21 side is more gradual than the slope 324 on the lower surface 23 side. In addition, the slope 320 of the hydrogen peak portion 302 on the lower surface 23 side is more gradual than the slope 322 on the upper surface 21 side. In other words, in the first peak 318 and the hydrogen peak portion 302, the relatively gradual slopes (the slope 326 and the slope 320) are arranged facing each other.

In addition, the carrier concentration distribution in this example may have respective peaks (the peak 314 and the peak 312 in FIG. 7) in the depth positions of the first peak 318 and the hydrogen peak portion 302. The carrier concentration distribution may have the flat portion 317 (see FIG. 7) on the upper surface 21 side relative to the peak 314, and have the flat portion 313 (see FIG. 7) on the lower surface 23 side relative to the peak 312.

In addition, the VOH defect density distribution in this example may have respective peaks in the depth positions of the first peak 318 and the hydrogen peak portion 302. Among the two peaks, the VOH defect density distribution have the flat portion 327 (see FIG. 7) on the further upper surface 21 side relative to the peak on the upper surface side, and have the flat portion 323 (see FIG. 7) on the further lower surface 23 side relative to the peak on the lower surface side.

Figure 12:
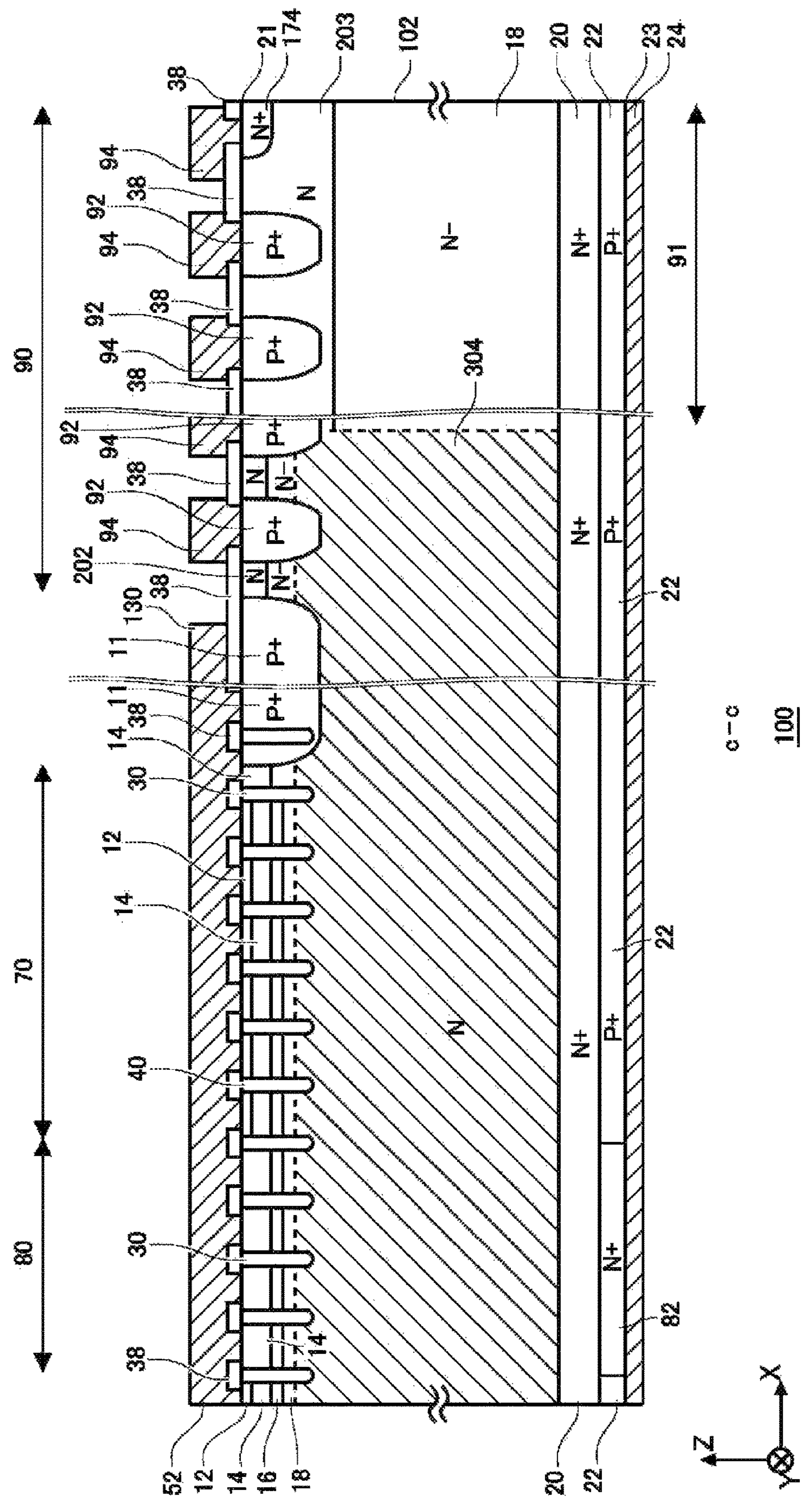
FIG. 12 is a drawing illustrating another example of the cross section taken along c-c in FIG. 1.

FIG. 12 is a drawing illustrating another example of the cross section taken along c-c in FIG. 1. In a region 91 corresponding to at least a part of the edge terminal structure portion 90, the semiconductor device 100 in this example has an arrangement of a high concentration region different from the example illustrated in FIG. 4, FIG. 8, or FIG. 9. In addition, in the region 91, a third high concentration region 203 may also be provided instead of the second high concentration region 202. The third high concentration region 203 is a high concentration region formed up to a position deeper than the second high concentration region 202. One or a plurality of the bulk doping region 18, the second high concentration region 202, the first high concentration region 304, and the third high concentration region 203 may be provided in the region 91. The other structures are the same as the example illustrated in FIG. 4, FIG. 8, or FIG. 9.

The first high concentration region 304 in the example of FIG. 12 is not provided in the region 91 having a predetermined width in contact with the end side 102 of the semiconductor substrate 10 in the edge terminal structure portion 90. The region 91 may include one or more of the guard rings 92. The bulk doping region 18 at the bulk donor concentration may be provided in the region 91 instead of the first high concentration region 304. A configuration may also be adopted where the first high concentration region 304 is not formed in the edge terminal structure portion 90. An outer peripheral end of the first high concentration region 304 may be located on an inner side relative to the guard ring 92 on the innermost periphery. In another example, the first high concentration region 304 may be provided in the region 91 too. The length of the first high concentration region 304 of the region 91 may be the same as, may be shorter than, or may also be longer than, the length of the first high concentration region 304 arranged on the inner side relative to the region 91 in the Z axis direction.

The edge terminal structure portion 90 on an inner side relative to the region 91 has the same structure as the example illustrated in FIG. 4, FIG. 8, or FIG. 9. The edge terminal structure portion 90 on an inner side relative to the region 91 includes one or more of the guard rings 92. As illustrated in FIG. 4, FIG. 8, or FIG. 9, the first high concentration region 304 may be provided in a range where the lower end of the guard ring 92 is included, or may also be included in a range where the lower end of the guard ring 92 is not included.

The second high concentration region 202 may be provided, or may also not be provided, in the region 91. Alternatively, instead of the second high concentration region 202, the N type third high concentration region 203 having a higher donor concentration than the bulk donor concentration may be provided. The donor concentration of the third high concentration region 203 may be the same as, or may also be different from, the donor concentration of the second high concentration region 202. The third high concentration region 203 is provided from the upper surface 21 of the semiconductor substrate 10 to a position deeper than the lower end of the second high concentration region 202. The third high concentration region 203 in this example may be provided up to a position deeper than the lower end of the guard ring 92. The bulk doping region 18 is provided between the third high concentration region 203 and the buffer region 20.

The third high concentration region 203 may be formed by implanting a donor such as phosphorus or hydrogen from the upper surface 21. A donor implantation depth in the third high concentration region 203 may be deeper than a donor implantation depth in the second high concentration region 202. Heat treatment on the second high concentration region 202 and the third high concentration region 203 may be independently performed, or may also be collectively performed.

Figure 13:
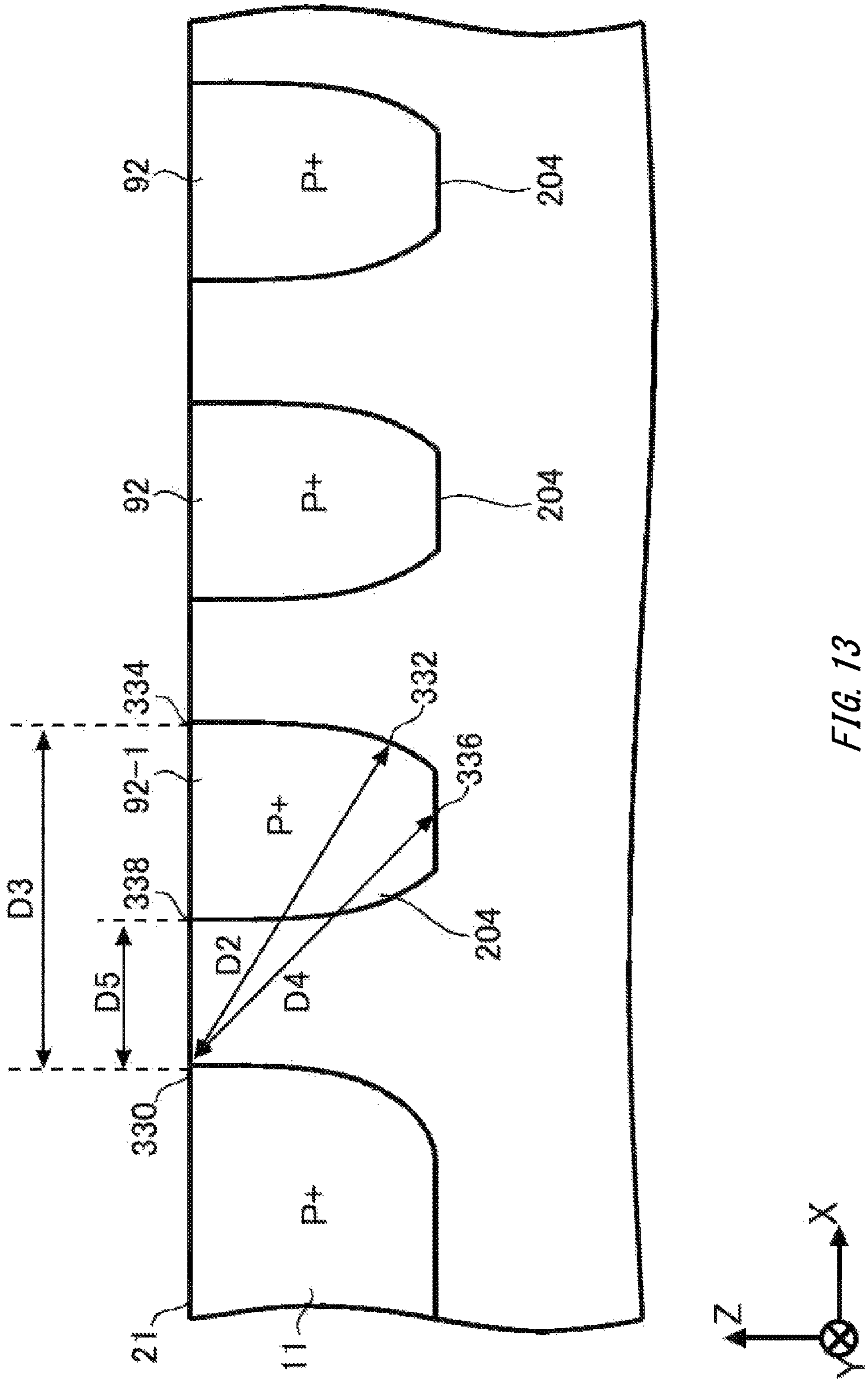
FIG. 13 is an enlarged cross sectional view in the vicinity of a well region 11 and guard rings 92.

FIG. 13 is an enlarged cross sectional view in the vicinity of the well region 11 and the guard rings 92. FIG. 13 illustrates an XZ cross section. In addition, FIG. 13 illustrates the well region 11 and the guard ring 92, and the configurations of the second high concentration region 202, the bulk doping region 18, the first high concentration region 304, the hydrogen peak portion 302, and the like are omitted.

In FIG. 13, a distance between a point 330 in the well region 11 and a point 332 in a guard ring 92-1 that is the closest to the well region 11 is set as D2. The point 330 is the closest point to the guard ring 92-1 on the upper surface 21 of the semiconductor substrate 10 in the well region 11. The point 332 is the farthest point from the point 330 in the guard ring 92-1. In other words, the distance D2 is a maximum value of distances between the point 330 of the well region 11 and respective points in the closest guard ring 92-1 to the well region 11. A distance between the hydrogen peak portion 302 illustrated in FIG. 4 or the like and the second high concentration region 202 in the Z axis direction is set as D1. As illustrated in FIG. 5 and FIG. 7, the distance D1 is a distance between an apex of a peak of the carrier concentration in the second high concentration region 202 and the apex of the hydrogen peak portion 302. The distance D1 may be shorter than the distance D2. When the distance D1 is decreased, the region of the bulk donor concentration can be reduced, and the fluctuation of the doping concentration can be suppressed.

A distance between the point 330 in the well region 11 and a point 334 in the guard ring 92-1 is set as D3. The point 334 is the farthest point from the well region 11 in the guard ring 92-1 on the upper surface 21 of the semiconductor substrate 10. The distance D1 may be shorter than the distance D3.

A distance between the point 330 in the well region 11 and a point 336 in the guard ring 92-1 is set as D4. The point 336 is the lowermost point in the guard ring 92-1. The point 336 may be a lower end of the guard ring 92-1 in a center of the X axis direction. The distance D1 may be shorter than the distance D4.

A distance between the point 330 in the well region 11 and a point 338 in the guard ring 92-1 is set as D5. The point 338 is the closest point to the well region 11 in the guard ring 92-1 on the upper surface 21 of the semiconductor substrate. The distance D1 may be shorter than the distance D5.

Figure 14:
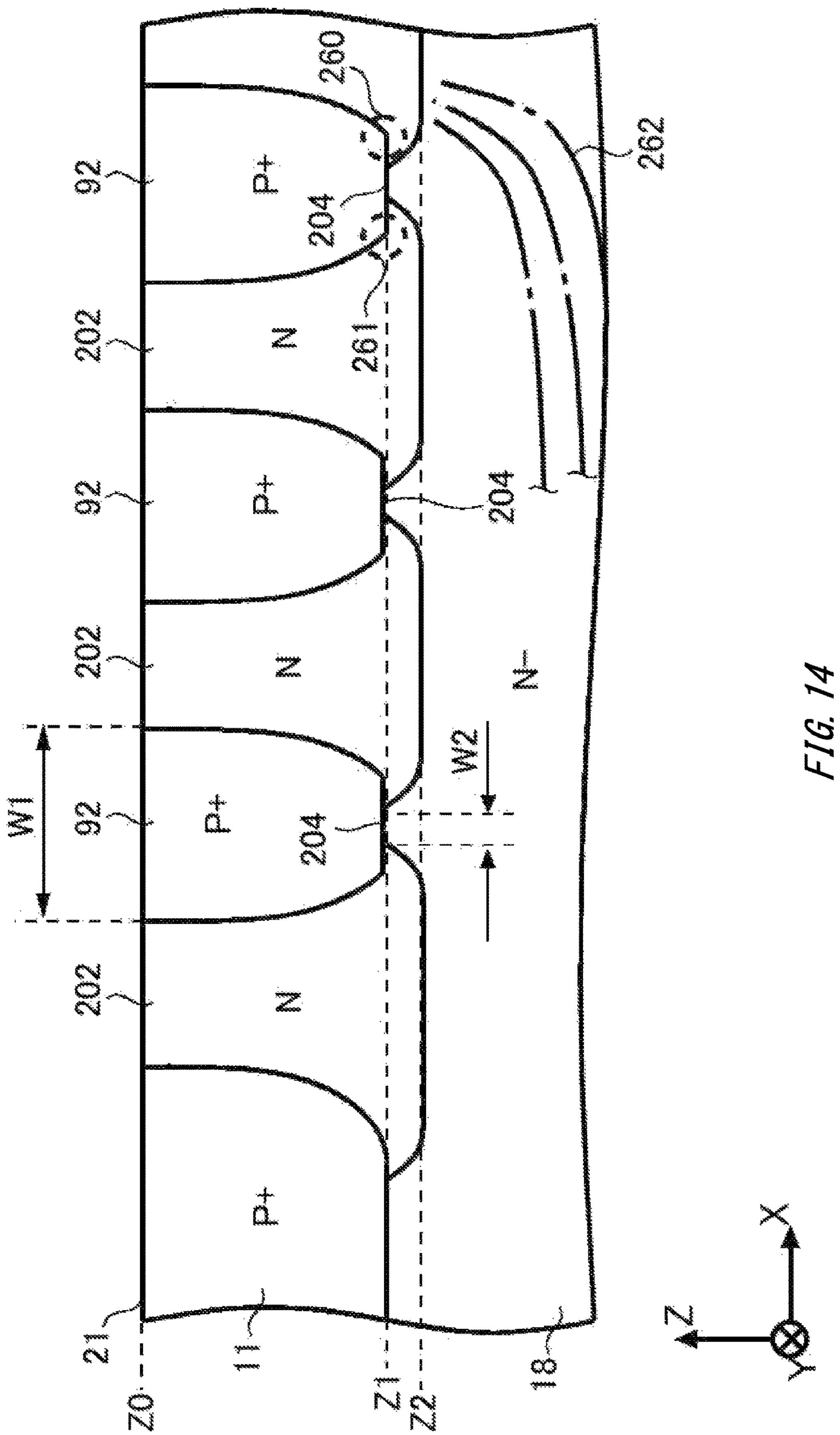
FIG. 14 is a drawing illustrating another structural example of a second high concentration region 202.

FIG. 14 is a drawing illustrating another structural example of the second high concentration region 202. In this example, a position in the lower end of the guard ring 92 in the Z axis direction is set as Z1.

The second high concentration region 202 has a region arranged on the upper surface 21 side relative to the position Z1, and a region arranged on the lower surface 23 side relative to the position Z1. The second high concentration region 202 in this example is continuously provided from a position Z0 in contact with the upper surface 21 of the semiconductor substrate 10 to a depth position Z2. The position Z2 is a position farther away from the upper surface 21 than the position Z1.

The second high concentration region 202 in this example covers a part of the guard ring 92 as viewed from the lower surface 23 side of the semiconductor substrate 10. In other words, a part of the second high concentration region 202 is overlapped with a part of the guard ring 92 in the Z axis direction. In the second high concentration region 202, the region provided from the depth positions Z1 to Z2 may cover a part of the guard ring 92. Thus, it is possible to mitigate the electric field concentration in the vicinity of the lower end of the guard ring 92.

FIG. 14 schematically illustrates an equipotential surface 262. As illustrated in FIG. 14, the electric field may concentrate in the vicinity of a lower region 260 of the guard ring 92. The lower region 260 may be a region where a curvature of a boundary line between the guard ring 92 and an N type region become the highest. The lower region 260 may also be a region where a change of an inclination of the boundary line between the guard ring 92 and the N type region (that is, a second order differential value) becomes the highest. The lower region 260 may be arranged in the vicinity of the lower end of the guard ring 92. The lower end of the guard ring 92 is a part arranged in the deepest position in the guard ring 92.

It is noted that the guard ring 92 may also have the lower region 260 and a lower region 261. In a case where a cross sectional shape of the guard ring 92 may be axisymmetric to a center line in parallel with the Z axis, the guard ring 92 has the lower region 260 and the lower region 261 in axisymmetric positions. The lower region closer to the well region 11 out of the two lower regions 260 is set as the lower region 261, and the lower region farther from the well region 11 is set as the lower region 260. As illustrated in FIG. 14, the electric field tends to concentrate in the vicinity of the lower region 260.

When the second high concentration region 202 is provided, it is possible to arrange a high concentration N type region in the vicinity of the lower region 260 and the lower region 261. Thus, in the vicinity of the lower region 260 and the lower region 261, the spread of the depletion layer can be suppressed while the electric field concentration is mitigated. The second high concentration region 202 preferably covers the lower region 260. In other words, the second high concentration region 202 is preferably in contact with the lower region 260. The second high concentration region 202 may also further cover the lower region 261. A cross sectional shape of the second high concentration region 202 may be axisymmetric to the center line in parallel with the Z axis.

In addition, since the electric field concentrates between the guard rings 92 and in a region in the vicinity of the lower end of the guard ring 92, when a fluctuation of the donor concentration in the region occurs, a fluctuation of the breakdown voltage occurs. In a case where the second high concentration region 202 is not provided, the bulk doping region 18 is formed in the region. Since the donor concentration in the bulk doping region 18 is the concentration of the donor contained from the fabrication time of the semiconductor substrate 10, the fluctuation relatively easily occurs. In contrast, in this example, the second high concentration region 202 is provided in the region. The second high concentration region 202 is formed by the ion implantation or the like. Since the concentration of the ion implantation is relatively easily controlled, the fluctuation of the donor concentration of the second high concentration region 202 is relatively small. For this reason, when the second high concentration region 202 is provided, the breakdown voltage fluctuation of the semiconductor device 100 can be reduced too.

The second high concentration region 202 is provided in at least one of regions sandwiched by the guard rings 92. The second high concentration region 202 may also be arranged in all the regions sandwiched by the guard rings 92.

Each of the guard rings 92 may have a region 204 that is not covered by the second high concentration region 202 as viewed from the lower surface 23 side of the semiconductor substrate 10. The region 204 may be a region including the lower end in the center of the guard ring 92 in the X axis direction. The region 204 may be in contact with the bulk doping region 18. The region 204 may also be in contact with the first high concentration region 304.

A width W2 of the region 204 in the X axis direction is narrower than a width W1 of the guard ring 92 on the upper surface 21 of the semiconductor substrate 10. The W2 may be equal to or more than 10% of the width W1, may be equal to or more than 30% of the width W1, may be equal to or more than 50% of the width W1, and may also be equal to or more than 70% of the width W1.

Figure 15:
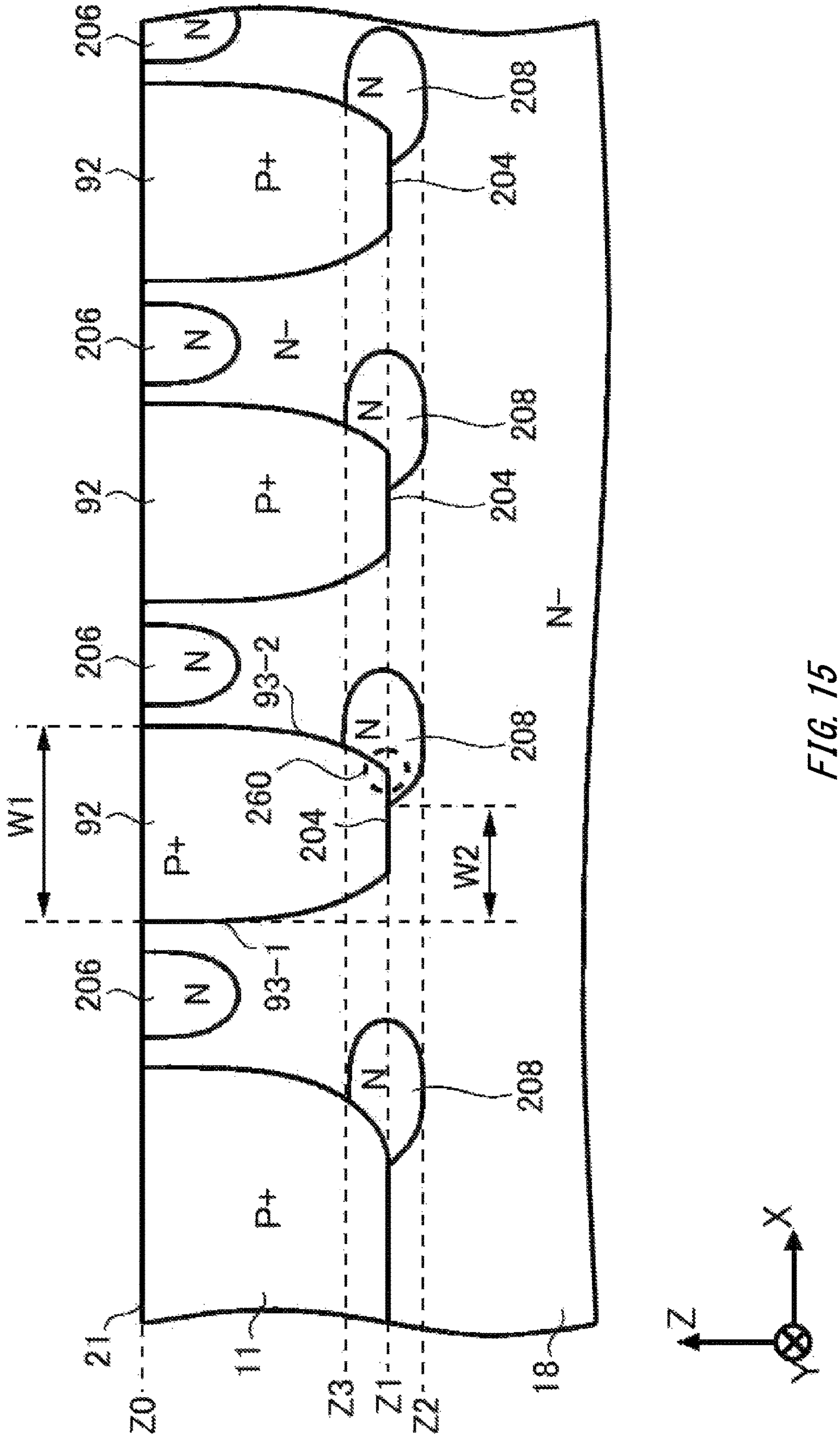
FIG. 15 is a drawing illustrating another example of the second high concentration region 202.

FIG. 15 is a drawing illustrating another example of the second high concentration region 202. Structures other than the second high concentration region 202 are the same as the example illustrated in FIG. 14. The second high concentration region 202 in this example has an upper part 206 and a lower part 208. The upper part 206 and the lower part 208 are provided while being separated from each other. In this example, the bulk doping region 18 at the bulk donor concentration is provided between the upper part 206 and the lower part 208. It is noted that in a case where the N type dopant is implanted from the upper surface 21 to the lower part 208, a donor may be formed in a region too through which the N type dopant has passed in some cases. In this case, the donor concentration is gradually decreased from the lower part 208 towards the upper surface 21. The donor concentration may also be gradually decreased from the lower part 208 towards the upper part 206 between the lower part 208 and the upper part 206. For example, in a case where hydrogen is used as the N type dopant, a vacancy defect (V) formed in the region through which hydrogen has passed, oxygen (O) contained in the semiconductor substrate 10, and hydrogen (H) diffused from the lower part 208 are combined to form a VOH defect. The VOH defect functions as a donor.

The upper part 206 is provided in contact with the upper surface 21 of the semiconductor substrate 10 between the two guard rings 92. The upper part 206 may be arranged to be away from the guard ring 92. Thus, the diffusion of the donor that has been doped at a high concentration in the upper part 206 into the guard ring 92 can be suppressed. In another example, the upper part 206 may also be in contact with the guard ring 92. The upper part 206 may have a part that is not overlapped with the field plate 94 illustrated in FIG. 4 and the like. The upper part 206 may be provided so as to be overlapped with the entire gap between the mutually adjacent two field plates 94.

The lower part 208 is provided from a position shallower than the lower end of the guard ring 92 to the position Z2 deeper than the lower end of the guard ring 92. The lower part 208 in this example is provided in contact with a side surface 93-2 farther from the well region 11 out of two side surfaces 93-1 and 93-2 of the guard ring 92. The side surface 93-1 of the guard ring 92 in FIG. 5 is a surface on the well region 11 side relative to the center of the guard ring 92 in the X axis direction. The side surface 93-2 of the guard ring 92 is a surface opposite to the side surface 93-1. The lower part 208 may not be in contact, or may also be in contact, with the side surface 93-1. When the lower part 208 is provided in contact with the side surface 93-2, it is possible to protect the region where the electric field tends to concentrate. The lower part 208 is preferably in contact with the lower region 260. In addition, the width W2 of the region 204 in this example is wider than a half of the width W1 of the guard ring 92.

A position of an upper end of the lower part 208 in the Z axis direction is set as Z3. A distance Z1-Z3 between the positions Z1 and Z3 in the Z axis direction may be the same as a distance Z2-Z1 between the positions Z1 and Z2 in the Z axis direction. The distance Z2-Z1 may also be longer than the distance Z1-Z3. Thus, it becomes easier to protect the region where the electric field tends to concentrate. The distance Z2-Z1 may also be shorter than the distance Z1-Z3.

In addition, the second high concentration region 202 may also be formed by using a plural types of N type dopants. For example, the upper part 206 may be formed by implanting a first dopant such as phosphorus, and the lower part 208 may be formed by implanting a second dopant such as hydrogen. In this case, the upper part 206 contains the first dopant (phosphorus) at a higher concentration than the second dopant (hydrogen), and the lower part 208 contains the second dopant (hydrogen) at a higher concentration than the first dopant (phosphorus).

In addition, the dose amount of the N type dopant implanted to the second high concentration region 202 may also be adjusted according to a specific resistance or a donor concentration of the semiconductor substrate 10 before the implantation of the N type dopant. Thus, the specific resistance or the donor concentration of the semiconductor substrate 10 after the formation of the second high concentration region 202 can be more accurately adjusted.

Figure 16A:
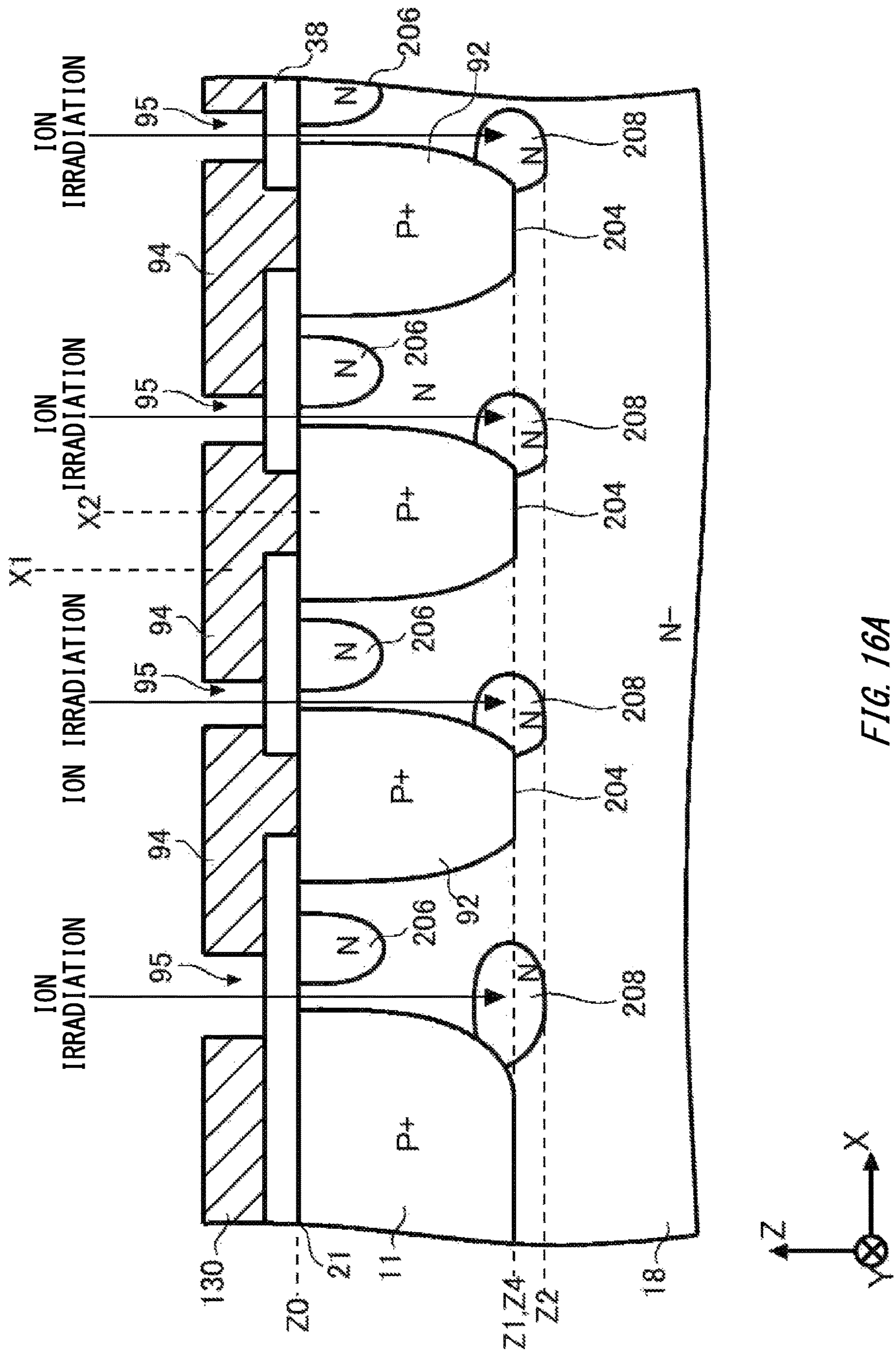
FIG. 16A is a drawing for describing a part of manufacturing processes of the semiconductor device 100.
Figure 16B:
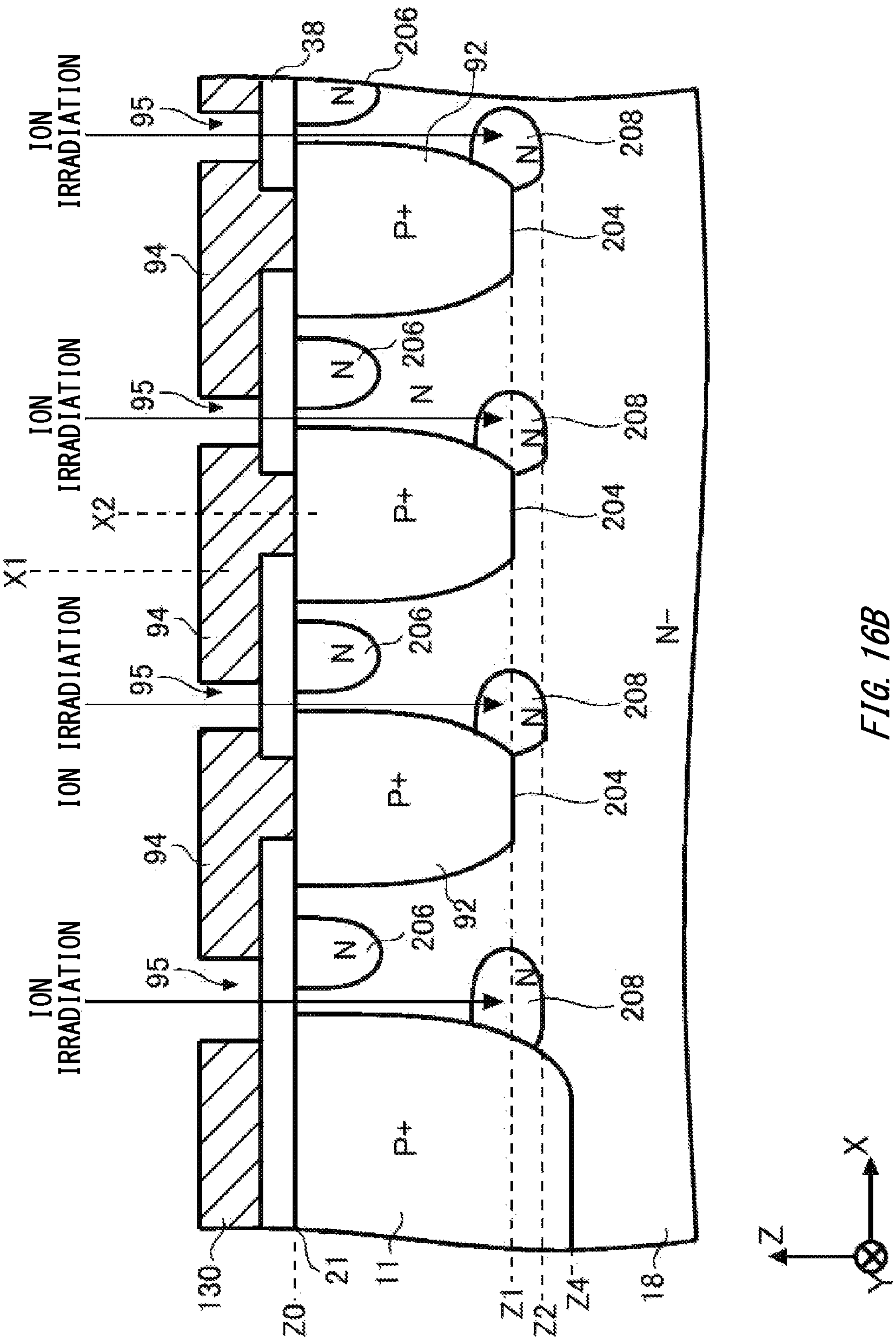
FIG. 16B is a drawing for describing a part of the manufacturing processes of the semiconductor device 100.

FIG. 16A and FIG. 16B are drawings for describing a part of manufacturing processes of the semiconductor device 100. FIG. 16A and FIG. 16B illustrate a process for forming the lower part 208 of the second high concentration region 202. In this example, the N type dopant is implanted to the lower part 208 while each of the electrodes such as the field plate 94, the outer peripheral gate runner 130, and the emitter electrode 52 are used as the masks. In the edge terminal structure portion 90, the N type dopant is implanted from a gap 95 between the mutually adjacent field plates 94.

In this example, the N type dopant is implanted after the interlayer dielectric film 38 and each of the electrodes such as the field plate 94 are formed. The N type dopant is hydrogen, for example. In addition, after the well region 11, the upper part 206, and the guard ring 92 are formed, the N type dopant may be implanted to the lower part 208. After the lower part 208 is formed by implanting the N type dopant, a protective film such as a polyimide or nitride film may be formed above each of the electrodes such as the field plate 94, the outer peripheral gate runner 130, and the emitter electrode 52.

According to this example, since the field plate 94 is used as the mask, the fabrication process of the semiconductor device 100 can be simplified. A region of at least a part of the lower part 208 in this example is overlapped with the gap 95 in the Z axis direction. A region where the donor concentration becomes the maximum value in the lower part 208 may also be overlapped with the gap 95 in the Z axis direction.

The field plate 94 may also be overlapped with a region of a part of the lower part 208 in the Z axis direction. When the N type dopant implanted to the lower part 208 diffuses in the X axis direction, a part of the lower part 208 can be formed in a position overlapped with the field plate 94. The field plate 94 may also be overlapped with a region of a part or whole of the upper part 206.

A central position of the field plate 94 in the X axis direction is set as X1, and a central position of the guard ring 92 in the X axis direction is set as X2. The central position X1 of the field plate 94 may be arranged on the well region 11 side relative to the central position X2 of the guard ring 92. Thus, the lower part 208 is not formed in the lower region 261 illustrated in FIG. 15, and it becomes easier to form the lower part in the lower region 260.

In this example, a position of the lower end of the well region 11 in the Z axis direction is set as Z4. In FIG. 16A, the position Z1 of the lower end of the guard ring 92 is matched with the position Z4 of the lower end of the well region 11. In other words, the lower part 208 is arranged up to a region deeper than the well region 11. On the other hand, in FIG. 16B, the position Z4 of the lower end of the well region 11 is arranged in a position deeper than the position Z1 of the lower end of the guard ring 92. In addition, in FIG. 16B, the position Z2 of the lower end of the lower part 208 is arranged to be closer to the upper surface 21 than the position Z4 of the lower end of the well region 11. In other words, the lower part 208 is arranged in a region shallower than the well region 11. In addition, in any of FIG. 16A and FIG. 16B, the doping concentration of the lower part 208 is lower than the doping concentration of the well region 11.

Figure 17A:
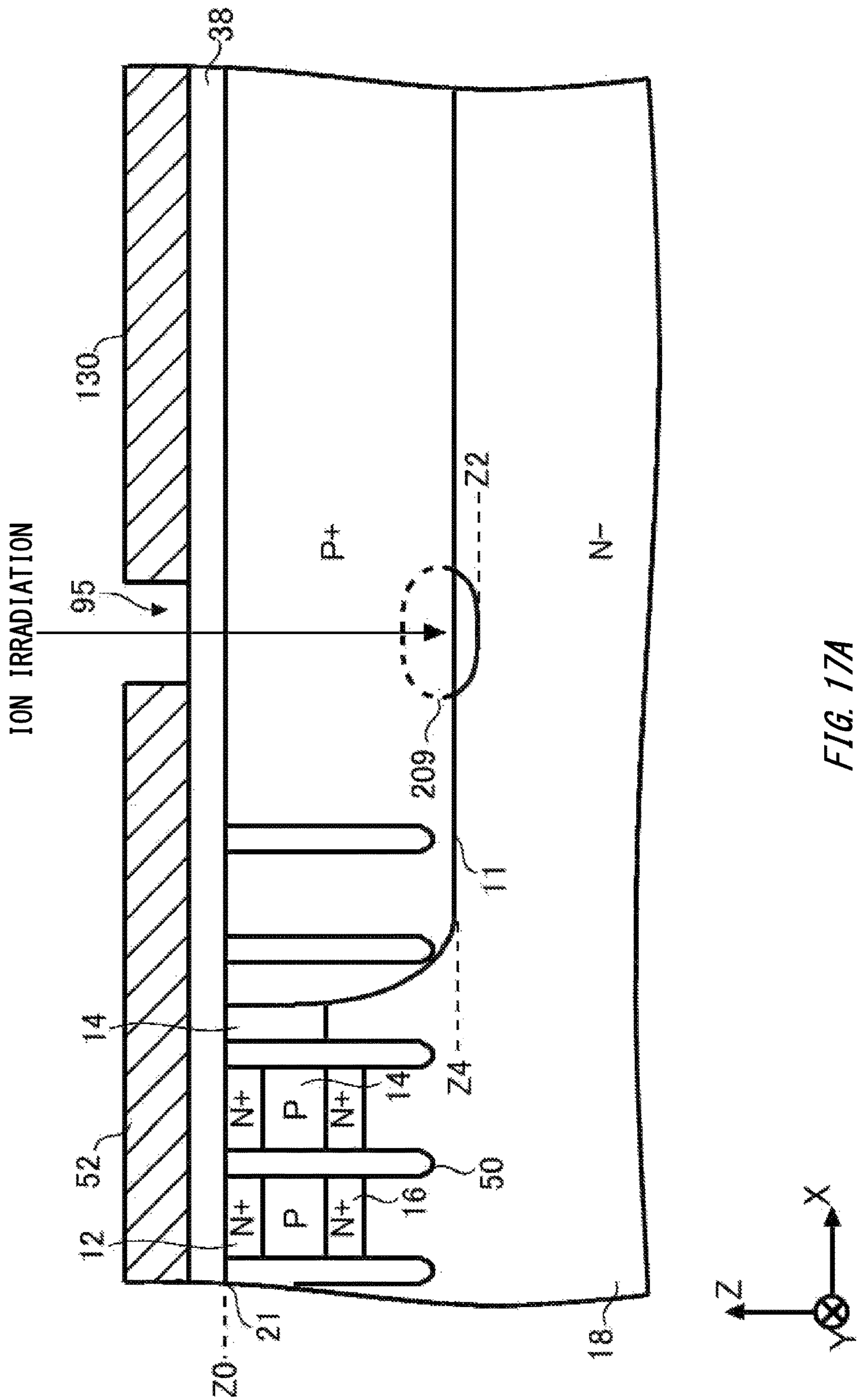
FIG. 17A is a cross sectional view in the vicinity of an emitter electrode 52 and an outer peripheral gate runner 130.
Figure 17B:
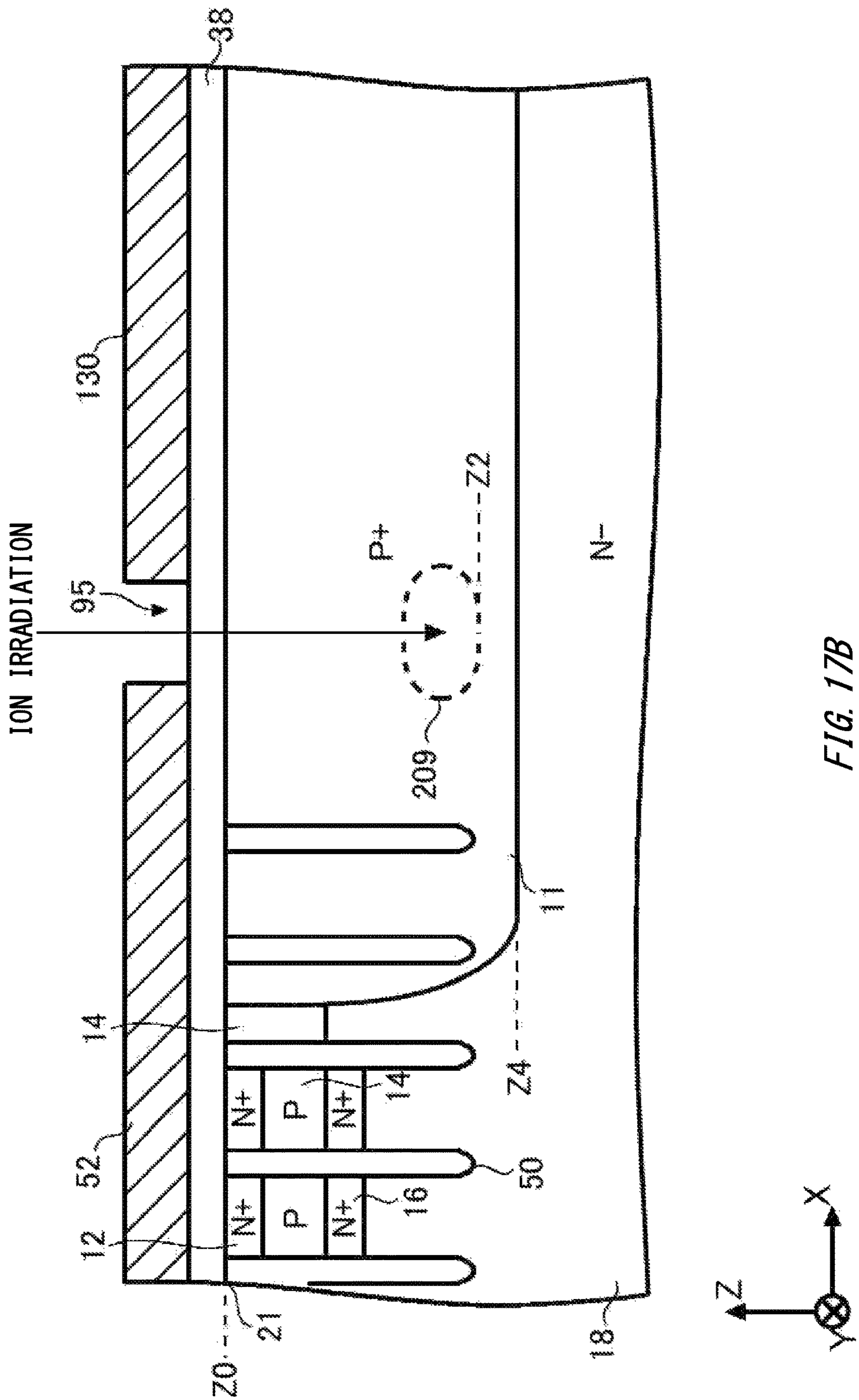
FIG. 17B is a cross sectional view in the vicinity of the emitter electrode 52 and the outer peripheral gate runner 130.

FIG. 17A and FIG. 17B are cross sectional views in the vicinity of the emitter electrode 52 and the outer peripheral gate runner 130. FIG. 17A corresponds to the example of FIG. 16A, and FIG. 17B corresponds to the example of FIG. 16B. In other words, the depth position Z4 of the well region 11 of FIG. 17A is the same as the example illustrated in FIG. 16A, and the depth position Z4 of the well region 11 of FIG. 17B is the same as the example illustrated in FIG. 16B. In FIG. 17A and FIG. 17B, the structure of the trench or the like is simplified, and also the contact hole in the interlayer dielectric film 38 is omitted. A gap 95 is provided between the emitter electrode 52 and the outer peripheral gate runner 130.

When the N type dopant is implanted while each of the electrodes such as the field plate 94, the outer peripheral gate runner 130, and the emitter electrode 52 is used as the mask, the N type dopant is also implanted from the gap 95 between the outer peripheral gate runner 130 and the emitter electrode 52. In FIG. 17A and FIG. 17B, a region where the N type dopant is implanted is set as a region 209. The region 209 is arranged in the same depth position as the lower part 208 illustrated in FIG. 16A and FIG. 16B and the like.

The well region 11 is formed below the gap 95. For this reason, in a case where the lower ends of the well region 11 and the guard ring 92 are aligned with each other as illustrated in FIG. 16A, when the lower part 208 is arranged in a position deeper than the well region 11, the lower part 208 is formed so as to protrude from the lower end of the well region 11 as illustrated in FIG. 17A.

In contrast, as illustrated in FIG. 16B, in a case where the position Z4 of the lower end of the well region 11 is deeper than the position Z1 of the lower end of the guard ring 92, when the lower part 208 is arranged in a region shallower than the well region 11, a configuration can be adopted where the lower part 208 does not protrude from the lower end of the well region 11 as illustrated in FIG. 17B. In this case, the position Z4 of the lower end of the well region 11 is farther away from the upper surface 21 of the semiconductor substrate 10 than the position Z2 of the lower end of the guard ring 92. In other words, the well region 11 is provided to be deeper than the guard ring 92. Thus, the lower part 208 can be formed to be deeper than the guard ring 92 and also formed to be shallower than the well region 11. It is noted that in the examples of FIG. 16A and FIG. 17A, a mask for decelerating or shielding ions may also be provided in a position covering the gap 95 above the well region 11. According to this too, a configuration can be adopted where the lower part 208 does not protrude from the lower end of the well region 11.

In addition, in a case where the doping concentration of the lower part 208 is higher than the doping concentration of the well region 11, the conductivity type of the region 209 of FIG. 17A and FIG. 17B is reversed from the P type to the N type. For this reason, a PN junction is formed in an unintended position, and a property of the semiconductor device 100 may fluctuate in some cases.

In contrast, when the doping concentration of the lower part 208 is set to be lower than the doping concentration of the well region 11, it is possible to avoid a situation where the conductivity type of the region 209 becomes the N type. The doping concentration of the well region 11 may be higher than, may be the same as, or may also be lower than, the doping concentration of the guard ring 92. The doping concentration of the guard ring 92 may be equal to or lower than $1.0\times10^{17}$ atoms/cm$^3$.

In the examples of FIG. 16A to FIG. 17B, the examples have been described in which the ion implantation of the lower part 208 is performed while the field plate 94 is used as the mask. In another example, after a protective film made of polyimide or the like is formed above the field plate 94 or the like, the ion implantation may also be performed while the protective film is used as the mask.

Figure 18:
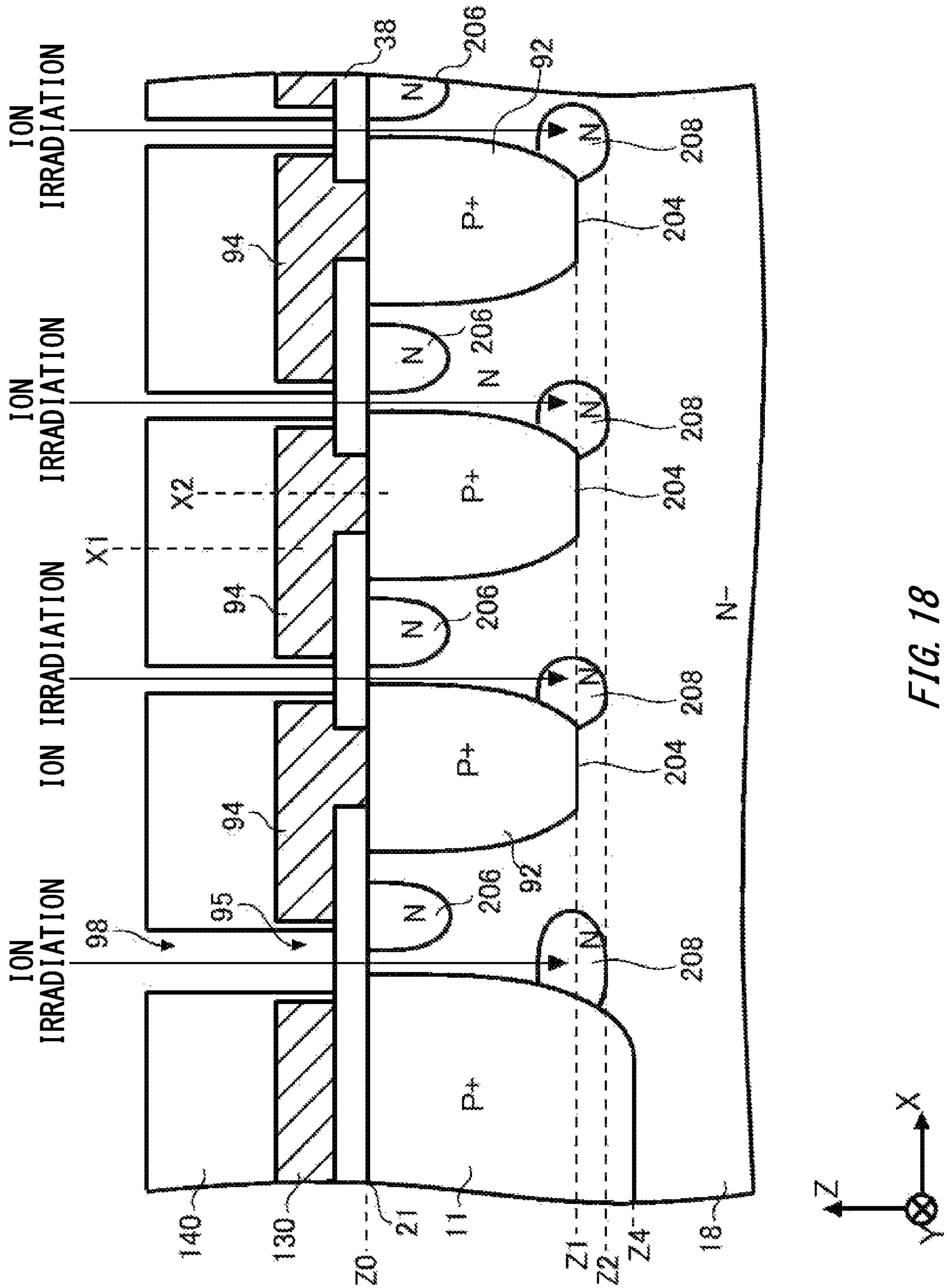
FIG. 18 is a drawing illustrating another example of the cross section in the vicinity of the edge terminal structure portion 90.
Figure 19:
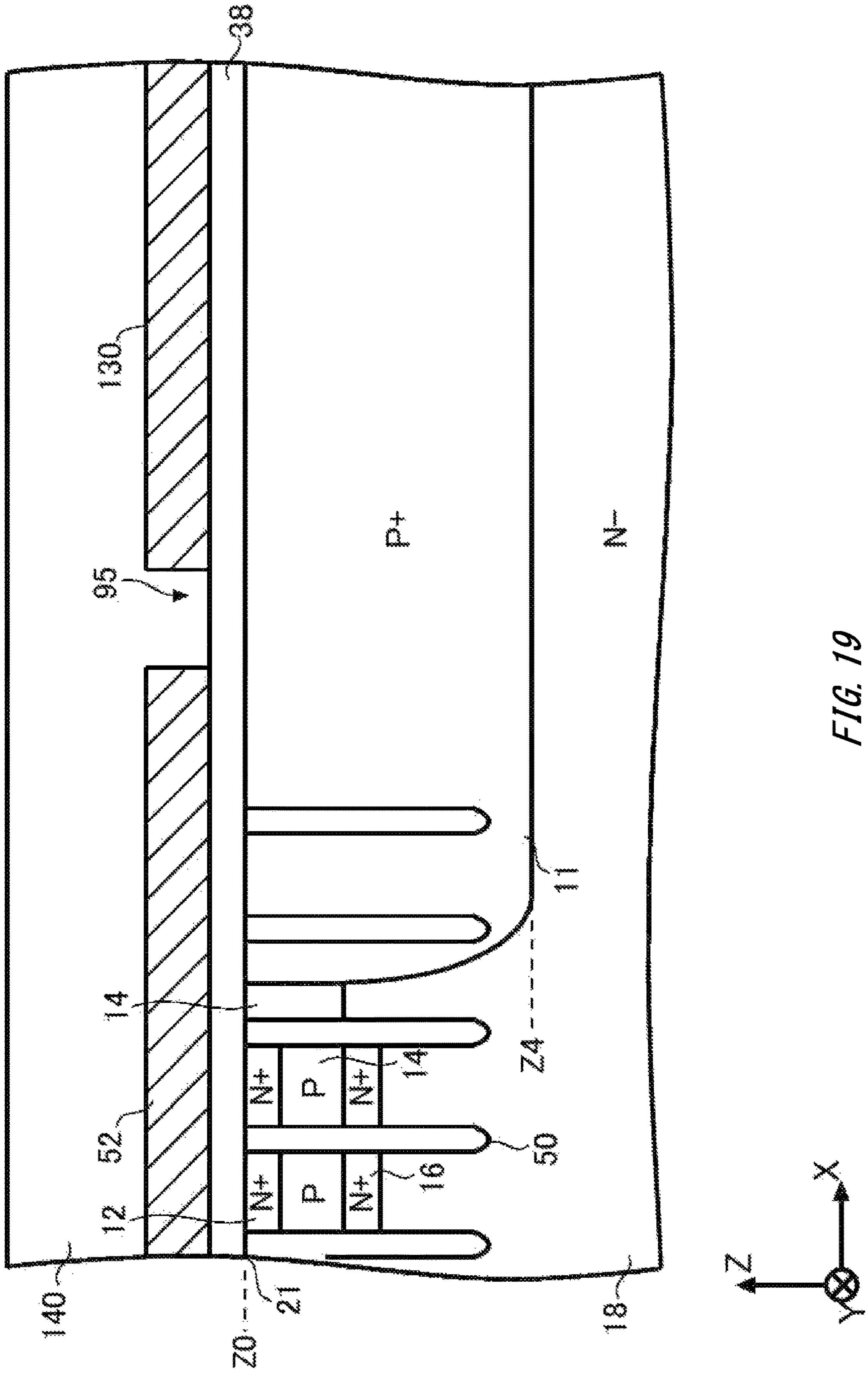
FIG. 19 is a drawing illustrating another example of the cross section in the vicinity of the emitter electrode 52 and the outer peripheral gate runner 130.

FIG. 18 and FIG. 19 are drawings illustrating examples in which the ion implantation is performed while a protective film 140 is used as the mask. FIG. 18 is a drawing illustrating another example of the cross section in the vicinity of the edge terminal structure portion 90. FIG. 19 is a drawing illustrating another example of the cross section in the vicinity of the emitter electrode 52 and the outer peripheral gate runner 130.

As illustrated in FIG. 18, the protective film 140 has an opening 98 above the lower part 208. The opening 98 passes through the gap 95 between the field plates 94. Both the protective film 140 and the field plate 94 are not provided in a position where the opening 98 is overlapped with the gap 95. In this example, the N type dopant is implanted to the region of the lower part 208 via the opening 98 and the gap 95. At this time, as illustrated in FIG. 19, when an opening of the protective film 140 is not provided on the well region 11, it is also possible to adopt a configuration where the ion implantation to the well region 11 is not performed.

In addition, the N type dopant implantation may also be performed by forming a mask pattern using photoresist or the like instead of the protective film 140. Alternatively, when the ion implantation to the lower part 208 is performed while the gap between the field plates 94 on the guard ring 92 is used as the mask, resist may also cover a top of the gap 95 between the field plates 94 on the well region 11. In this case, it is also possible to adopt a configuration where the ion implantation to the semiconductor substrate 10 is not performed by being shielded by the resist, or it is also possible to adopt a configuration where since deceleration occurs by the resist, the region 209 becomes shallow and does not protrude to the lower side of the well region 11. It is noted that a recess may also be used instead of the opening 98. The recess may also be formed by etching the protective film 140, or may also be formed at the time of deposition of the protective film 140. In a case where the protective film 140 is a nitride film or the like, at the time of the deposition, the recess that reflects the presence or absence of the gap 95 between the field plates 94 may be formed.

Figure 20:
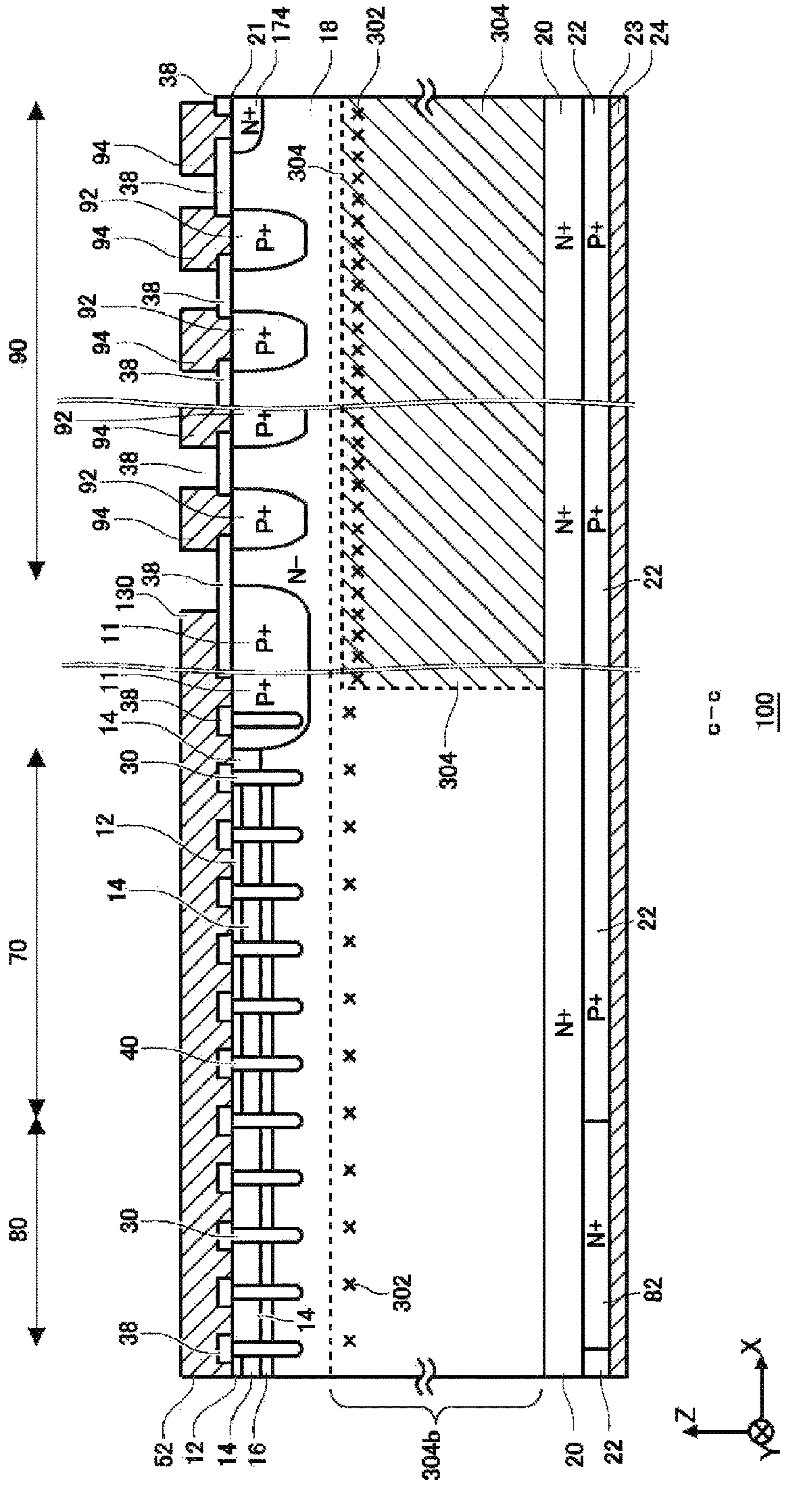
FIG. 20 is a drawing illustrating another example of the cross section taken along c-c in FIG. 1.

FIG. 20 is a drawing illustrating another example of the cross section taken along c-c in FIG. 1. The semiconductor device 100 in this example differs from the semiconductor device 100 described with reference to FIG. 1 to FIG. 19 in a range on an XY plane where the first high concentration region 304 is provided. A range on the XY plane where the hydrogen peak portion 302 is provided may differ from the example described with reference to FIG. 1 to FIG. 19 too. Structures other than the first high concentration region 304 and the hydrogen peak portion 302 may be the same as any of the modes described with reference to FIG. 1 to FIG. 19. In FIG. 20, the arrangement of the first high concentration region 304 and the hydrogen peak portion 302 is different from the example illustrated in FIG. 4. In addition, in the example illustrated in FIG. 20, the second high concentration region 202 is not provided as compared with the example illustrated in FIG. 4. The other structures are the same as the example illustrated in FIG. 4.

At least a part of the first high concentration region 304 in this example is provided in the edge terminal structure portion 90, and is also provided in a range that does not reach the active portion 160. The first high concentration region 304 may be provided in only the edge terminal structure portion 90, or may also be provided from the edge terminal structure portion 90 to a position below the well region 11. In the example of FIG. 20, the first high concentration region 304 provided from the end portion of the semiconductor substrate 10 in the X axis direction to the position below the well region 11. The first high concentration region 304 may also reach the upper surface 21.

It is noted that a first high concentration region **304*b* may be provided so as to include at least the active portion 160 or include only the active portion 160. The first high concentration region 304*b* may include the first high concentration region 304 in a plan view (the upper surface 21 or the lower surface 23) or in the depth direction of the semiconductor substrate 10. An upper end of the first high concentration region 304*b* may be located in a region between the lower end of each of the trench portions and the lower surface 23, may reach a position between each of the trench portions and the upper surface 21, or may reach the upper surface 21. A doping concentration of the first high concentration region 304*b* may be lower than the doping concentration of the first high concentration region 304**.

In this example, since the first high concentration region 304 is not provided in the active portion 160, it is possible to avoid a property fluctuation of the active portion 160 caused by the provision of the first high concentration region 304. Since the first high concentration region 304 is provided in the edge terminal structure portion 90, the spread of the depletion layer in the edge terminal structure portion 90 can be suppressed, and the area on the XY plane of the edge terminal structure portion 90 can be reduced.

Figure 21:
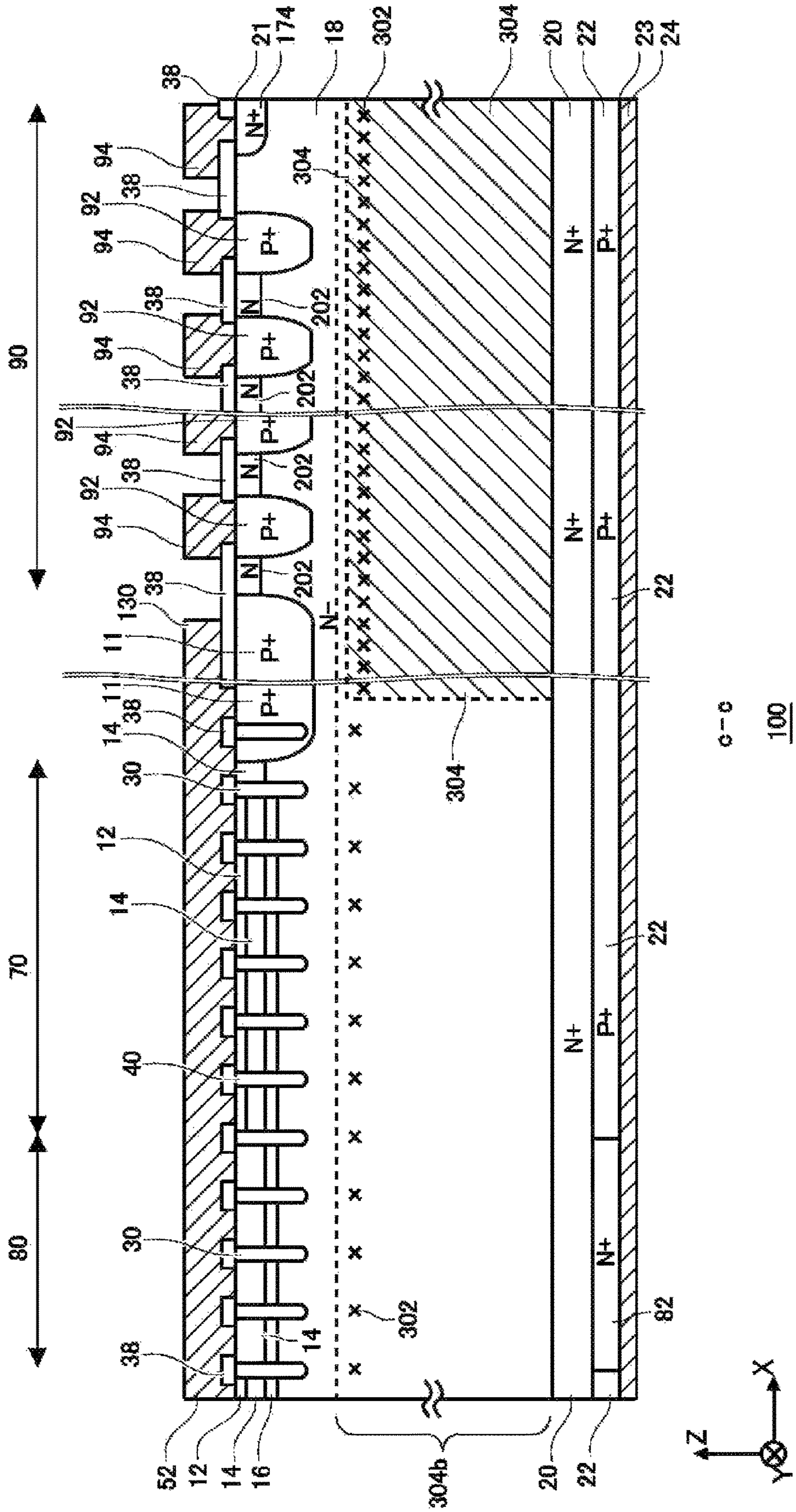
FIG. 21 is a drawing illustrating another example of the cross section taken along c-c in FIG. 1.

FIG. 21 is a drawing illustrating another example of the cross section taken along c-c in FIG. 1. The semiconductor device 100 in this example differs from the example described with reference to FIG. 20 in that the second high concentration region 202 is provided. The other structures are the same as the semiconductor device 100 according to any of the modes described with reference to FIG. 20. In this example too, while the property fluctuation of the active portion 160 is avoided, the spread of the depletion layer in the edge terminal structure portion 90 can be suppressed. The first high concentration region 304 may also reach the upper surface 21. In this example too, similarly as in the example of FIG. 20, the first high concentration region **304*b*** may be provided.

Figure 22:
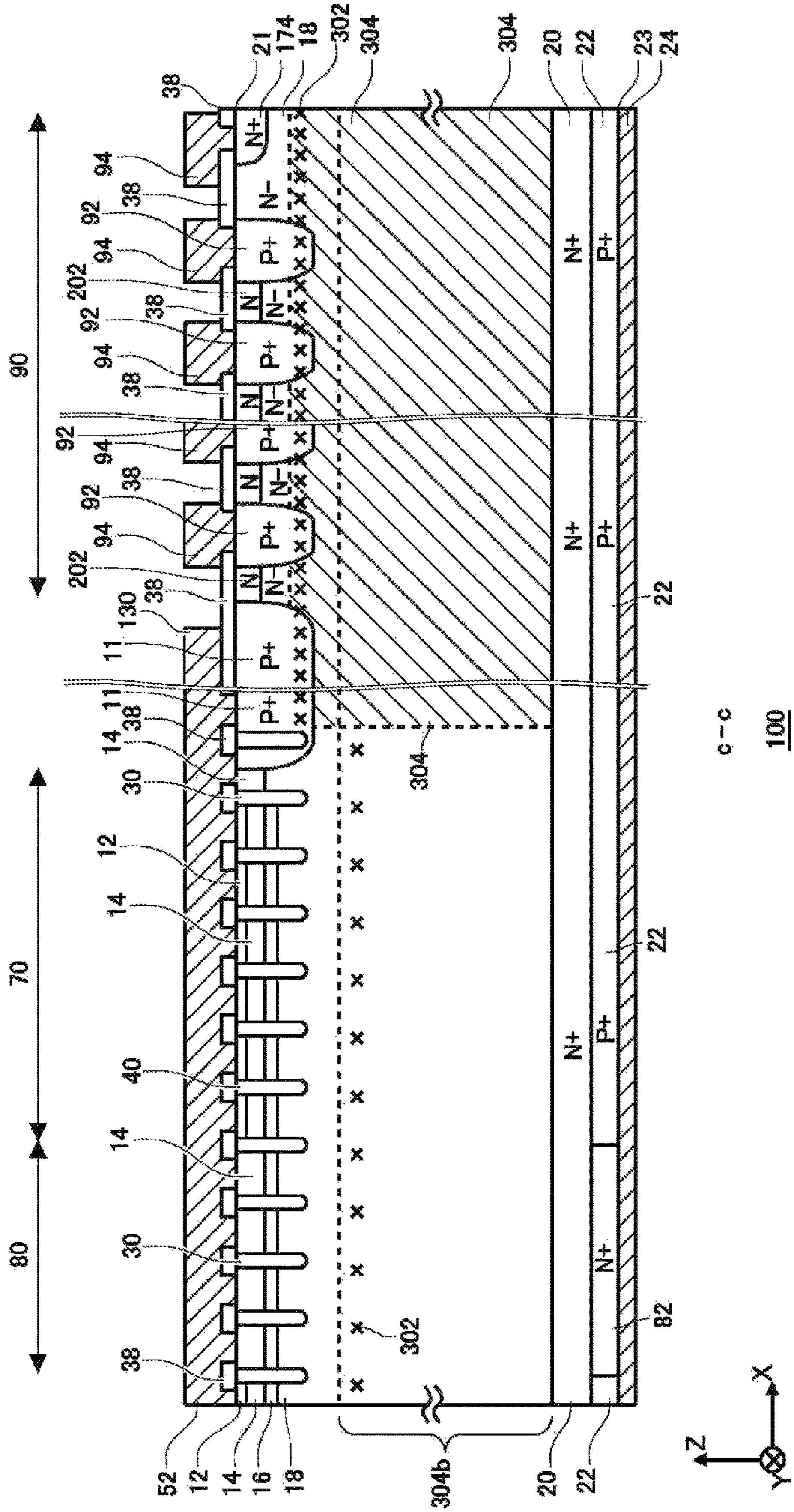
FIG. 22 is a drawing illustrating another example of the cross section taken along c-c in FIG. 1.

FIG. 22 is a drawing illustrating another example of the cross section taken along c-c in FIG. 1. The semiconductor device 100 in this example differs from the example described with reference to FIG. 20 or FIG. 21 in the upper end position of the first high concentration region 304 in the Z axis direction and the position of the hydrogen peak portion 302 in the Z axis direction. The other structures are the same as any of the examples described with reference to FIG. 20 or FIG. 21. In the example illustrated in FIG. 22, similarly as in the example of FIG. 21, the second high concentration region 202 is provided. In addition, the upper end position of the first high concentration region 304 in the Z axis direction and the position of the hydrogen peak portion 302 in the Z axis direction are the same as the example described with reference to FIG. 8. The first high concentration region 304 may also reach the upper surface 21. In this example too, similarly as in the example of FIG. 20, the first high concentration region **304*b* may be provided. In this example too, while the property fluctuation of the active portion 160 is avoided, the spread of the depletion layer in the edge terminal structure portion 90** can be suppressed.

Figure 23:
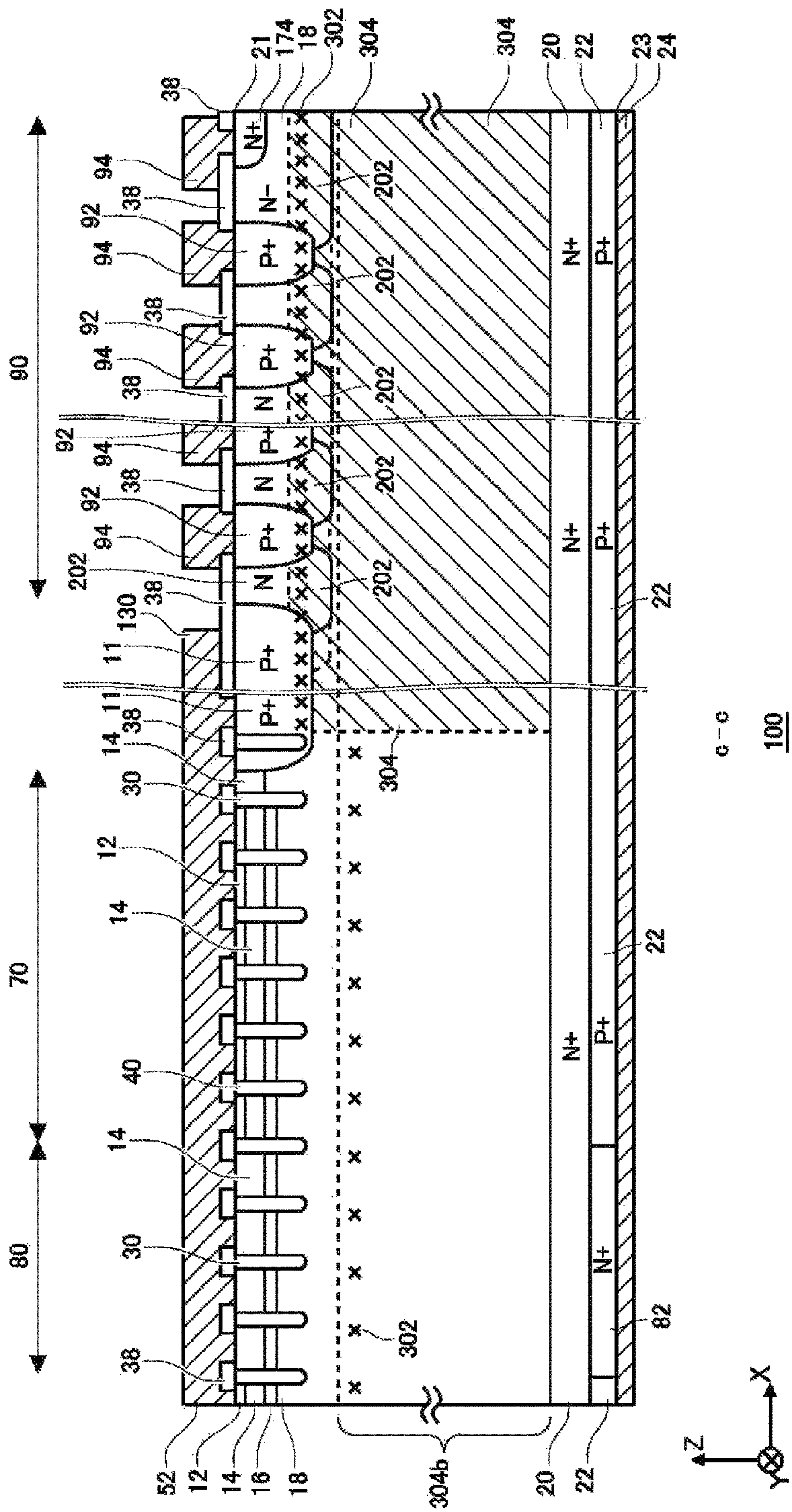
FIG. 23 is a drawing illustrating another example of the cross section taken along c-c in FIG. 1.

FIG. 23 is a drawing illustrating another example of the cross section taken along c-c in FIG. 1. The semiconductor device 100 in this example differs from the example illustrated in FIG. 22 in the structure of the second high concentration region 202. The other structures are the same as the example illustrated in FIG. 22. The second high concentration region 202 in this example has the same structure as the example illustrated in FIG. 9. The first high concentration region 304 may also reach the upper surface 21. In this example too, similarly as in the example of FIG. 20, the first high concentration region **304*b* may be provided. In this example too, while the property fluctuation of the active portion 160 is avoided, the spread of the depletion layer in the edge terminal structure portion 90** can be suppressed.

Figure 24A:
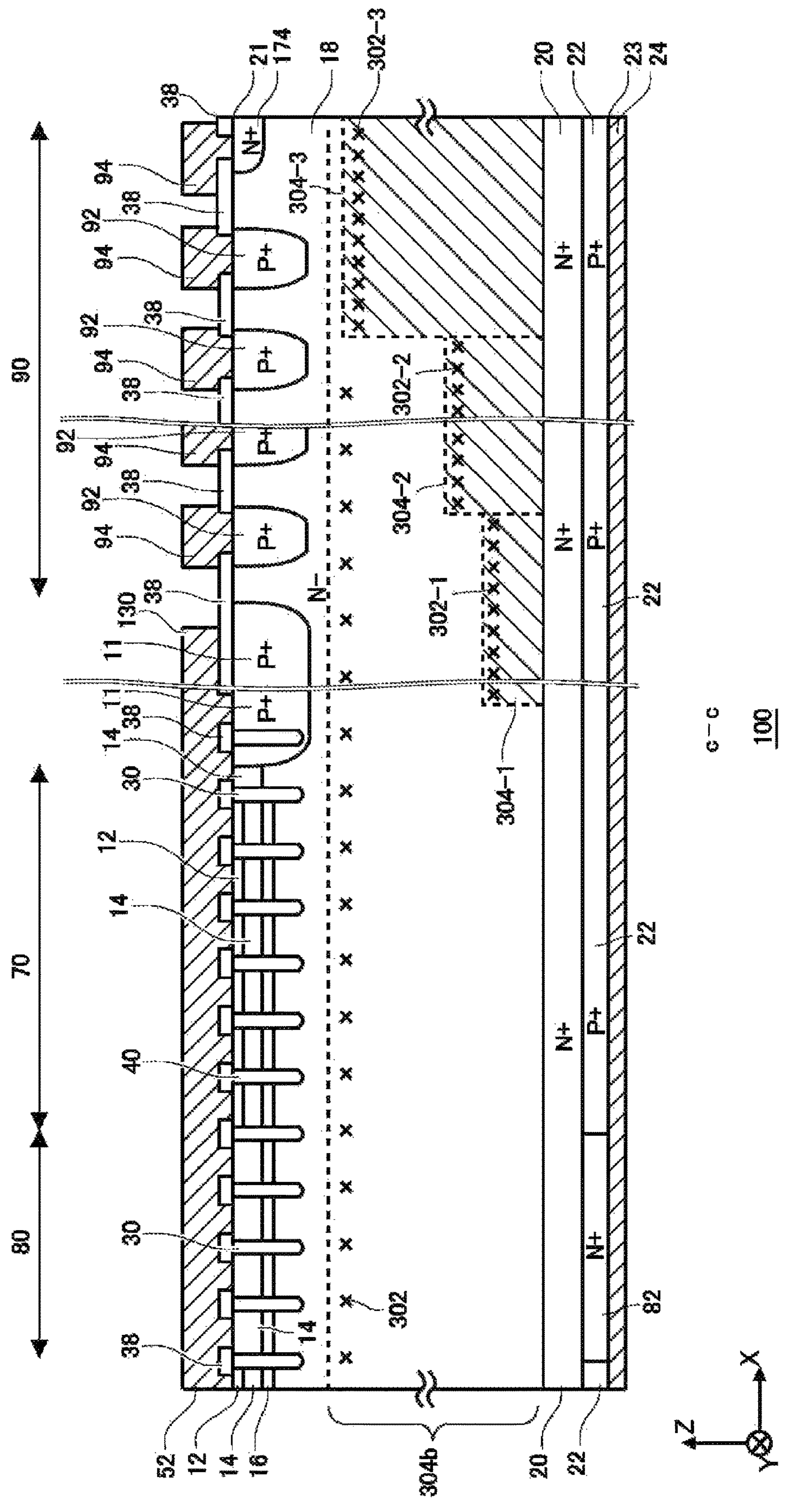
FIG. 24A is a drawing illustrating another example of the cross section taken along c-c in FIG. 1.

FIG. 24A is a drawing illustrating another example of the cross section taken along c-c in FIG. 1. The semiconductor device 100 in this example differs from the semiconductor device 100 described with reference to FIG. 20 to FIG. 23 in that the first high concentration region 304 has a plurality of regions having different lengths in the Z axis direction. In addition, the position of the hydrogen peak portion 302 in the Z axis direction also varies in each region of the first high concentration region 304. The other structures are the same as any of the examples described with reference to FIG. 20 to FIG. 23.

The first high concentration region 304 has an inner part, and an outer part provided on an outer side relative to the inner part. The outer side refers to a side farther from the active portion 160 on the XY plane. The outer part has a longer length in the Z axis direction than the inner part. In the example of FIG. 24A, the first high concentration region 304 includes a first high concentration region 304-1, a first high concentration region 304-2, and a first high concentration region 304-3. The first high concentration region 304-2 is arranged on the outer side relative to the first high concentration region 304-1, and also provided to be longer than the first high concentration region 304-1 in the Z axis direction. The first high concentration region 304-3 is arranged on the outer side relative to the first high concentration region 304-2, and also provided to be longer than the first high concentration region 304-2 in the Z axis direction. In other words, when the first high concentration region 304-1 is set as the inner part, the first high concentration region 304-2 and the first high concentration region 304-3 are the outer parts. In addition, when the first high concentration region 304-2 is set as the inner part, the first high concentration region 304-3 is the outer part. In this example, lengths of the respective regions of the first high concentration region 304 in the Z axis direction are changed stepwise.

The upper end of each of the first high concentration regions 304 may be arranged in the drift region 19. In another example, an upper end of the first high concentration region 304-3 may also be arranged in a position overlapped with the guard ring 92 or the well region 11.

A hydrogen peak portion 302-2 included in the first high concentration region 304-2 is provided in a position higher than a hydrogen peak portion 302-1 included in the first high concentration region 304-1 in the Z axis direction. A hydrogen peak portion 302-3 included in the first high concentration region 304-3 is provided in a position higher than the hydrogen peak portion 302-2 included in the first high concentration region 304-2 in the Z axis direction. The first high concentration region 304-3 may also reach the upper surface 21. In this example too, similarly as in the example of FIG. 20, the first high concentration region 304*b* may be provided.

According to the semiconductor device 100 in this example, since the first high concentration region 304 in the vicinity of the active portion 160 is short in the Z axis direction, it is possible to suppress the influence imparted by the first high concentration region 304 on a feature of the active portion 160. In addition, since the first high concentration region 304 away from the active portion 160 is long in the Z axis direction, the spread of the depletion layer in the edge terminal structure portion 90 can be suppressed.

Figure 24B:
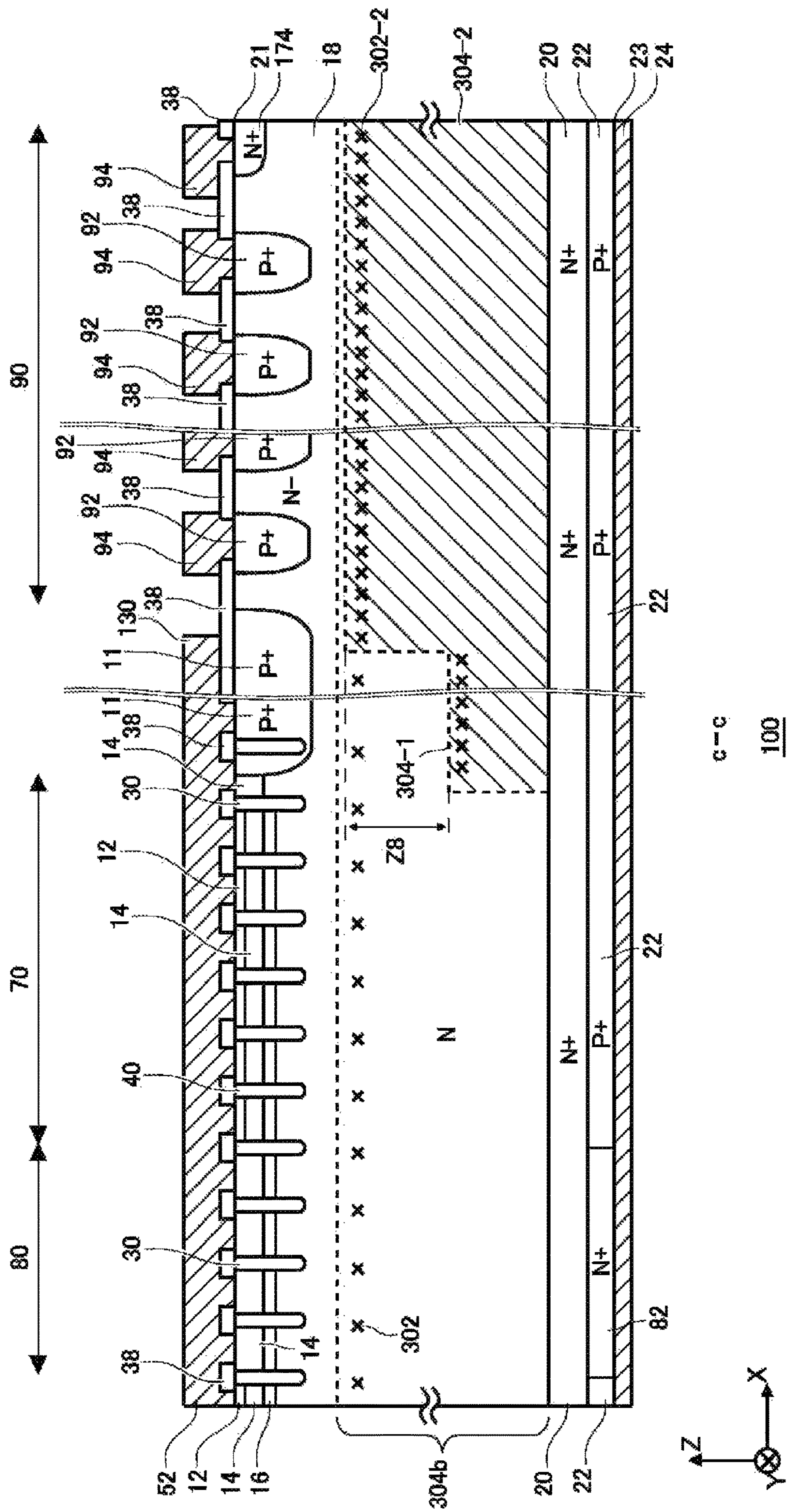
FIG. 24B is a drawing illustrating another example of the cross section taken along c-c in FIG. 1.

FIG. 24B is a drawing illustrating another example of the cross section taken along c-c in FIG. 1. In the semiconductor device 100 in this example too, similarly as in the example of FIG. 24A, the first high concentration region 304 has a plurality of regions in which the length in the Z axis direction varies. The other structure is the same as any of the examples described with reference to FIG. 20 to FIG. 23.

In this example, the height of the step of the first high concentration region 304 below the well region 11 (in this example, Z8) is larger than the height of the step of the first high concentration region 304 in the edge terminal structure portion 90 (in this example, 0 μm). The upper end position of the first high concentration region 304 in the edge terminal structure portion 90 may be constant. In a case where a plurality of steps of the first high concentration region 304 exist in any of the regions, the smallest step of the first high concentration region 304 below the well region 11 may be larger than the largest step of the first high concentration region 304 of the edge terminal structure portion 90.

In addition, in a case where the upper end position of the first high concentration region 304 changes continuously instead of stepwise, an inclination of the upper end position of the first high concentration region 304 below the well region 11 is larger than an inclination of the upper end position of the first high concentration region 304 in the edge terminal structure portion 90. In a case where the inclination of the upper end position of the first high concentration region 304 changes in any of the regions, the minimum value of the inclination of the upper end position of the first high concentration region 304 below the well region 11 may be higher than the maximum value of the inclination of the inclination of the upper end position of the first high concentration region 304 in the edge terminal structure portion 90. It is noted that the inclination of the upper end position refers, for example, to a change amount of the position of the upper end of the first high concentration region 304 in the Z axis direction relative to a unit length in the X axis direction. In accordance with this example, the length of the first high concentration region 304 in the Z axis direction below the well region 11 and in the active portion 160 can be decreased, and the length of the first high concentration region 304 in the edge terminal structure portion 90 in the Z axis direction can be increased. For this reason, it is possible to suppress the occurrence of avalanche breakdown on the upper surface side of the semiconductor substrate 10 in the well region 11 and the active portion 160. The first high concentration region 304-2 may also reach the upper surface 21. In this example too, similarly as in the example of FIG. 20, the first high concentration region 304*b* may be provided.

Figure 25A:
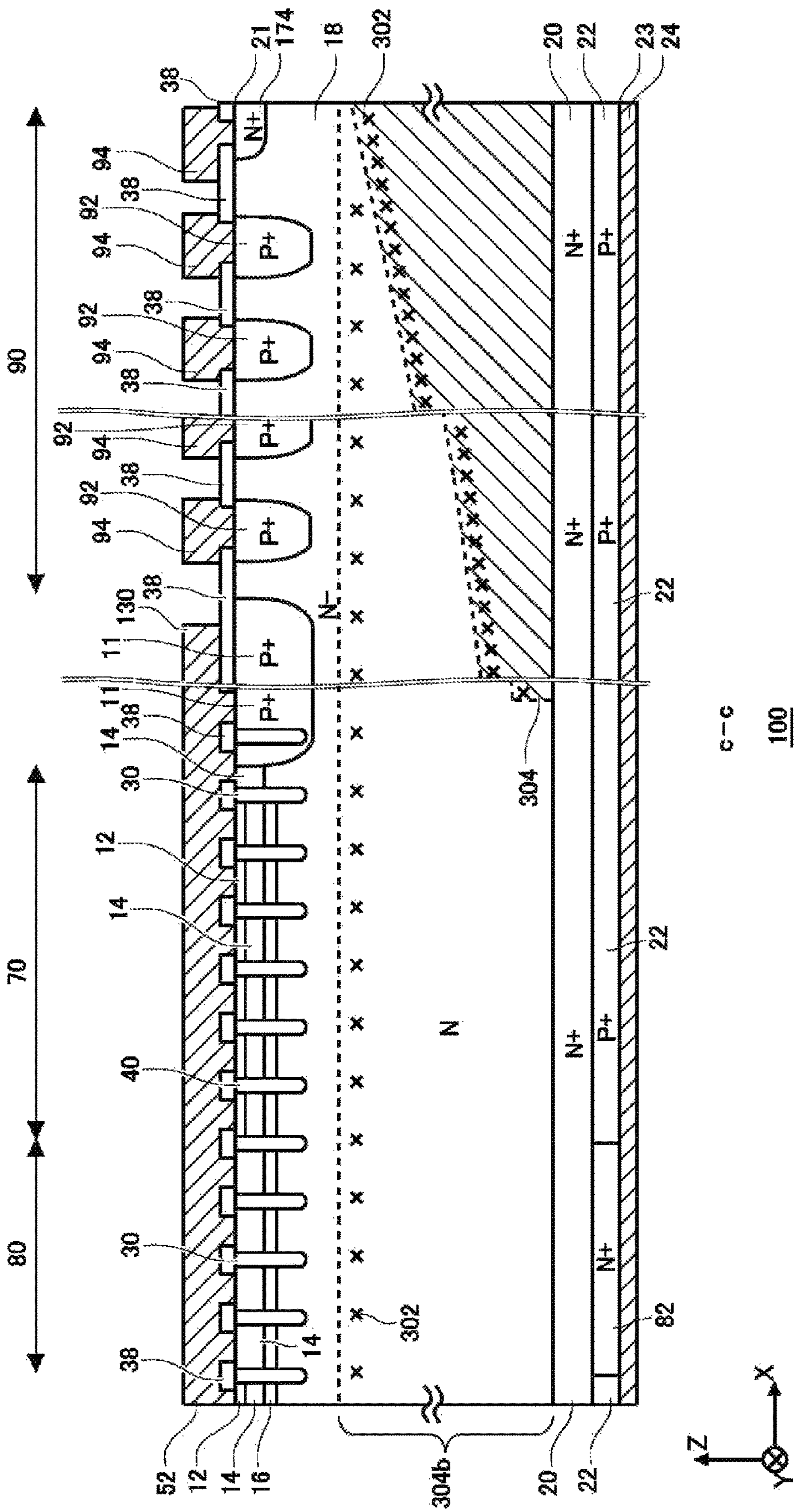
FIG. 25A is a drawing illustrating another example of the cross section taken along c-c in FIG. 1.

FIG. 25A is a drawing illustrating another example of the cross section taken along c-c in FIG. 1. The semiconductor device 100 in this example differs from the semiconductor device 100 described with reference to FIG. 20 to FIG. 23 in that the first high concentration region 304 has a plurality of regions having different lengths in the Z axis direction. In addition, the position of the hydrogen peak portion 302 in the Z axis direction also varies in each region of the first high concentration region 304. The other structures are the same as any of the examples described with reference to FIG. 20 to FIG. 23.

The first high concentration region 304 in this example differs from the first high concentration region 304 of FIG. 24A in that the length in the Z axis direction is gradually increased as the region is farther away from the active portion 160. The other structures may be the same as the example in FIG. 24A. The hydrogen peak portion 302 in this example is arranged on an upper side as the position is farther away from the active portion 160. In this example too, the whole of the upper end of the first high concentration region 304 may be arranged in the drift region 19. In another example, a part of the upper end of the first high concentration region 304 may also be arranged in a position overlapped with the guard ring 92 or the well region 11. In this example too, similarly as in the example of FIG. 20, the first high concentration region 304*b* may be provided. In this example too, it is possible to suppress the influence imparted by the first high concentration region 304 on the feature of the active portion 160. In addition, the spread of the depletion layer in the edge terminal structure portion 90 can be suppressed.

Figure 25B:
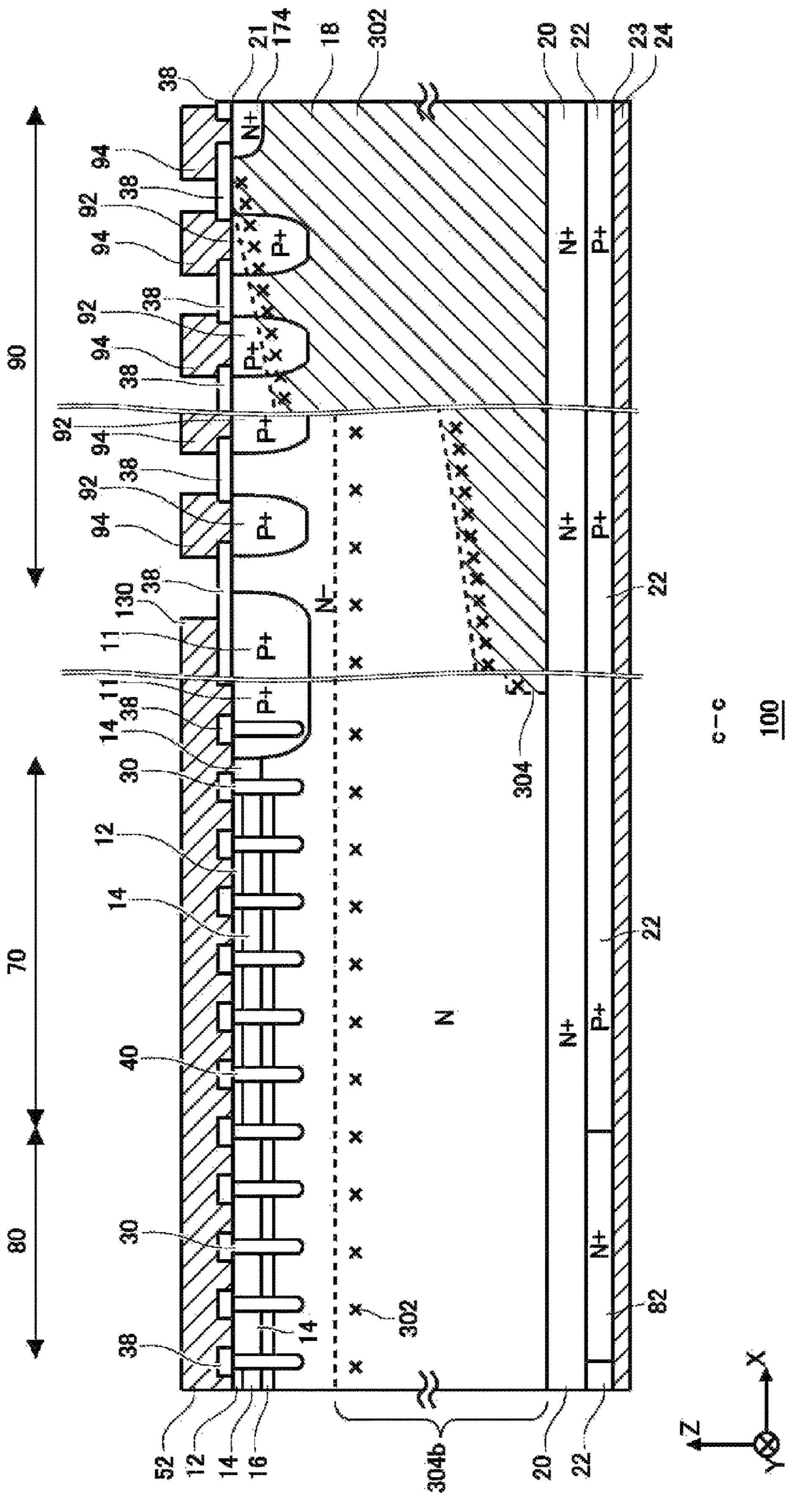
FIG. 25B is a drawing illustrating another example of the cross section taken along c-c in FIG. 1.

FIG. 25B is a drawing illustrating another example of the cross section taken along c-c in FIG. 1. The semiconductor device 100 in this example is different from the example of FIG. 25A in that the first high concentration region 304 reaches the upper surface 21 in a region from an outer peripheral end of the semiconductor device 100 to an inner periphery side by a predetermined distance in a plan view. The other structure is similar to the example of FIG. 25A.

Figure 26:
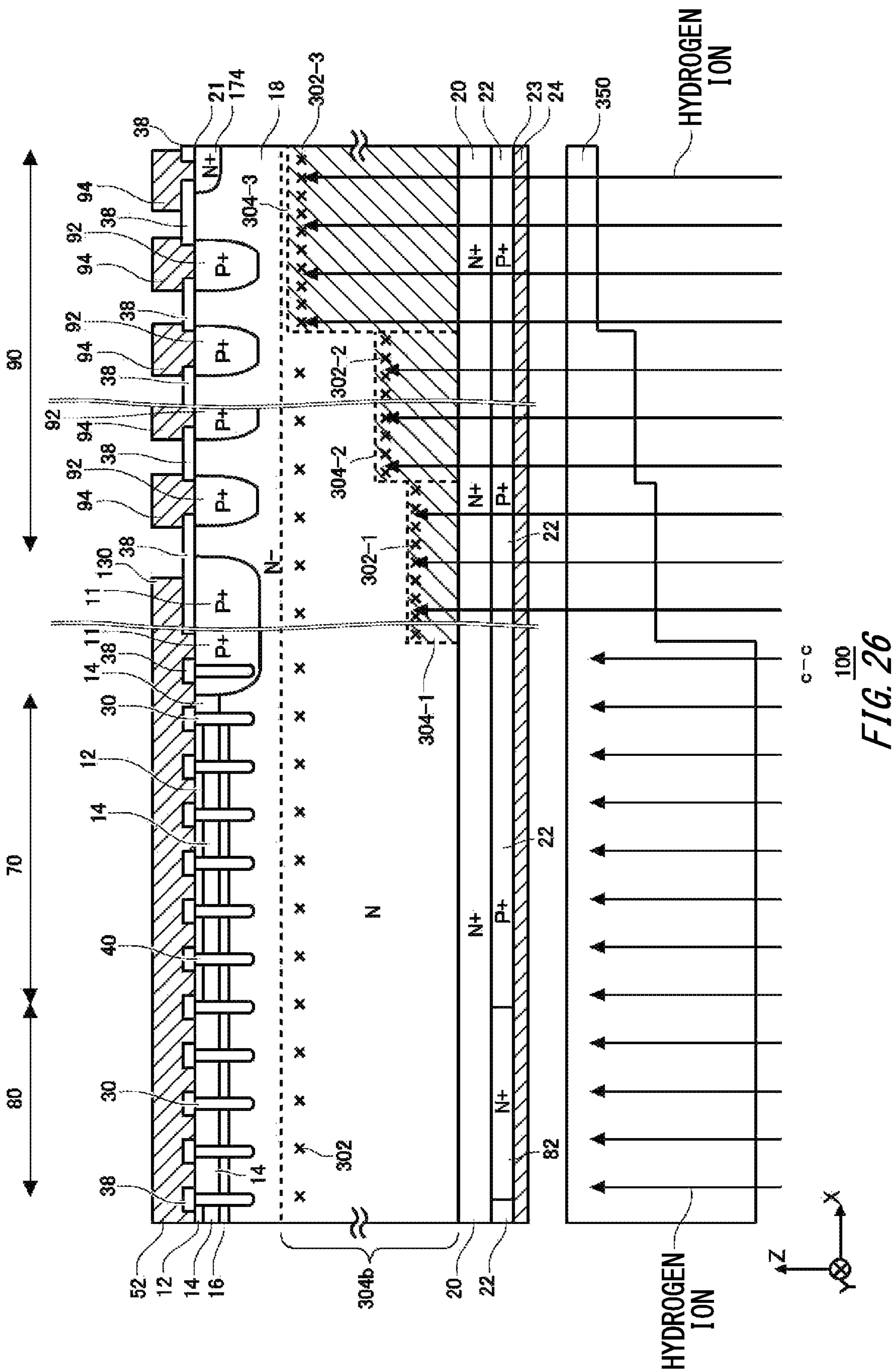
FIG. 26 is a drawing illustrating an example of a formation method of a first high concentration region 304 described with reference to FIG. 24A.

FIG. 26 is a drawing illustrating an example of the formation method of the first high concentration region 304 described with reference to FIG. 24A. In this example, in a state where a shielding member 350 is arranged below the lower surface 23 of the semiconductor substrate 10, hydrogen ion irradiation is performed from the lower surface 23 side. The shielding member 350 covers the whole of the active portion 160 and at least a part of the edge terminal structure portion 90. The shielding member 350 that covers the active portion 160 has a thickness to such an extent that hydrogen ions are completely shielded and are not allowed to reach the semiconductor substrate 10.

The shielding member 350 that covers a region where the first high concentration region 304 is to be provided has a thickness corresponding to a length of each of the first high concentration regions 304 in the Z axis direction. In other words, the shielding member 350 is thinner in a region where the first high concentration region 304 is formed to be longer. When the shielding member 350 is set to be thinner, hydrogen ions reach a deep position in the semiconductor substrate 10, and the first high concentration region 304 becomes longer.

As the shielding member 350 in this example is farther away from the active portion 160, the shielding member 350 becomes thinner stepwise. The shielding member 350 may be provided, or may also not be provided, below the first high concentration region 304-3. In FIG. 26, the collector electrode 24 is provided, but the lower surface 23 may be irradiated with hydrogen ions before the collector electrode 24 is formed. The hydrogen ion implantation to the first high concentration region 304*b* may also be performed before the first high concentration region 304, or may also be performed after the first high concentration region 304.

Figure 27:
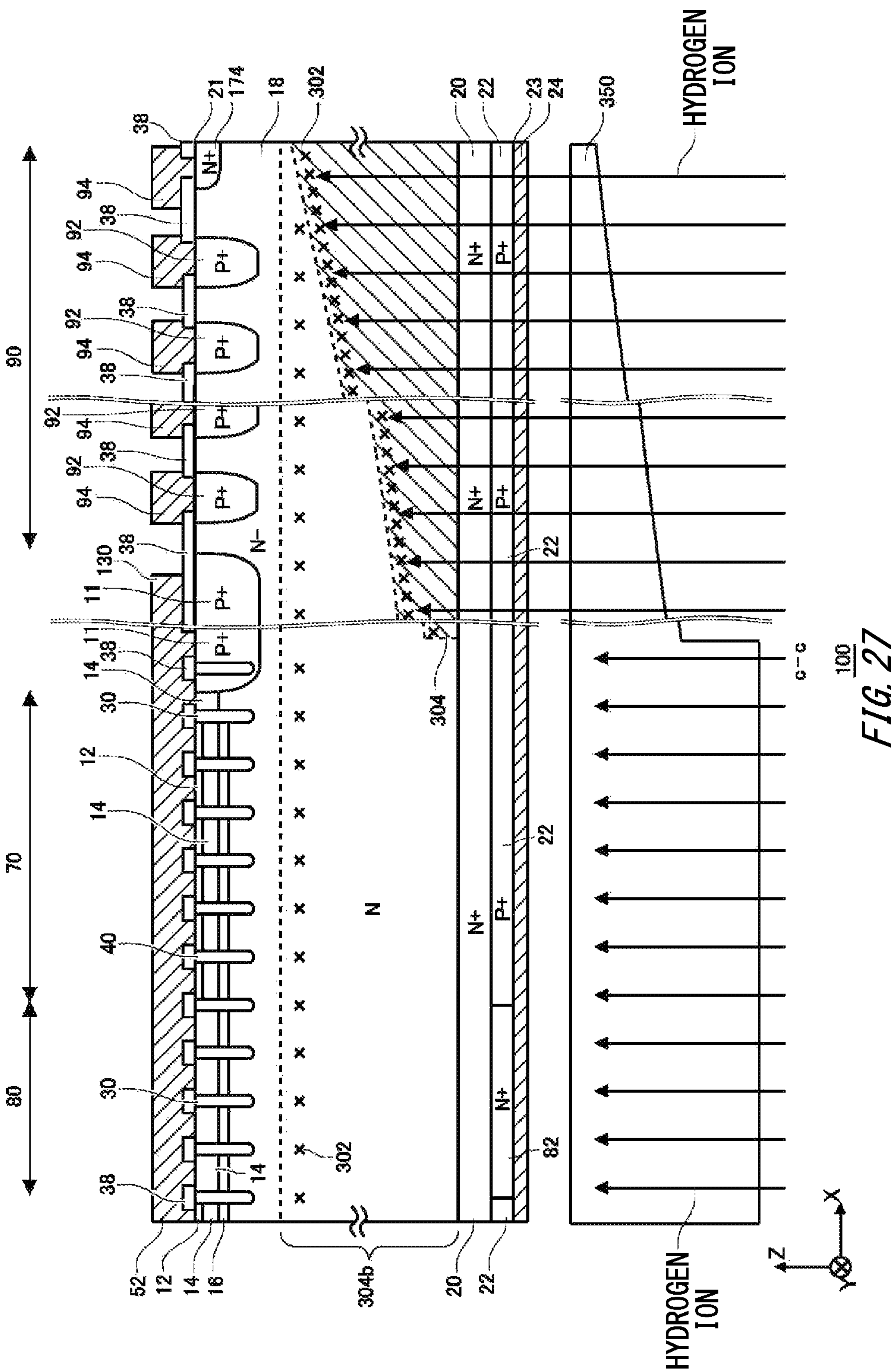
FIG. 27 is a drawing illustrating an example of the formation method of the first high concentration region 304 described with reference to FIG. 25A or FIG. 25B.

FIG. 27 is a drawing illustrating an example of the formation method of the first high concentration region 304 described with reference to FIG. 25A or FIG. 25B. In this example, a shape of the shielding member 350 is different from the example in FIG. 26. The other conditions are the same as the example in FIG. 26.

As the shielding member 350 in this example is farther away from the active portion 160, the shielding member 350 becomes thinner in a linear or curved manner. The shielding member 350 may be provided, or may also not be provided, below the first high concentration region 304-3. The hydrogen ion implantation to the first high concentration region 304*b* may also be performed before the first high concentration region 304, or may also be performed after the first high concentration region 304.

According to the modes illustrated in FIG. 20 to FIG. 27, a specific resistance (resistivity) of the first high concentration region 304 is lower than a specific resistance of the drift region 19 in the active portion 160 (the transistor portion 70 or the diode portion 80). The specific resistance of the first high concentration region 304 may be equal to or lower than 1/1.5 of the specific resistance of the drift region 19 of the active portion 160 and equal to or higher than 1/10 of the specific resistance of the drift region 19 of the active portion 160. The specific resistance of the first high concentration region 304 may also be equal to or lower than of ½ the specific resistance of the drift region 19 of the active portion 160. As the specific resistance of each region, a central value of each region in the Z axis direction may be used, or an average value may also be used.

According to the modes illustrated in FIG. 20 to FIG. 27, the specific resistance of the drift region 19 of the active portion 160 may have a value according to a rated voltage of the semiconductor device 100. In one example, in a case where the rated voltage is 600 V, the specific resistance may be 20 to 80 Ωcm, in a case where the rated voltage is 1200 V, the specific resistance may be 40 to 120 Ωcm, in a case where the rated voltage is 1700 V, the specific resistance may be 60 to 200 Ωcm, and in a case where the rated voltage is 3300 V, and the specific resistance may be 150 to 450 Ωcm.

According to the modes illustrated in FIG. 1 to FIG. 27, a second conductivity type bulk acceptor may be distributed to the whole of the semiconductor substrate 10. Similarly as in the bulk donor, the bulk acceptor is an acceptor uniformly introduced into an ingot at the time of the fabrication of the ingot. The bulk acceptor may be boron. A bulk acceptor concentration may be lower than the bulk donor concentration. In other words, the ingot is of the N type. In one example, the bulk acceptor concentration is $5\times10^{11}$ (/cm$^3$) to $8\times10^{14}$ (/cm$^3$), and the bulk donor concentration is $5\times10^{12}$ (/cm$^3$) to $1\times10^{15}$ (/cm$^3$). The bulk acceptor concentration may be equal to or more than 1% of the bulk donor concentration, may be equal to or more than 10% of the bulk donor concentration, and may also be equal to or more than 50% of the bulk donor concentration 50%. The bulk acceptor concentration may be equal to or less than 99% of the bulk donor concentration, may be equal to or less than 95% of the bulk donor concentration, and may be equal to or less than 90% of the bulk donor concentration.

Since the bulk acceptor is present in the entire semiconductor substrate 10, it is possible to reduce the net doping concentration in the semiconductor substrate 10 before hydrogen ions and the like are implanted. For this reason, an absolute value of the fluctuation of the net doping concentration of the semiconductor substrate 10 can be decreased. For this reason, the adjustment of the specific resistance based on the hydrogen ion implantation is facilitated.

Figure 28:
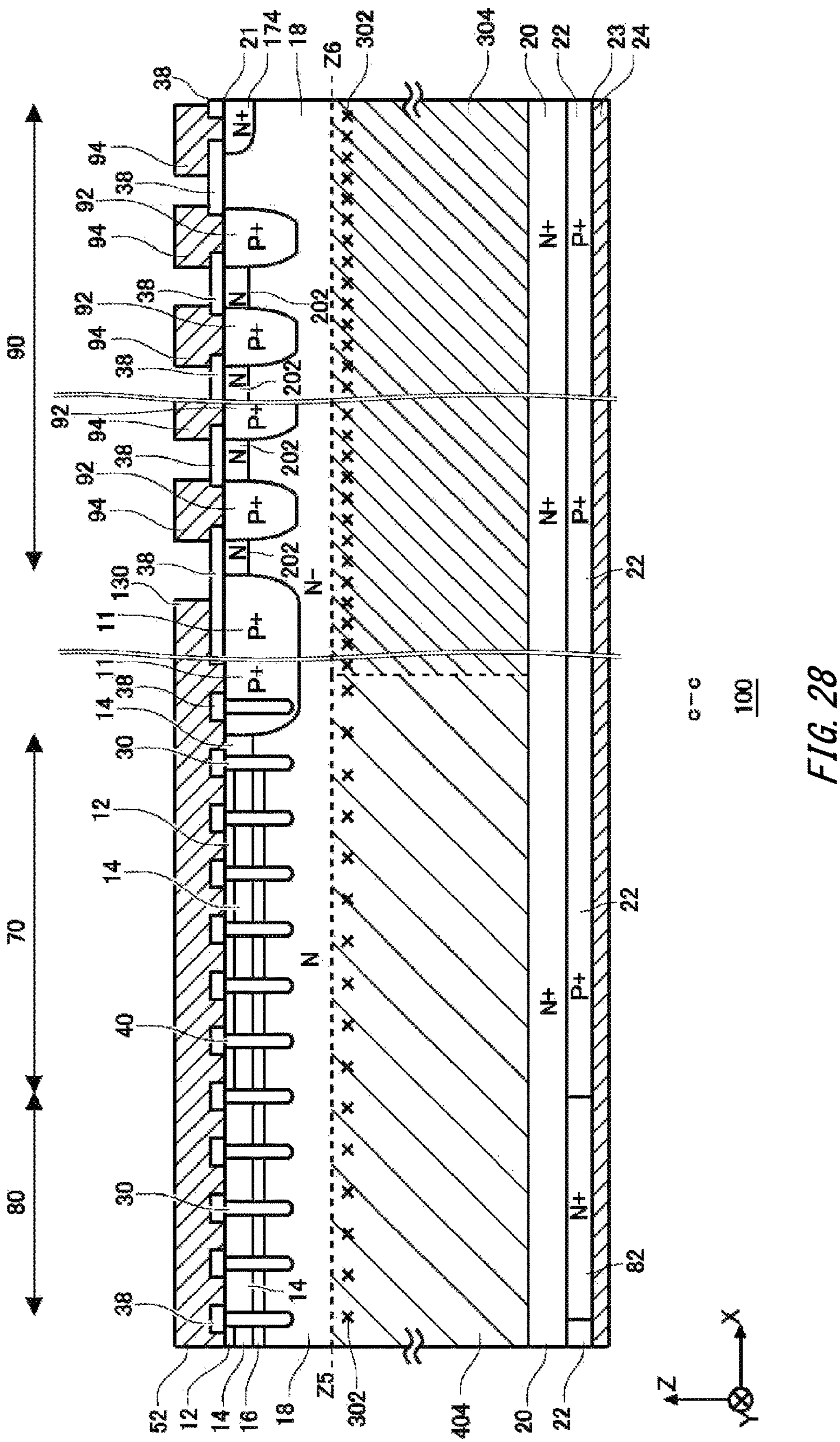
FIG. 28 is a drawing illustrating another example of the cross section taken along c-c in FIG. 1.

FIG. 28 is a drawing illustrating another example of the cross section taken along c-c in FIG. 1. In the semiconductor device 100 in this example, the active portion 160 has an N type fourth high concentration region 404. The structure other than the fourth high concentration region 404 is similar to the semiconductor device 100 according to any of the aspects described with reference to FIG. 1 to FIG. 27. The first high concentration region 304 may also reach the upper surface 21.

The fourth high concentration region 404 is provided from the upper surface 21 side to the lower surface 23 side of the semiconductor substrate 10, and the donor concentration is higher than the doping concentration of the bulk donor. The formation method for the fourth high concentration region 404 is similar to the first high concentration region 304. In other words, the hydrogen ions are implanted from the lower surface 23 of the semiconductor substrate 10 to a predetermined depth position on the upper surface 21 side of the semiconductor substrate 10. When the semiconductor substrate 10 is annealed after the hydrogen ions are implanted, the hydrogen donor is formed in the region through which the hydrogen ions have passed. Thus, the fourth high concentration region 404 is formed in which the donor concentration is higher than the bulk donor concentration.

It is noted that the donor concentration of the fourth high concentration region 404 is different from the donor concentration of the first high concentration region 304. For example, when the dose amount of the hydrogen ions to the active portion 160 is set to be different from the dose amount of the hydrogen ions to the edge terminal structure portion 90, the donor concentrations of these regions can be set to be different from each other. The hydrogen ion implantation to the active portion 160 and the edge terminal structure portion 90 may be performed in a separate process. In addition, after the hydrogen ions are implanted to the active portion 160 and the edge terminal structure portion 90 at the same dose amount in the same process, additional hydrogen ions may also be implanted to one of the active portion 160 and the edge terminal structure portion 90.

In the example of FIG. 28, the donor concentration of the fourth high concentration region 404 is lower than the donor concentration of the first high concentration region 304. When the donor concentration of the fourth high concentration region 404 is set to be lower than the donor concentration of the first high concentration region 304, it is possible to suppress the expansion of the electric field in the vertical direction (Z axis direction). In addition, when the donor concentration of the fourth high concentration region 404 is set to be higher than the bulk donor concentration, for example, it is possible to suppress voltage or current waveform vibration at the time of the switching of the semiconductor device 100. In addition, when the donor concentration of the first high concentration region 304 is set to be higher than the donor concentration of the fourth high concentration region 404, the expansion of the electric field in the lateral direction can be suppressed, and the width of the edge terminal structure portion 90 in the lateral direction (the X axis direction and the Y axis direction) can be decreased. The donor concentration of the fourth high concentration region 404 may be 0.9 times as high as the first high concentration region 304 or lower, may be 0.5 times as high as the first high concentration region 304 or lower, or may also be 0.1 times as high as the first high concentration region 304 or lower.

In the depth direction, the upper end position Z4 of the first high concentration region 304 and the upper end position Z5 of the fourth high concentration region 404 may be the same position, or may also be different from each other. The upper end position Z5 of the fourth high concentration region 404 may be arranged below the upper end position Z4 of the first high concentration region 304 (on the lower surface 23 side), or may also be arranged above the upper end position Z4 (on the upper surface 21 side). A boundary between the fourth high concentration region 404 and the first high concentration region 304 in the X axis direction may be arranged below the well region 11. In another example, the above-described boundary may be arranged in the active portion 160, or may also be arranged in the edge terminal structure portion 90.

Figure 29:
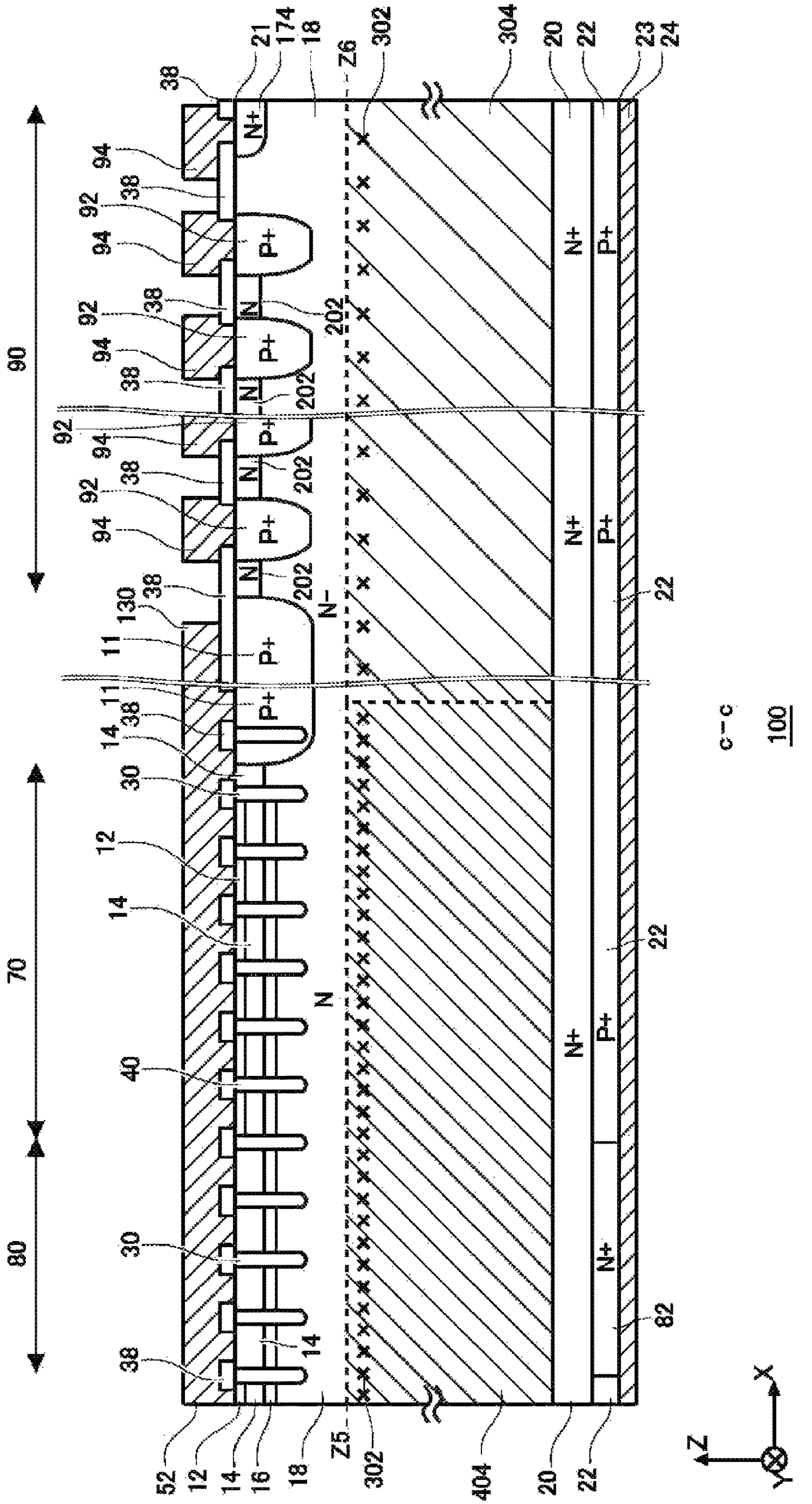
FIG. 29 is a drawing illustrating another example of the cross section taken along c-c in FIG. 1.

FIG. 29 is a drawing illustrating another example of the cross section taken along c-c in FIG. 1. In the semiconductor device 100 in this example, the donor concentration of the fourth high concentration region 404 is higher than the donor concentration of the first high concentration region 304. The other structure is similar to the semiconductor device 100 described with reference to FIG. 28. The first high concentration region 304 may also reach the upper surface 21.

In accordance with this example, since the donor concentration of the first high concentration region 304 is low in the edge terminal structure portion 90, it is possible to suppress the occurrence of avalanche breakdown in the vicinity of the guard ring. The donor concentration of the fourth high concentration region 404 may be 1.1 times as high as the first high concentration region 304 or higher, may be twice as high as the first high concentration region 304 or higher, may also be 10 times as high as the first high concentration region 304 or higher.

Figure 30:
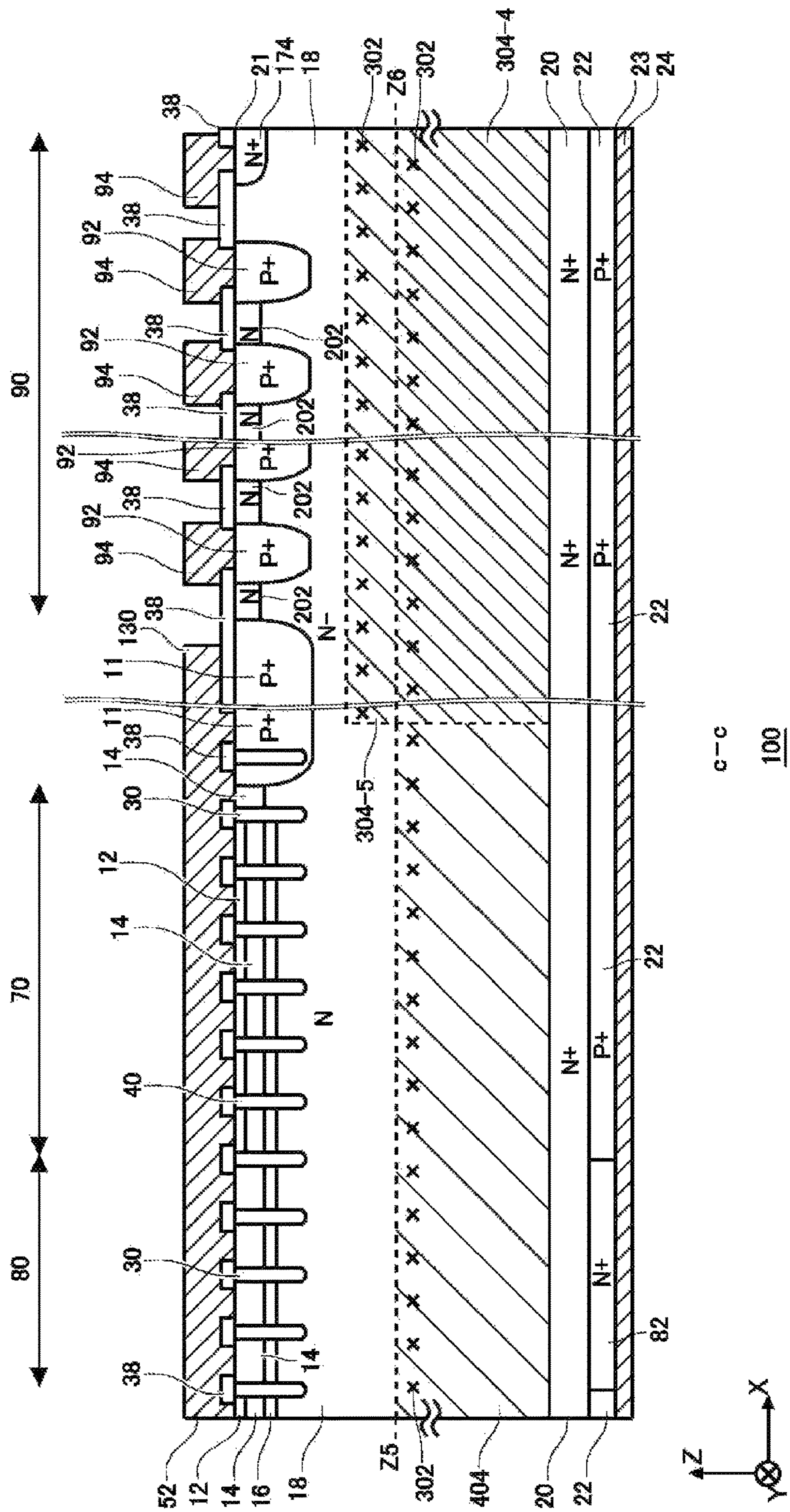
FIG. 30 is a drawing illustrating another example of the cross section taken along c-c in FIG. 1.

FIG. 30 is a drawing illustrating another example of the cross section taken along c-c in FIG. 1. The semiconductor device 100 in this example has a first high concentration region 304-4 and a first high concentration region 304-5 that have different donor concentrations. The other structure is similar to the semiconductor device 100 described with reference to FIG. 28 or FIG. 29. The first high concentration region 304-5 may also reach the upper surface 21.

The first high concentration region 304-4 is the same as the first high concentration region 304 described with reference to FIG. 28 or FIG. 29. The first high concentration region 304-5 is arranged between the first high concentration region 304-4 and the upper surface 21. The first high concentration region 304-5 may be in contact with the first high concentration region 304-4. The upper end position of the first high concentration region 304-5 may be the same as any of the first high concentration regions 304 described with reference to FIG. 1 to FIG. 27. The upper end position of the first high concentration region 304-5 may be arranged above the upper end position Z5 of the fourth high concentration region 404.

The donor concentration of the first high concentration region 304-5 is lower than the donor concentration of the first high concentration region 304-4. The donor concentration of the first high concentration region 304-5 may be higher than the donor concentration of the fourth high concentration region 404, may be the same as the donor concentration of the fourth high concentration region 404, or may also be lower than the donor concentration of the fourth high concentration region 404. For example, when a first process to implant the hydrogen ions to the active portion 160 and the edge terminal structure portion 90 from the lower surface 23 at the same dose amount in the same depth position (Z5, and Z6), and a second process to implant the hydrogen ions selectively to the edge terminal structure portion 90 from the lower surface 23 up to a position closer to the upper surface 21 than the depth position Z6 are performed, it is possible to form the structure in this example. In the first process, at least one of the implantation depths and the dose amounts of the hydrogen ions to the active portion 160 and the edge terminal structure portion 90 may be set to be different from each other.

Figure 31:
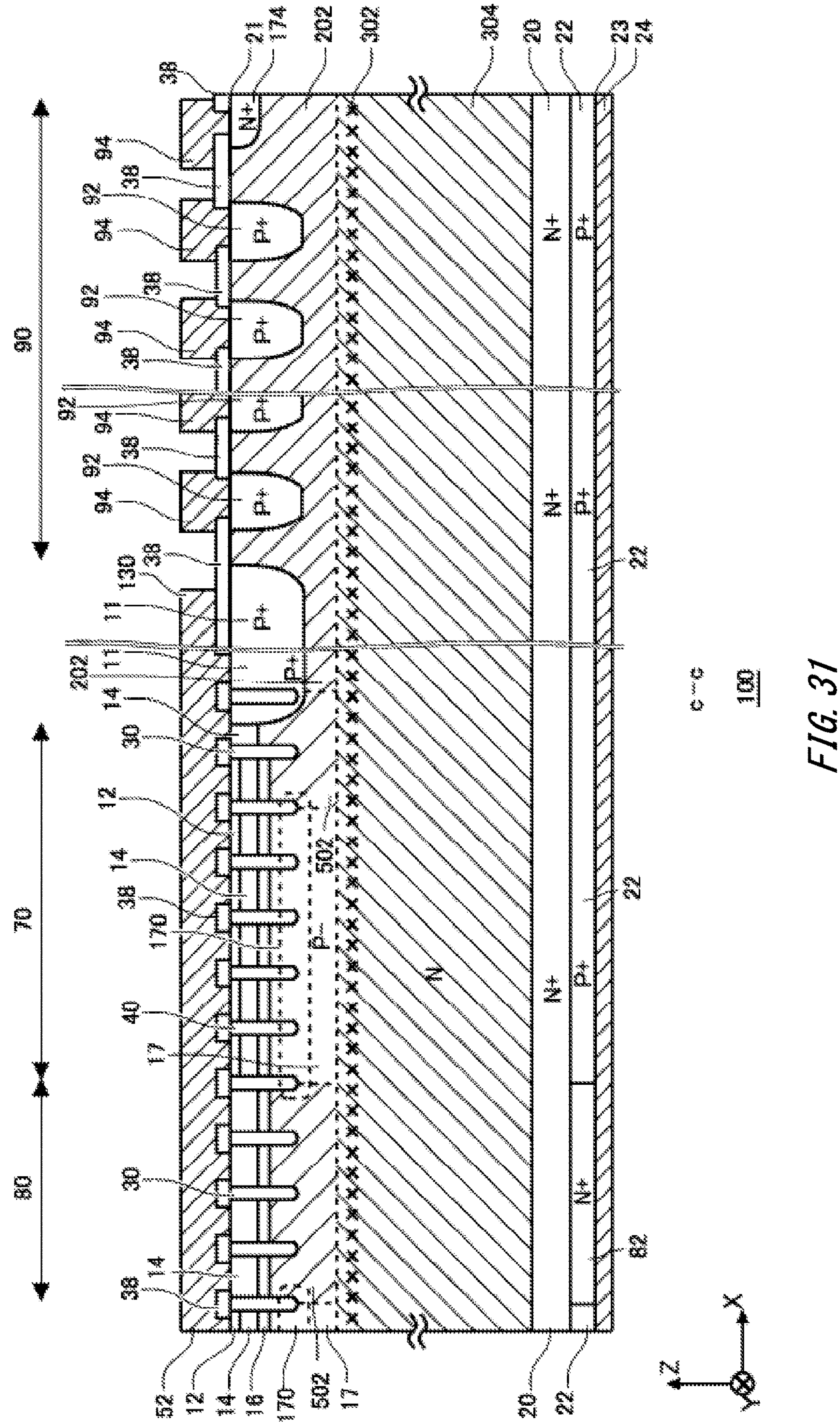
FIG. 31 is a drawing illustrating another example of the cross section taken along c-c in FIG. 1.

FIG. 31 is a drawing illustrating another example of the cross section taken along c-c in FIG. 1. In the semiconductor device 100 in this example, the first high concentration region 304 is also provided in the active portion 160. In addition, in the active portion 160, a P type low concentration region 17 in which the doping concentration is lower than the base region 14 is provided between the base region 14 and the first high concentration region 304. The other structure is similar to the semiconductor device 100 according to any of the aspects described with reference to FIG. 1 to FIG. 30. The low concentration region 17 in this example is arranged between the accumulation region 16 and the first high concentration region 304 in a region of a part of the active portion 160 such as the transistor portion 70, and functions as a part of the drift region 19.

The semiconductor substrate 10 in this example is a substrate obtained by implanting the hydrogen ions to the semiconductor substrate that is entirely the P type to form the first high concentration region 304 and the like, such that the half or more of the region is inverted into the N type. The doping concentration in the low concentration region 17 may be the same as the bulk acceptor concentration. The hydrogen donor concentration in the first high concentration region 304 is higher than the bulk acceptor concentration. A fifth high concentration region 502 may be formed to be continuous to the first high concentration region 304 by implanting the hydrogen ions, phosphorus, or the like from the upper surface 21 of the semiconductor substrate 10 in a region of a part of the active portion 160. The fifth high concentration region 502 may also be formed in various manners depending on the design.

In addition, in a region other than the active portion 160, the second high concentration region 202 may be provided between the first high concentration region 304 and the upper surface 21 of the semiconductor substrate 10. The first high concentration region 304 and the second high concentration region 202 may be continuously provided in the edge terminal structure portion 90. The second high concentration region 202 may be continuously provided from the upper end of the first high concentration region 304 to the upper surface 21 of the semiconductor substrate 10. As described with reference to FIG. 4 or the like, the second high concentration region 202 can be formed by implanting the hydrogen ions, phosphorus, or the like from the upper surface 21 of the semiconductor substrate 10. In a case where the second high concentration region 202 is formed by implanting the hydrogen ions, the hydrogen donor concentration in the second high concentration region 202 is higher than the bulk acceptor concentration. The second high concentration region 202 may also be provided below the well region 11. It is noted that the second high concentration region 202 and the fifth high concentration region 502 may also be formed at the same time, or may also be separately formed. The second high concentration region 202 and the fifth high concentration region 502 may also be formed to be overlapped with the first high concentration region 304. The second high concentration region 202 and the first high concentration region 304 do not necessarily need to be substantially uniform, and may also be formed such that concentrations and boundary positions are locally different from each other. The fifth high concentration region 502 may be included in the outer periphery side (+x axis direction) of the transistor portion 70 between the low concentration region 17 and the well region 11. In other words, the low concentration region 17 of the transistor portion 70 may be separated from the well region 11 with the fifth high concentration region 502 interposed therebetween. The low concentration region 17, which is P type, is made electrically floating when it is separated from and is not in contact with the well region 11. In addition, the bottom portion high concentration region 170 of P type, which has a higher concentration than the low concentration region 17, may be included such that it is in contact with the bottom portion of one or more trench portions. The bottom portion high concentration region 170 may be continuously provided across a plurality of trench portions. The bottom portion high concentration region 170 may be separated from the well region 11 and may be electrically floating. The upper surface 21 side of the bottom portion high concentration region 170 may or may not be in contact with the accumulation region 16. The lower surface 23 side of the bottom portion high concentration region 170 may be in contact with the low concentration region 17. The end portion of the bottom portion high concentration region 170 in the x axis direction may be located inside of the fifth high concentration region 502, may be in contact with the fifth high concentration region 502, or may be separated from the fifth high concentration region 502. In this example, the end portion of the bottom portion high concentration region 170 in the x axis direction is located inside the fifth high concentration region 502.

Figure 32:
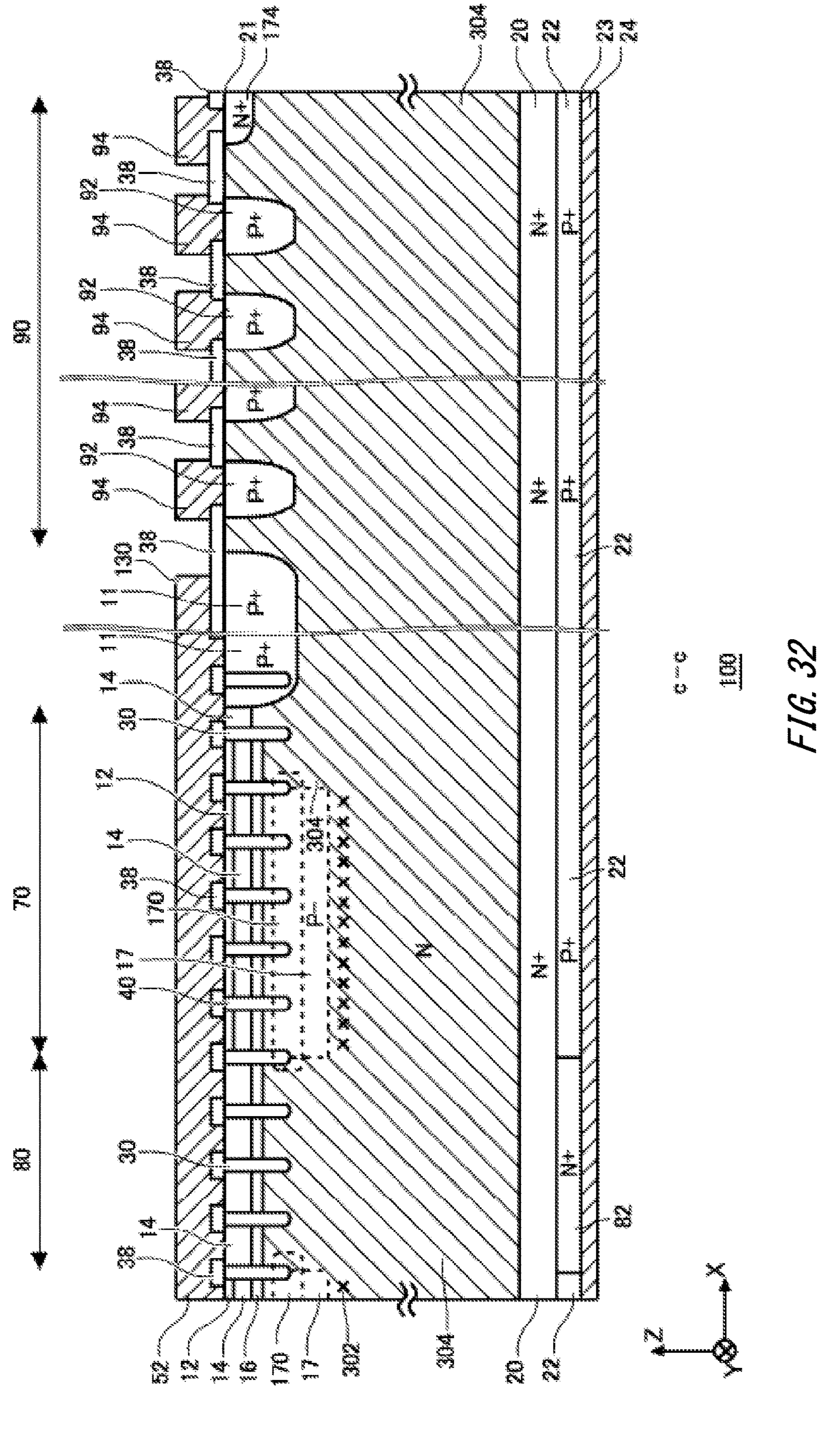
FIG. 32 is a drawing illustrating another example of the cross section taken along c-c in FIG. 1.

FIG. 32 is a drawing illustrating another example of the cross section taken along c-c in FIG. 1. In the semiconductor device 100 in this example, the first high concentration region 304 is provided up to a position above the lower end of the guard ring in the edge terminal structure portion 90 or the like. The other structure is similar to the semiconductor device 100 described with reference to FIG. 31. In this example, the first high concentration region 304 is provided up to the upper surface 21 of the semiconductor substrate 10.

In this example, the hydrogen ions may be implanted to the active portion 160 and the edge terminal structure portion 90 in the same step via shielding members having different thicknesses, or the hydrogen ions may be implanted in different steps. The acceleration energy of the hydrogen ions may be set for the edge terminal structure portion 90 and a region of a part of the active portion 160 such that the hydrogen ions penetrate through the semiconductor substrate 10. In addition, the first high concentration region 304 does not necessarily need to be substantially uniform, and may also be formed such that the concentrations and the boundary positions are locally different from each other. In this example, the description has been provided while an example where the second high concentration region 202 is not provided, but the second high concentration region 202 may also be provided. The first high concentration region 304 may be included in the outer periphery side (+x axis direction) of the transistor portion 70 between the low concentration region 17 and the well region 11. In other words, the low concentration region 17 of the transistor portion 70 may be separated from the well region 11 with the first high concentration region 304 interposed therebetween. The low concentration region 17, which is P type, is made electrically floating when it is separated from and is not in contact with the well region 11. In addition, the bottom portion high concentration region 170 of P type, which has a higher concentration than the low concentration region 17, may be included such that it is in contact with the bottom portion of one or more trench portions. The bottom portion high concentration region 170 may be continuously provided across a plurality of trench portions. The bottom portion high concentration region 170 may be separated from the well region 11 and may be electrically floating. The upper surface 21 side of the bottom portion high concentration region 170 may or may not be in contact with the accumulation region 16. The lower surface 23 side of the bottom portion high concentration region 170 may be in contact with the low concentration region 17. The end portion of the bottom portion high concentration region 170 in the x axis direction may be located inside of the first high concentration region 304, may be in contact with the first high concentration region 304, or may be separated from the first high concentration region 304. In this example, the end portion of the bottom portion high concentration region 170 in the x axis direction is located inside the first high concentration region 304.

Figure 33:
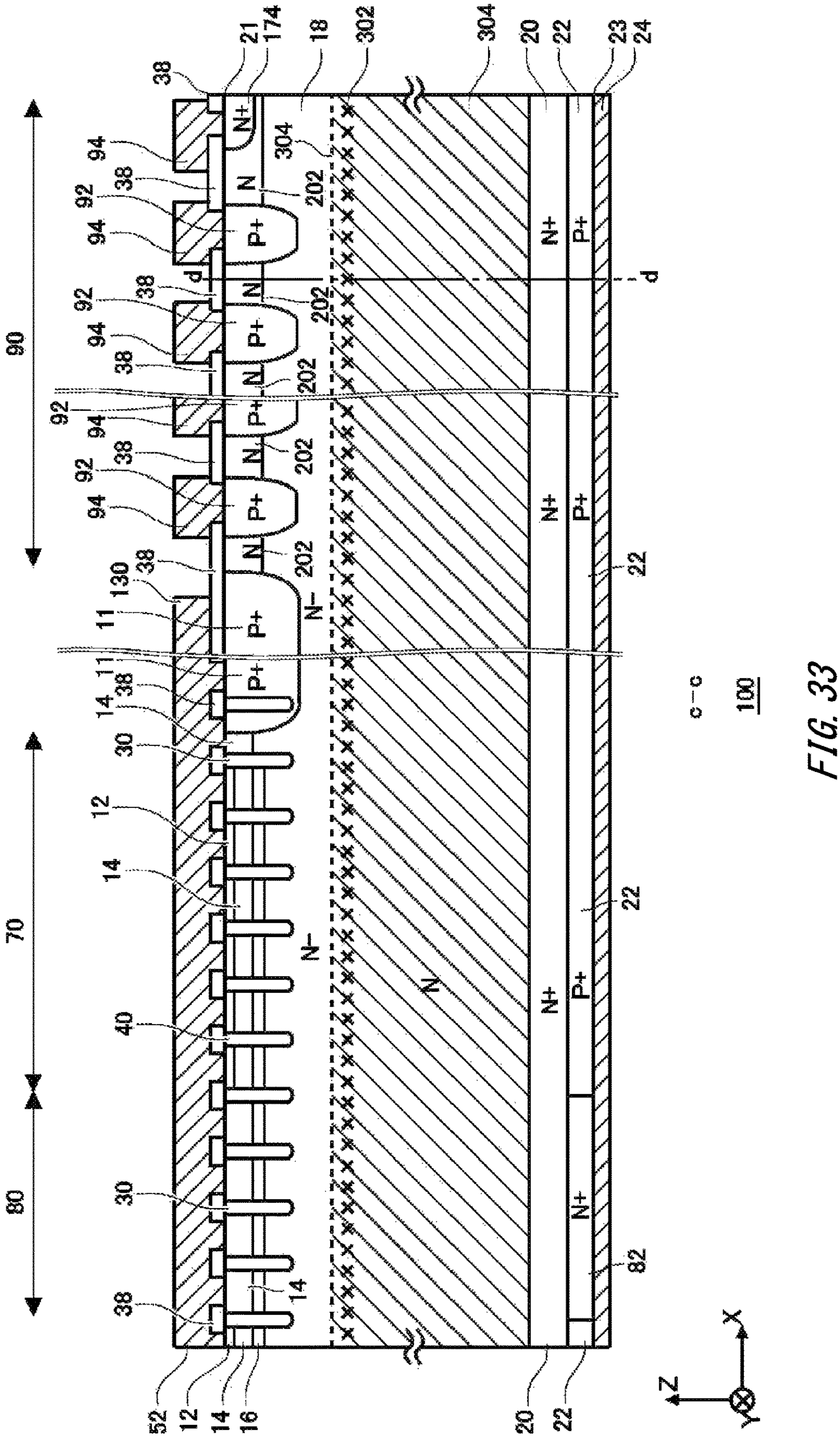
FIG. 33 is a drawing illustrating another example of the cross section taken along c-c in FIG. 1.

FIG. 33 is a drawing illustrating another example of the cross section taken along c-c in FIG. 1. The semiconductor device 100 in this example is different from the example illustrated in FIG. 4 in that the second high concentration region 202 is also arranged between the channel stopper 174 and the outermost guard ring 92. The other structure is similar to the semiconductor device 100 described with reference to FIG. 4. The second high concentration region 202 may be provided from the upper surface 21 of the semiconductor substrate 10 up to a position below a lower end of the channel stopper 174, and may also be provided up to a position above the lower end of the channel stopper 174.

Figure 34:
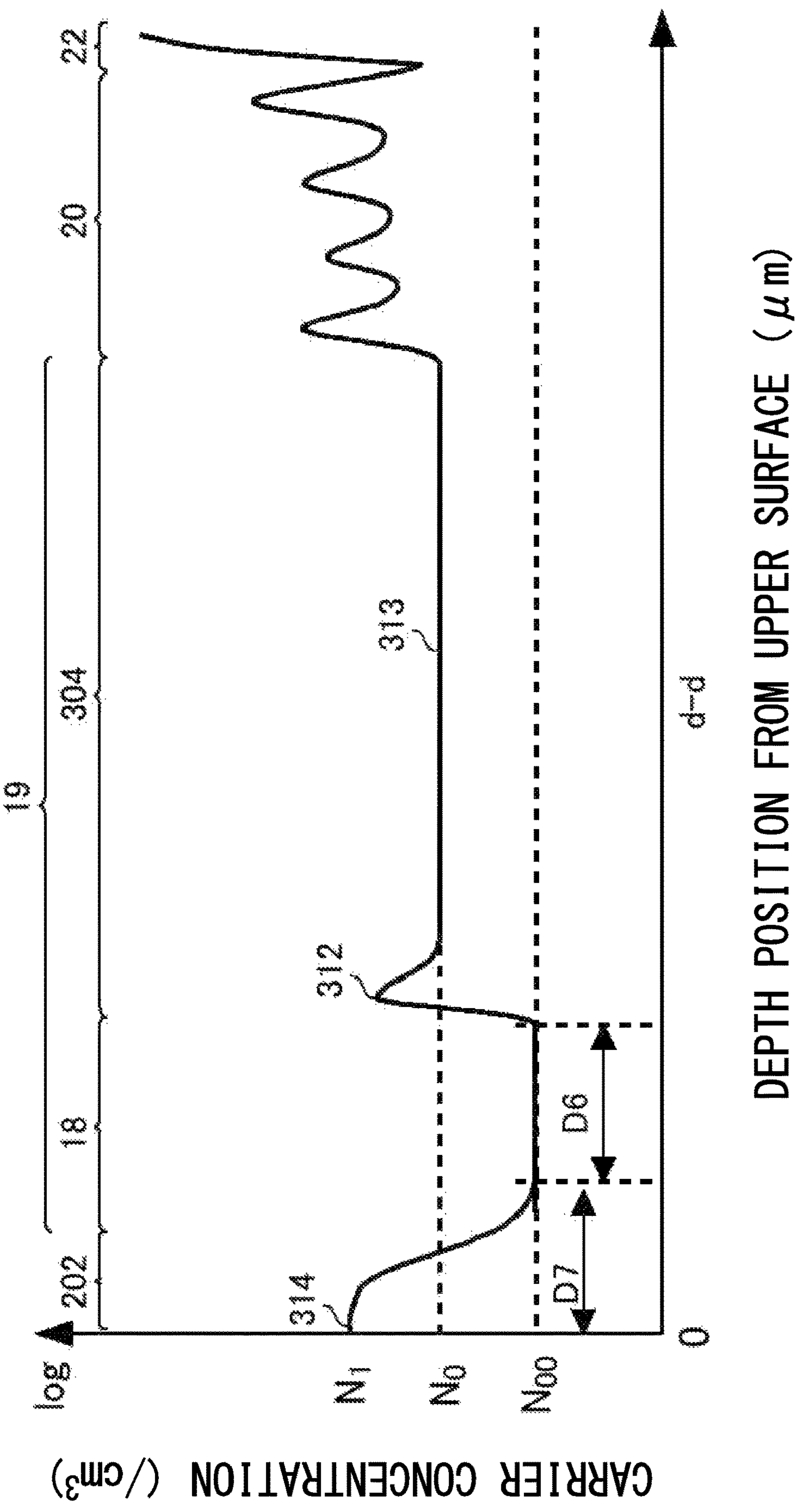
FIG. 34 illustrates one example of the carrier concentration distribution on the line d-d illustrated in FIG. 4 or FIG. 33.

FIG. 34 illustrates one example of the carrier concentration distribution on the line d-d illustrated in FIG. 4 or FIG. 33. The above-described distribution is similar to the example described with reference to FIG. 5. In this example, a distance between the lower end of the second high concentration region 202 and the upper end of the first high concentration region 304 in the depth direction is set as D6. The lower end of the second high concentration region 202 and the upper end of the first high concentration region 304 are positions where the carrier concentration starts to be higher than the bulk donor concentration $N_{00}$. The lower end of the second high concentration region 202 and the upper end of the first high concentration region 304 may also be positions where the carrier concentration is twice as high as the bulk donor concentration $N_{00}$.

The distance D6 is preferably equal to or lower than 50 μm. In other words, in the edge terminal structure portion 90, a width of a region sandwiched between the first high concentration region 304 and the second high concentration region 202 in the Z axis direction is preferably equal to or smaller than 50 μm. When the distance D6 is excessively large, it becomes difficult to suppress the expansion of the depletion layer in the edge terminal structure portion 90. For this reason, the depletion layer may reach a side surface of the semiconductor substrate 10, and a leakage current may increase in some cases. The distance D6 may be equal to or smaller than 40 μm, or may also be equal to or smaller than 30 μm. The distance D6 may be equal to or larger than 15 μm. When the distance D6 is excessively small, the breakdown voltage of the edge terminal structure portion 90 may be insufficient in some cases. The distance D6 may be equal to or larger than 17 μm.

A distance between the lower end of the second high concentration region 202 and the upper surface 21 of the semiconductor substrate 10 in the Z axis direction is set as D7. The distance D7 may be equal to or larger than 2 μm. The distance D7 may be equal to or larger than 3 μm, or may also be equal to or larger than 5 μm. The distance D7 may be smaller than the length of the guard ring in the depth direction.

Figure 35:
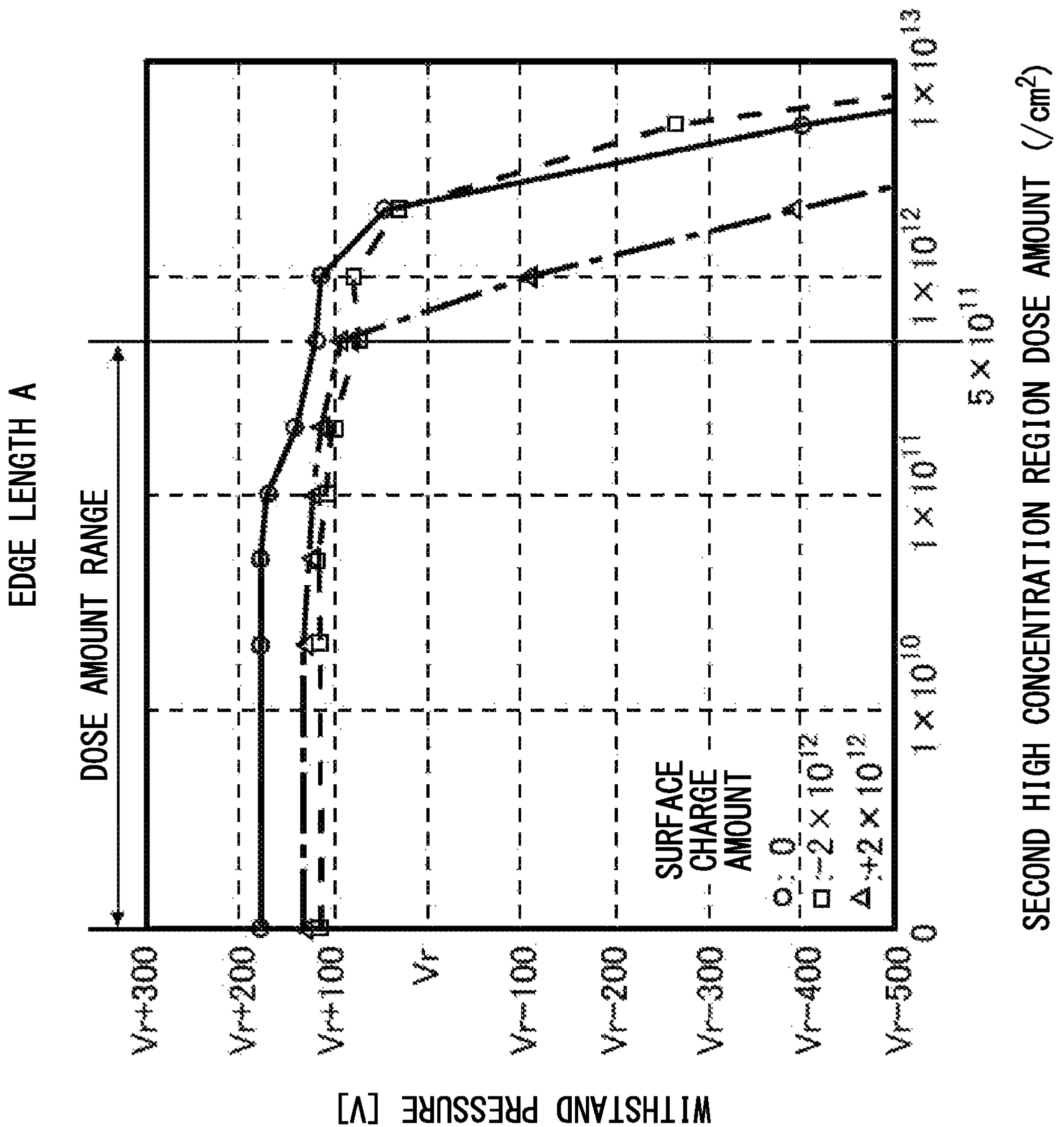
FIG. 35 illustrates a relationship between a dose amount (/cm$^2$) of the N type dopant to the second high concentration region 202 illustrated in FIG. 33 and a breakdown voltage (V) of the semiconductor device 100.

FIG. 35 illustrates a relationship between the dose amount of the N type dopant (/cm$^2$) to the second high concentration region 202 illustrated in FIG. 33 and the breakdown voltage (V) of the semiconductor device 100. The N type dopant in this example is phosphorus. A rated value of the breakdown voltage of the semiconductor device 100 is set as Vr. The rated voltage Vr is a voltage between 1000 V and 1500 V. The breakdown voltage of the semiconductor device 100 is an emitter-collector voltage at which the avalanche breakdown has occurred. In addition, in the example of FIG. 35, a surface charge amount of an upper surface of the interlayer dielectric film 38 is one of three values including 0, $-2\times10^{12}$/cm$^2$, and $+2\times10^{12}$/cm$^2$. The relationship illustrated in FIG. 35 is measured at a room temperature (25° C.). In this example, the distance D7 is approximately 3 μm, and the distance D6 is approximately 17 μm.

In this example, when the dose amount of the second high concentration region 202 is equal to or lower than $5\times10^{11}$/cm$^2$ irrespective of the surface charge amount, the breakdown voltage of the semiconductor device 100 hardly decreases, and can be maintained to be equal to or higher than the rating. On the other hand, when the dose amount exceeds $5\times10^{11}$/cm$^2$, the rated voltage decreases in a case where the surface charge amount is negative. For this reason, the dose amount of the second high concentration region 202 is preferably equal to or lower than $5\times10^{11}$/cm$^2$.

Figure 36:
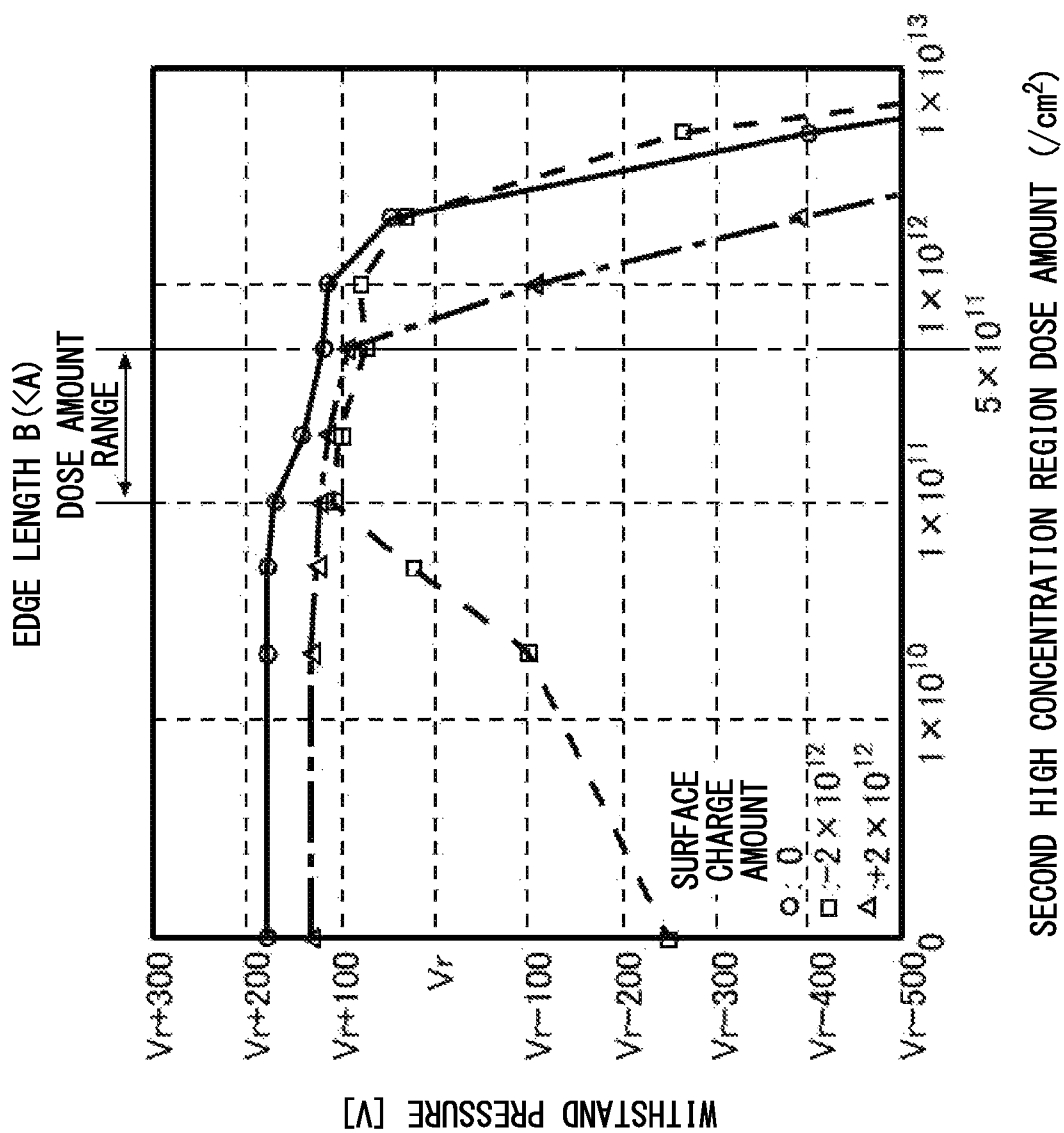
FIG. 36 illustrates another relationship between the dose amount (/cm$^2$) of the N type dopant and the breakdown voltage (V) of the semiconductor device 100.

FIG. 36 illustrates another relationship between the dose amount (/cm$^2$) of the N type dopant and the breakdown voltage (V) of the semiconductor device 100. In the semiconductor device 100 in this example, the length of the edge terminal structure portion 90 in the X axis direction (edge length) is small as compared with the example illustrated in FIG. 35. The other conditions are the same as the example of FIG. 35.

In this example, when the dose amount of the second high concentration region 202 is lower than $1\times10^{11}$/cm$^2$, the breakdown voltage in an example where negative surface charges are placed decreases. For this reason, the dose amount of the second high concentration region 202 is preferably equal to or higher than $1\times10^{11}$/cm$^2$. In addition, similarly as in the example of FIG. 35, when the dose amount of the second high concentration region 202 exceeds $5\times10^{11}$/cm$^2$, the rated voltage decreases in a case where the surface charge amount is negative. For this reason, the dose amount of the second high concentration region 202 is preferably equal to or lower than $5\times10^{11}$/cm$^2$. It is noted that the dose amount of the second high concentration region 202 may be an integral value obtained by integrating the donor concentration distribution of the second high concentration region 202 from the upper surface 21 by the distance D7.

Figure 37:
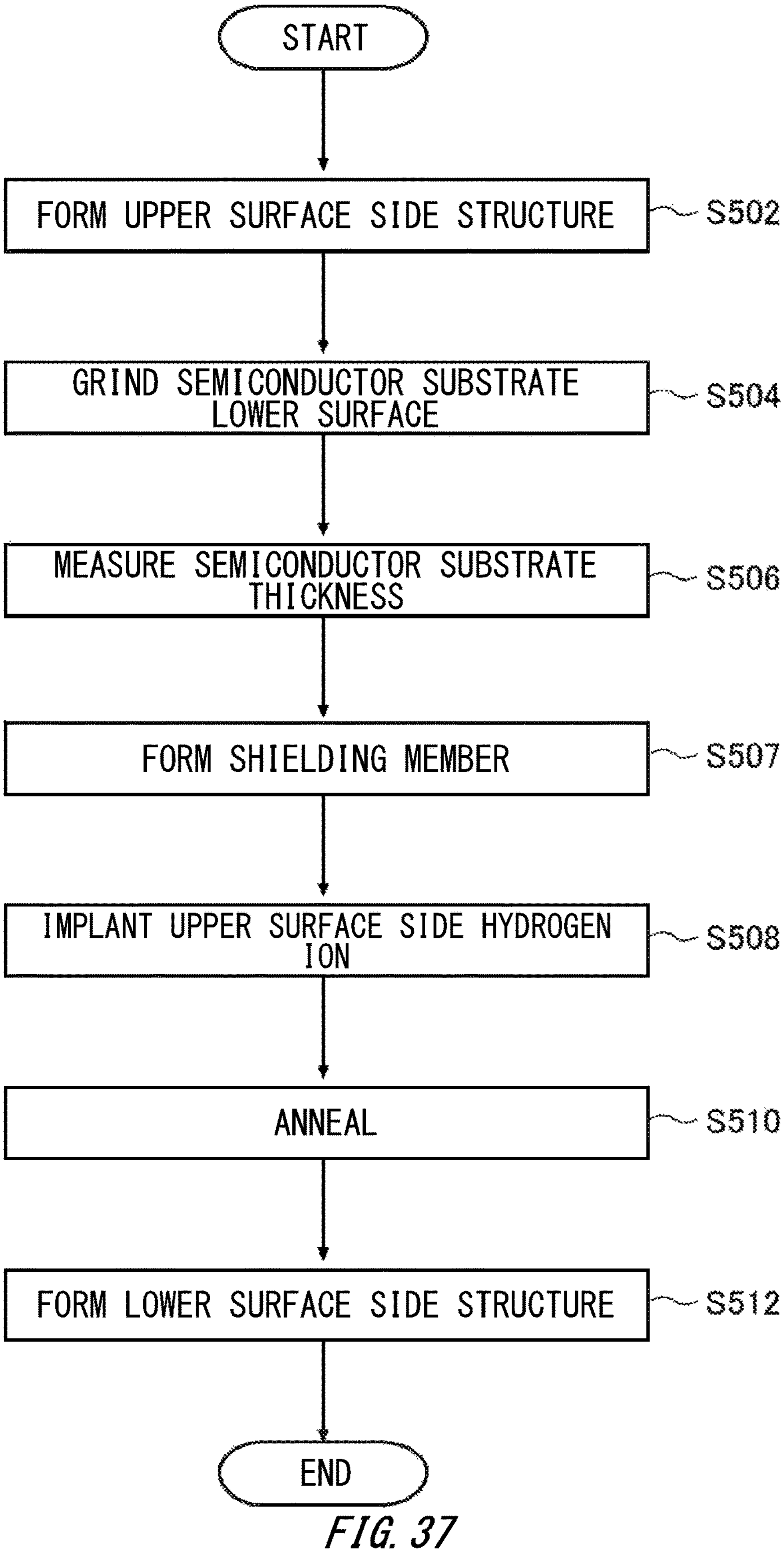
FIG. 37 is a flowchart illustrating one example of a fabrication process of the semiconductor device 100.

FIG. 37 is a flowchart illustrating an example of fabrication steps of the semiconductor device 100. The respective steps illustrated in FIG. 37 may be performed on the semiconductor substrate 10 in a wafer state. The plurality of semiconductor substrates 10 can be cut out from the above-described wafer. The bulk donor such as phosphorus is distributed in the whole of the above-described wafer.

First, in an upper surface side structure formation step S502, each structure provided in the upper surface 21 side of the semiconductor substrate 10 is formed. The structure on the upper surface 21 side includes at least one of the emitter region 12, the base region 14, the accumulation region 16, the well region 11, the second high concentration region 202, each of the trench portions, the interlayer dielectric film 38, the emitter electrode 52, the gate runner, the guard ring 92, the field plate 94, and the channel stopper 174.

Next, in a grinding step S504, the lower surface 23 side of the semiconductor substrate 10 is ground, and the thickness of the semiconductor substrate 10 in the Z axis direction is adjusted. In S504, the thickness of the semiconductor substrate 10 in the Z axis direction is decided in accordance with the breakdown voltage that the semiconductor device

100 should have. In S504, the semiconductor substrate 10 may be ground by a method such as back grind and CMP.

Next, the thickness of the semiconductor substrate 10 is measured in a measurement step S506. In S506, probes may be caused to contact both the upper surface 21 and the lower surface 23 of the semiconductor substrate 10, and the thickness of the semiconductor substrate 10 may be measured from a distance between the probes. In addition, the semiconductor substrate 10 may also be irradiated with infrared rays, and the thickness of the semiconductor substrate 10 may also be measured from a spectrum of interference light based on reflected light on the upper surface 21 side of the semiconductor substrate 10 and reflected light on the lower surface 23 side. The measurement method for the thickness of the semiconductor substrate 10 is not limited to these.

Next, in a first hydrogen implantation step S508, the hydrogen ions are implanted from the lower surface 23 of the semiconductor substrate 10 to the upper surface 21 side of the semiconductor substrate 10. Thus, the hydrogen peak portion 302 as described in FIG. 5 is formed. In S508, the implantation condition of the hydrogen ions is adjusted in accordance with the thickness of the semiconductor substrate 10 measured in S506. The implantation condition of the hydrogen ions may include an implantation depth of the hydrogen ions. The implantation depth of the hydrogen ions refers to a distance from the lower surface 23 of the semiconductor substrate 10 to a top of the hydrogen peak portion 302.

In a case where the hydrogen ions are implanted at a constant implantation depth, when a fluctuation of the thickness of the semiconductor substrate 10 occurs, a distance between the hydrogen peak portion 302 and the upper surface 21 of the semiconductor substrate 10 fluctuates. The above-described distance corresponds to a distance between the upper end of the first high concentration region 304 and the upper surface 21 of the semiconductor substrate 10. The bulk doping region 18 is between the upper end of the first high concentration region 304 and the upper surface 21 of the semiconductor substrate 10, and the above-described distance is a thickness of the bulk doping region 18 in the depth direction. When the above-described distance fluctuates, the fluctuation affects a manner of the spread of the depletion layer in the edge terminal structure portion 90. For this reason, when the above-described distance fluctuates, a characteristic of the semiconductor device 100 fluctuates.

In S508, the implantation depth of the hydrogen ions may be adjusted in accordance with the thickness of the semiconductor substrate 10 such that the distance between the hydrogen peak portion 302 and the upper surface 21 of the semiconductor substrate 10, that is, the thickness of the bulk doping region 18, becomes a predetermined value. The implantation depth of the hydrogen ions can be adjusted, for example, by the acceleration energy of the hydrogen ions.

A target value of the thickness of the semiconductor substrate 10 is set as D (μm), and a distance between the upper end of the first high concentration region 304 and the upper surface 21 of the semiconductor substrate 10 is set as Z (μm). In addition, a distance X from the upper end of the first high concentration region 304 to the lower surface 23 of the semiconductor substrate 10 (that is, a range Rp of the hydrogen ions) is X=D−Z. In a case where the thickness of the semiconductor substrate 10 is matched with the target value D, the acceleration energy E (eV) of the hydrogen ions that should be set in the first hydrogen implantation step S508 is given by Expression (1). Where y=log(E), and x=log(X).

$$y=-0.0047x^4+0.0528x^3-0.2211x^2+0.9923x+5.0474 \quad (1)$$

A difference between a measured value A of the thickness of the semiconductor substrate 10 which is measured in S506 and the target value D is set as d=D−A. When the difference d is higher than 0, it is indicated that the grinding is excessively preformed in S504, and the semiconductor substrate 10 is thin. When the difference d is lower than 0, it is indicated that the grinding is insufficient, and the semiconductor substrate 10 is thick. A distance X' from the upper end of the first high concentration region 304 to the lower surface 23 of the semiconductor substrate 10 in which the difference d is taken into account is set as X'=X−d=D−Z−d.

In a case where the difference d is taken into account, the acceleration energy E (eV) of the hydrogen ions that should be set in the first hydrogen implantation step S508 is given by Expression (2). Where $y_1$=log(E'), and $x_1$=log(X').

$$y_1=-0.0047x_1^4+0.0528x_1^3-0.2211x_1^2+0.9923x_1+5.0474 \quad (2)$$

In addition, in S508, the implantation depth of the hydrogen ions may also be adjusted by a characteristic such as a thickness of the shielding member to be arranged on the lower surface 23 of the semiconductor substrate 10 in S507. In addition, both the acceleration energy E of the hydrogen ions and the characteristic of the shielding member may also be adjusted. For example, the implantation depth may be roughly adjusted by the thickness of the shielding member, and the implantation depth may be adjusted by the acceleration energy E with a higher resolution. A lower surface shielding member formation step S507 may be provided between S506 and S508. The lower surface shielding member formation step S507 will be described below.

Next, in the anneal step S510, the whole of the semiconductor substrate 10 is annealed. Thus, the first high concentration region 304 can be formed in the passage region through which the hydrogen ions have passed. Since the implantation depth of the hydrogen ions is adjusted in S508, it is possible to adjust the upper end position of the first high concentration region 304 in the Z axis direction.

Next, in a lower surface side structure formation step S512, a structure on the lower surface 23 side of the semiconductor substrate 10 is formed. The structure on the lower surface 23 side may include, for example, at least one of the buffer region 20, the collector region 22, the cathode region 82, and the collector electrode 24. It is preferable that the lower surface side structure formation step S512 does not include processing to anneal the whole of the semiconductor substrate 10 at a higher temperature than the anneal step S510. In a case where the collector region 22 and the cathode region 82 are formed, local annealing may be performed by laser or the like. Thus, a heat history after the first high concentration region 304 is formed can be reduced.

Figure 38A:
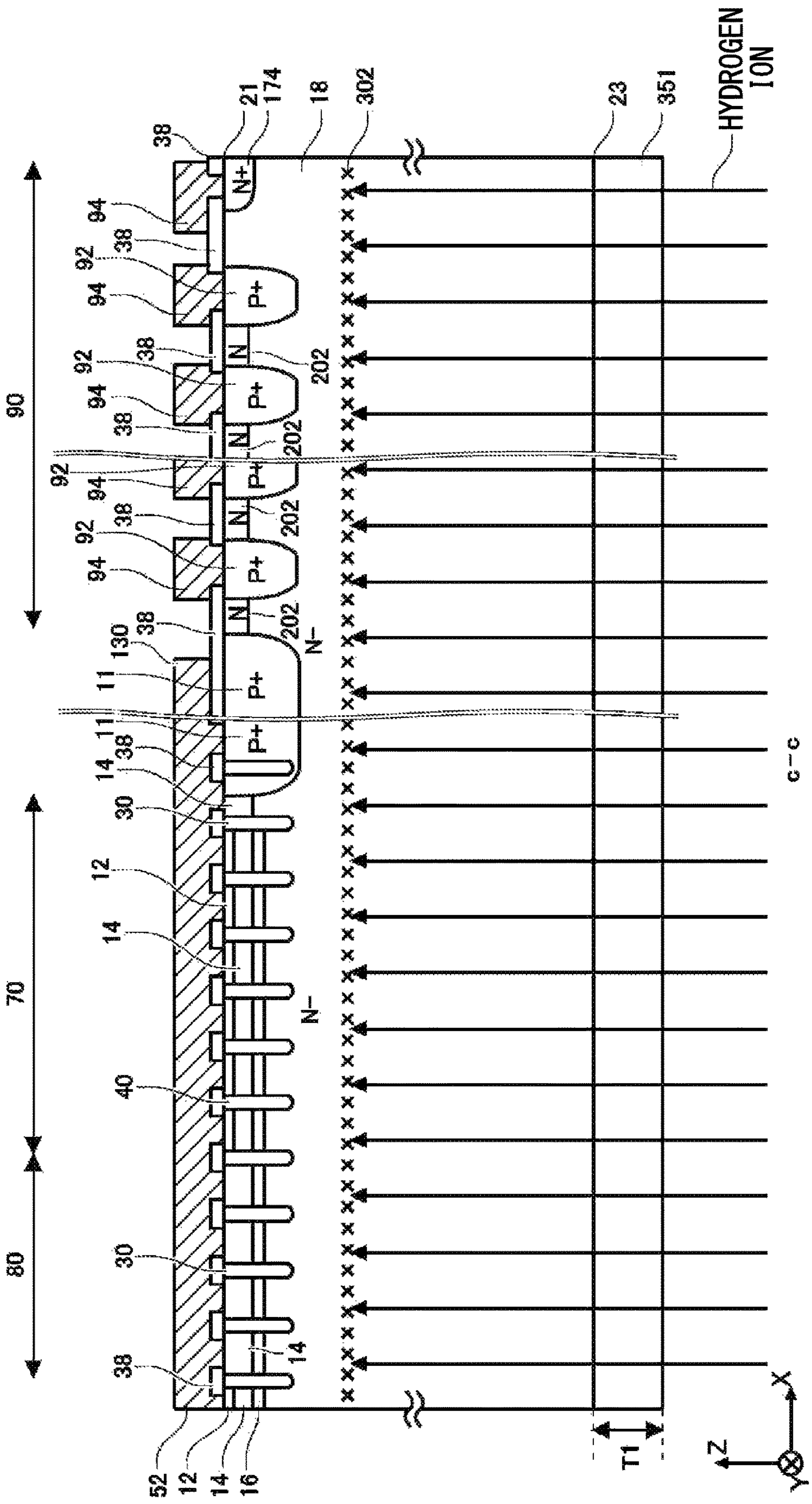
FIG. 38A illustrates one example of a first hydrogen implantation step S508.

FIG. 38A illustrates one example of the first hydrogen implantation step S508. In this example, in a state where a shielding member 351 is formed on the lower surface 23 of the semiconductor substrate 10, the hydrogen ions are implanted from the lower surface 23 of the semiconductor substrate 10. The shielding member 351 in this example is a photosensitive resist material coated on the lower surface 23 of the semiconductor substrate 10, for example.

In S507, a thickness T1 of the shielding member 351 to be arranged on the lower surface 23 is calculated on the basis of the thickness of the semiconductor substrate 10 measured in S506, and the implantation depth of the hydrogen ions is adjusted by forming the shielding member 351. In a case where the measured value of the thickness of the semiconductor substrate 10 is higher than a predetermined target value, the thickness T1 of the shielding member 351 is decreased to increase the range Rp of the hydrogen ions. In a case where the measured value is lower than the target value, the thickness T1 of the shielding member 351 is increased to decrease the range Rp of the hydrogen ions. A change amount of the range Rp of the hydrogen ions in a case where the thickness T1 of the shielding member 351 is changed may be previously measured.

In addition, in S508, the range Rp of the hydrogen ions may also be adjusted by a degree of hardening of the shielding member 351. The degree of the hardening of the shielding member 351 can be adjusted by an exposure time or the like. The change amount of the range Rp of the hydrogen ions in a case where the hardening of the shielding member 351 is adjusted may be previously measured.

Figure 38B:
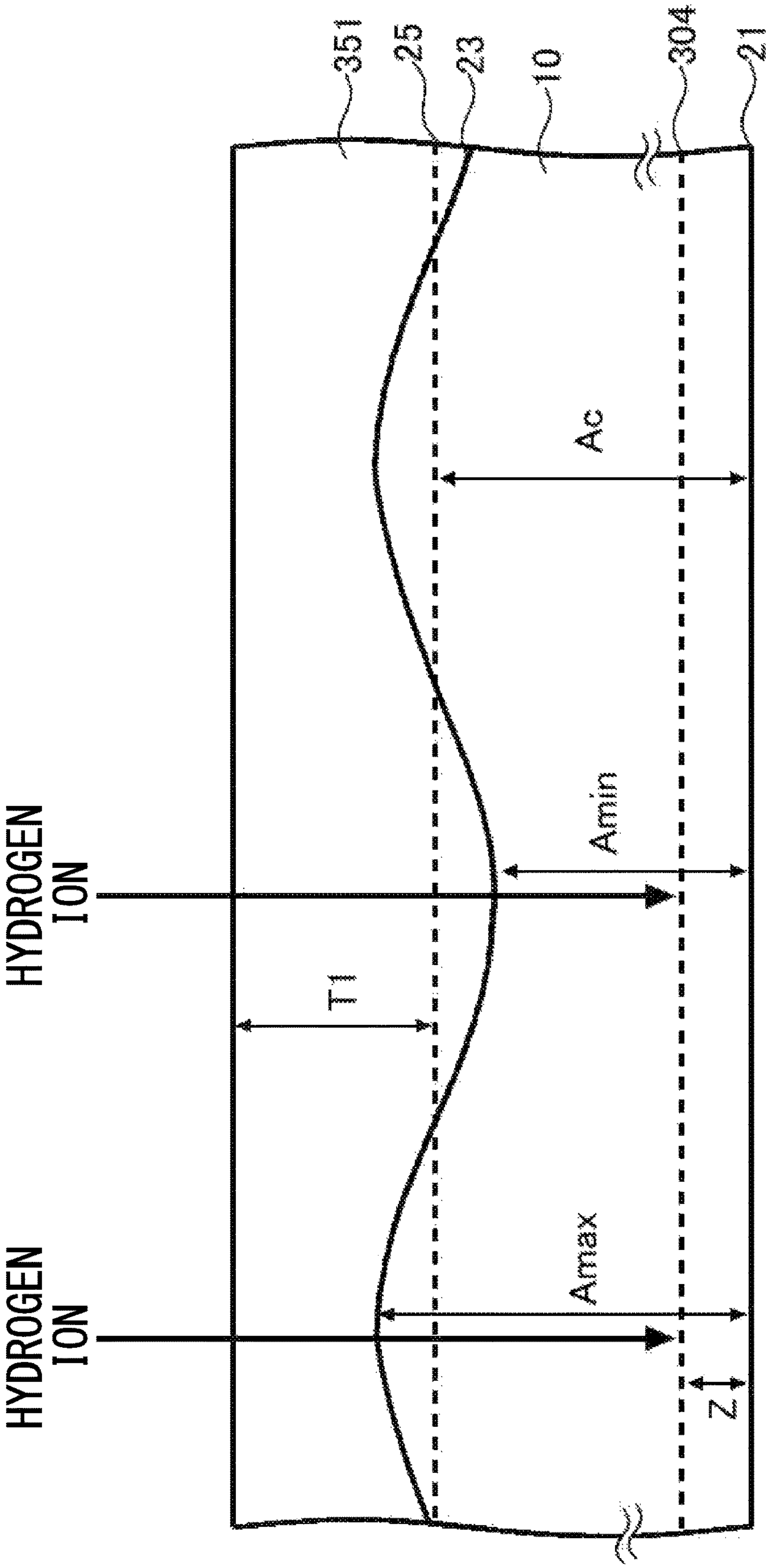
FIG. 38B is a drawing illustrating an example of hydrogen ion implantation through a shielding member 351.

FIG. 38B illustrates one example of hydrogen ion implantation through the shielding member 351. The shielding member 351 is formed on the lower surface 23. When a fluctuation of the thickness of the semiconductor substrate 10 after the grinding occurs in the plane of the semiconductor substrate 10, a fluctuation also occurs in the distance Z between the upper end of the first high concentration region 304 and the upper surface 21 of the semiconductor substrate 10. In view of the above, after the shielding member 351 is formed on the lower surface 23, hydrogen ions are implanted to the lower surface 23. In a case where the shielding member is set as a resist film, a coated surface after coating of the resist film can be flattened irrespective of irregularities on the lower surface 23 of the semiconductor substrate 10 serving as a ground. Thus, it is possible to reduce influences of the in-plane fluctuation of the thickness of the semiconductor substrate 10 relative to the distance Z.

The measured value of the thickness of the semiconductor substrate 10 in the measurement step S506 after the grinding has a maximum value Amax. and a minimum value Amin. in the plane of the above-described substrate. At this time, an average value Ac of the thickness after the grinding is defined as Ac=(Amax.+Amin.)/2. In FIG. 38B, an average surface 25 corresponding to the average value Ac is indicated by a broken line. When the measured value A in S506 is set as Ac, and the difference d with the target value D is set as d=D−Ac, Ac=D−d is established. The hydrogen ion implantation in S508 is performed through the shielding member 351 having a thickness T1 (μm). For this reason, while the thickness T1 of the shielding member 351 is taken into account, the distance X' from the upper end of the first high concentration region 304 to the lower surface 23 of the semiconductor substrate 10 in which the difference d is taken into account becomes X'=Ac+T1−Z. Herein, the thickness T1 of the shielding member 351 is defined as a thickness from the average surface 25 corresponding to the average value Ac of the measured value to a surface on a side opposite to the average surface 25. Since Ac is D−d, X'=D−d+T1−Z is established. When X' is assigned to Expression (2), the acceleration energy E (eV) of the hydrogen ions which should be set in the first hydrogen implantation step S508 may be obtained.

Figure 39:
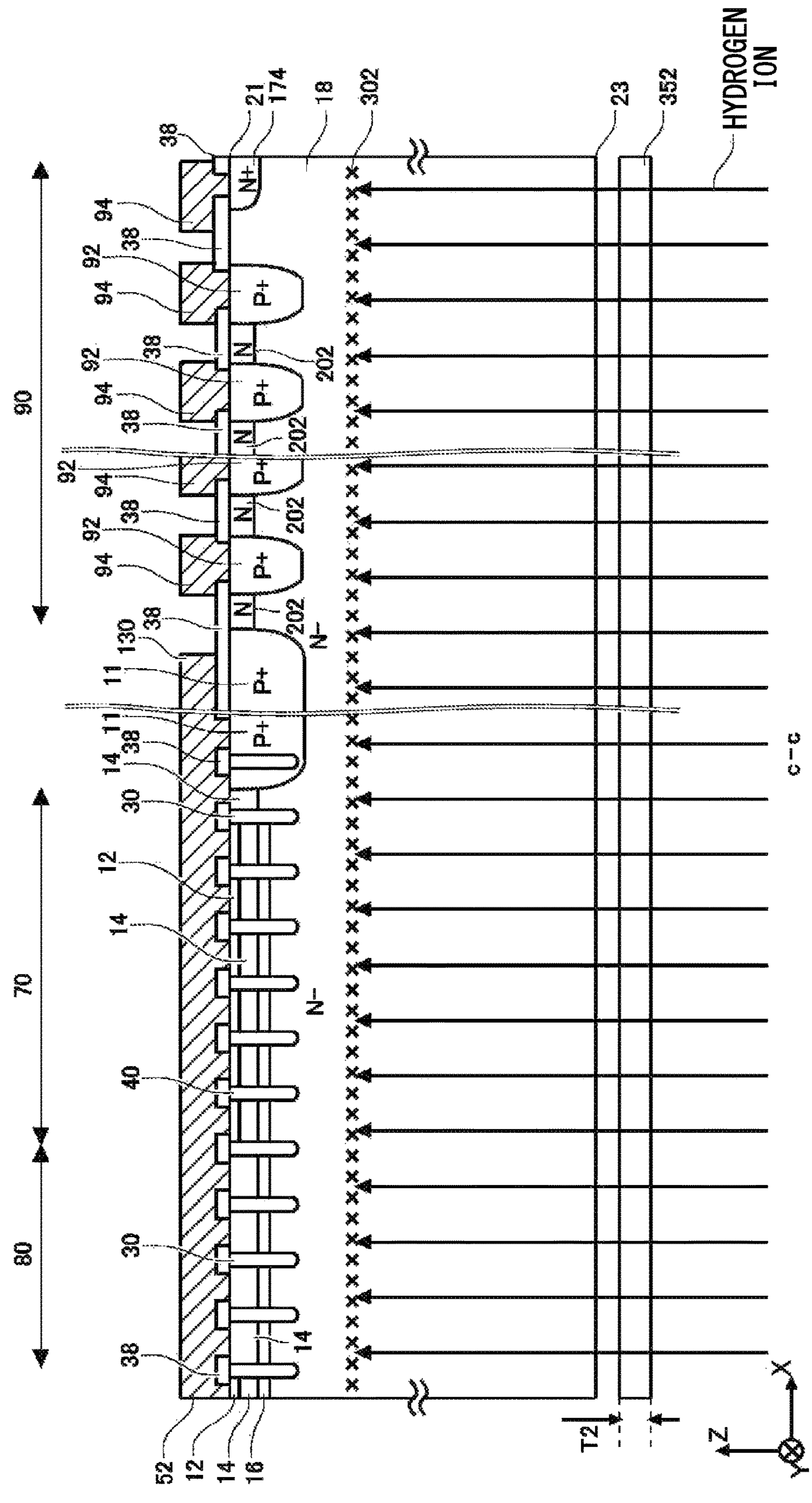
FIG. 39 illustrates another example of the first hydrogen implantation step S508.

FIG. 39 illustrates another example of the first hydrogen implantation step S508. In this example, in a state where a shielding member 352 is arranged on the lower surface 23 side of the semiconductor substrate 10, the hydrogen ions are implanted from the lower surface 23 of the semiconductor substrate 10. The shielding member 352 in this example is a solid member formed of a metallic material such as aluminum or other materials, for example. The shielding member 352 may be arranged away from the lower surface 23.

In this example too, a thickness T2 of the shielding member 352 arranged on the lower surface 23 is adjusted on the basis of the measured thickness of the semiconductor substrate 10. The adjustment method for the thickness T2 may be similar to the adjustment method for the thickness T1 illustrated in FIG. 38A.

In a case where the acceleration energy E of the hydrogen ions is fixed, a relationship with the range Rp of the hydrogen ions in the first hydrogen implantation step S508 corresponds to Expression (3). Where $y_2$=log(Rp), $x_2$=log (E).

$$y_2=-0.0082x_2^4+0.1664x_2^3-1.0210x_2^2+2.8528x_2-4.4625 \quad (3)$$

From Expression (3), the range of the hydrogen ions that should be reduced by the thickness T2 of the shielding member 352 corresponds to $T2=Rp-X'=10^{y_2}-D+Z+d$ (μm). The shielding member 351 in contact with the lower surface 23 maybe formed between the lower surface 23 and the shielding member 352 in step S507. Thus, the influences of the thickness fluctuation of the semiconductor substrate 10 can be reduced. In this case, while X'=D−d+T1−Z is set, $T2=Rp-X'=10^{y_2}-(D-d+T1-$(μm) is established.

It is noted that the acceleration energy of the hydrogen ions may be set in line with a case where the thickness is the largest among supposed fluctuations of the thickness of the semiconductor substrate 10. As the thickness of the semiconductor substrate 10 is smaller, the thickness of the shielding member may be further decreased. Thus, it is possible to adjust the implantation depth of the hydrogen ions without changing the acceleration energy. In addition, as the thickness T2 of the shielding member 352 is smaller, the adjustment of the thickness T2 becomes more difficult. For this reason, even when the thickness of the semiconductor substrate 10 fluctuates, the acceleration energy of the hydrogen ions may also be set such that the thickness T2 of the shielding member 352 becomes equal to or higher than a predetermined value. The predetermined value is, for example, equal to or higher than 100 μm.

It is noted that in the first hydrogen implantation step S508, the dose amount of the hydrogen ions may also be adjusted on the basis of the thickness of the semiconductor substrate 10. When the thickness of the semiconductor substrate 10 varies, the breakdown voltage of the semiconductor device 100 may fluctuate in some cases. In contrast to this, when the dose amount of the hydrogen ions is adjusted, it is possible to adjust the breakdown voltage of the semiconductor device 100. In a case where the thickness of the semiconductor substrate 10 is lower than the predetermined target value, for example, the breakdown voltage may decrease in some cases. In this case, the dose amount of the hydrogen ions may be decreased in S508. When the concentration of the hydrogen donor formed in the passage region of the hydrogen ions is decreased, the decrease of the breakdown voltage can be suppressed. In a case where the thickness of the semiconductor substrate 10 is higher than the predetermined target value, the dose amount of the hydrogen ions may be increased. A preferable relationship of the dose amount of the hydrogen ions with the thickness of the semiconductor substrate 10 may be previously measured.

In addition, in the anneal step S510, the anneal condition of the semiconductor substrate 10 may also be adjusted on the basis of the thickness of the semiconductor substrate 10. The anneal condition includes at least one of an anneal time and an anneal temperature. In a case where the thickness of the semiconductor substrate 10 is higher than the predetermined target value, the anneal time may be adjusted such that the concentration of the hydrogen donor formed in the passage region of the hydrogen ions is higher than the target value, or the anneal temperature may be adjusted. In a case where the thickness of the semiconductor substrate 10 is lower than the predetermined target value, the anneal time may be adjusted such that the concentration of the hydrogen donor formed in the passage region of the hydrogen ions is lower than the target value, or the anneal temperature may be adjusted.

Figure 40:
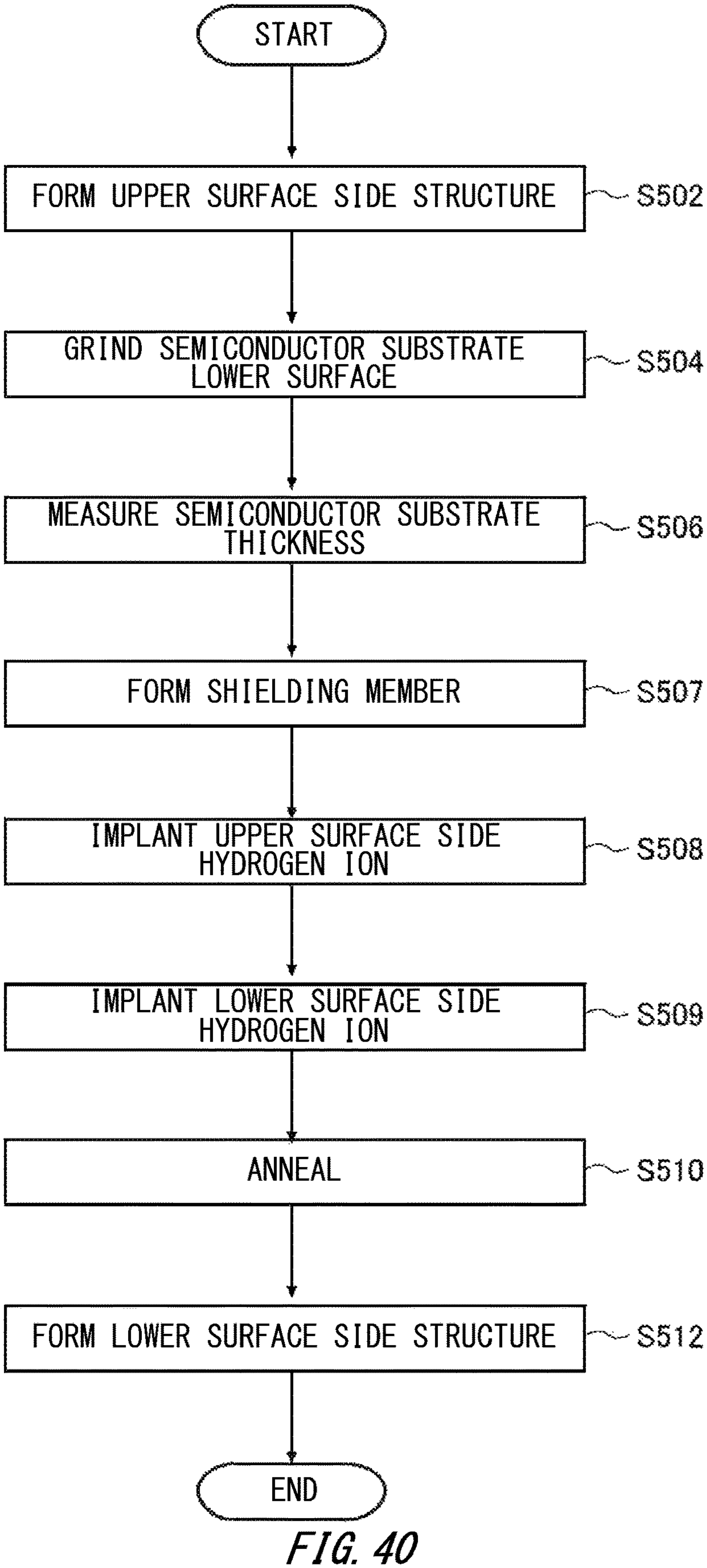
FIG. 40 is a flowchart illustrating another example of the fabrication process of the semiconductor device 100.

FIG. 40 is a flowchart illustrating another example of the fabrication process of the semiconductor device 100. In this example, a second hydrogen implantation step S509 is provided before the anneal step S510. The second hydrogen implantation step S509 is performed after the measurement step S506. The processes other than the second hydrogen implantation step S509 are similar to the example of FIG. 37.

In the second hydrogen implantation step S509, the hydrogen ions are implanted from the lower surface 23 of the semiconductor substrate 10 to a region on the lower surface 23 side of the semiconductor substrate 10. In S509, the hydrogen ions may be implanted to any of the peak positions of the carrier concentration of the buffer region 20 illustrated in FIG. 5. In S509, the hydrogen ions may be implanted to each of the peak positions of the buffer region 20.

The hydrogen ions implanted to the lower surface 23 side of the semiconductor substrate 10 are diffused in the anneal step S510 on the upper surface 21 side of the semiconductor substrate 10. Thus, the hydrogen donor is more easily formed in the first high concentration region 304. The donor concentration of the first high concentration region 304 can also be adjusted by the dose amount of the hydrogen ions implanted on the lower surface 23 side of the semiconductor substrate 10. In addition, the donor concentration of the first high concentration region 304 can also be adjusted by the depth position of the hydrogen ions implanted on the lower surface 23 side of the semiconductor substrate 10.

In S509 in this example, in accordance with the measured thickness of the semiconductor substrate 10, the implantation condition of the hydrogen ions implanted on the lower surface 23 side is adjusted. The implantation condition includes at least one of the dose amount and the implantation depth of the hydrogen ions. Thus, it is possible to adjust the breakdown voltage of the semiconductor device 100 by adjusting the donor concentration of the first high concentration region 304. For example, in a case where the thickness of the semiconductor substrate 10 is smaller than the predetermined target value, the breakdown voltage may be decreased in some cases. In this case, the dose amount of the hydrogen ions may be adjusted in S509, and the decrease of the breakdown voltage may be suppressed. The implantation depth of the hydrogen ions may also be adjusted. In a case where the thickness of the semiconductor substrate 10 is larger than the predetermined target value, the dose amount of the hydrogen ions may be adjusted, and the implantation depth of the hydrogen ions may also be adjusted. The preferable relationship of the dose amount or the implantation depth of the hydrogen ions with the thickness of the semiconductor substrate 10 may be previously measured.

In S509, the implantation condition of the hydrogen ions for the highest concentration peak among a plurality of hydrogen concentration peaks of the buffer region 20 may be adjusted. In addition, the implantation condition of the hydrogen ions for the peak that is the closest to the lower surface 23 of the semiconductor substrate 10 among the plurality of hydrogen concentration peaks of the buffer region 20 may also be adjusted.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

Figure 41:
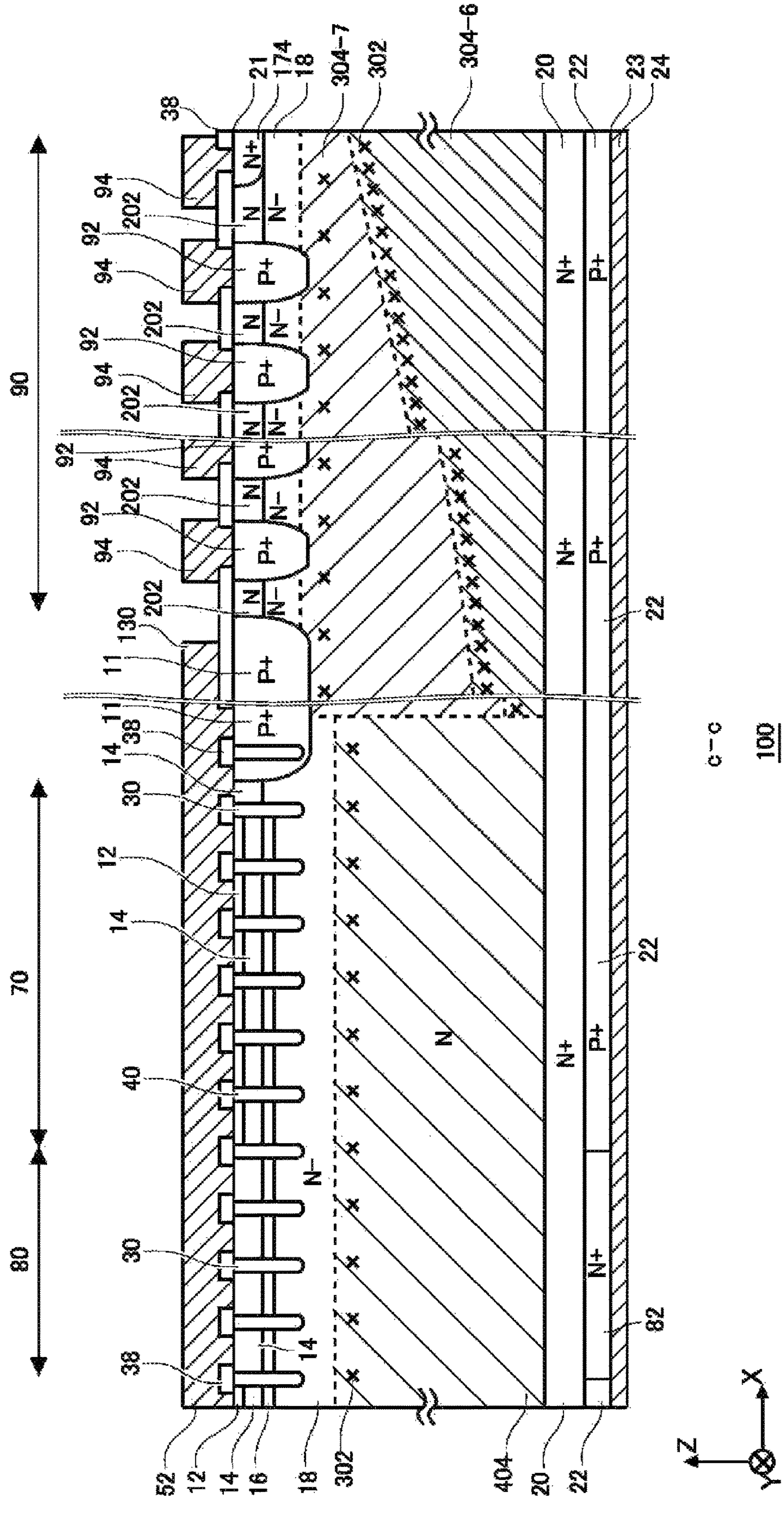
FIG. 41 is a drawing illustrating another example of the cross section taken along c-c in FIG. 1.

For example, such a structure is also included that the first high concentration region 304, the second high concentration region 202, and the fourth high concentration region 404 are provided as illustrated in FIG. 41 to adjust the electric field distributions of the active portion 160 and the edge terminal structure portion 90.

FIG. 41 is a drawing illustrating another example of the cross section taken along c-c in FIG. 1. The semiconductor device 100 in this example is different in the arrangement of each of the high concentration regions from other configuration examples in the present specification. The other structures are similar to any of the examples described in the present specification.

The semiconductor device 100 in this example has a first high concentration region 304-6, a first high concentration region 304-7, the second high concentration region 202, and the fourth high concentration region 404. With regard to a shape of each of the high concentration regions, each of the high concentration regions described in the present specification may be appropriately combined.

A region of at least a part of the first high concentration region 304-6 and the first high concentration region 304-7 is provided in the edge terminal structure portion 90. In the example described with reference to FIG. 41, the first high concentration region 304-6 is similar to the first high concentration region 304 described with reference to FIG. 25A. The first high concentration region 304-7 has a lower doping concentration than the first high concentration region 304-6, and is also arranged on the first high concentration region 304-6. The whole of the first high concentration region 304-6 may be arranged below the first high concentration region 304-7.

In addition, the second high concentration region 202 is similar to the second high concentration region 202 described with reference to FIG. 21. It is noted however that the shapes of the first high concentration region 304-6, the first high concentration region 304-7, and the second high concentration region 202 may also be the shapes of the other high concentration regions described in the present specification. As illustrated in FIG. 41, the second high concentration region 202 may also be provided between the channel stopper 174 and the guard ring 92 that is the closest to the channel stopper 174. The second high concentration region 202 may be formed by implanting phosphorus, or may also be formed using the hydrogen donor.

The fourth high concentration region 404 is formed in the active portion 160. The fourth high concentration region 404 may have a lower concentration than the first high concentration region 304-6. The fourth high concentration region 404 may have a lower concentration than the first high concentration region 304-7. An upper end of the first high concentration region 304-7 may be arranged on the upper surface side 21 relative to the upper end of the fourth high concentration region 404. In the example of FIG. 41, the upper end of the fourth high concentration region 404 is arranged below each of the trench portions or the well region 11. In the active portion 160, the N type bulk doping region 18 may be provided on the fourth high concentration region 404, and the P type low concentration region 17 may also be provided.

The upper end of the first high concentration region 304-7 is arranged above the lower end of the well region 11 or the lower end of the guard ring 92. In another example, the upper end of the fourth high concentration region 404 in the edge terminal structure portion 90 may be arranged below the well region 11 or the lower end of the guard ring 92. The upper end of the first high concentration region 304-7 is arranged below the lower end of the second high concentration region 202. In other words, the first high concentration region 304-7 and the second high concentration region 202 are arranged away from each other. In this example, in the edge terminal structure portion 90, the bulk doping region 18 is provided between the first high concentration region 304-7 and the second high concentration region 202.

According to the above-described respective embodiments, the example has been described in which the first high concentration region 304 is formed by the hydrogen ion implantation, but the configuration is not limited to the above. For example, the first high concentration region 304 can also be formed when the disorder is generated in the substrate by helium ion implantation, and hydrogen is diffused within the substrate to generate the VOH defect. In this case, the hydrogen peak portion 302 contains helium. According to the above-described configuration too, the advantage for suppressing the spread of the electric field in the lateral direction as illustrated in FIG. 6 is similarly exhibited. In addition, the first high concentration region 304 can also be formed by diffusing an impurity element that forms another donor band from the lower surface 23 to be activated.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . semiconductor substrate, 11 . . . well region, 12 . . . emitter region, 14 . . . base region, 15 . . . contact region, 16 . . . accumulation region, 17 . . . low concentration region, 18 . . . bulk doping region, 19 . . . drift region, 20 . . . buffer region, 21 . . . upper surface, 22 . . . collector region, 23 . . . lower surface, 24 . . . collector electrode, 25 . . . average surface, 29 . . . linear part, 30 . . . dummy trench portion, 31 . . . distal end portion, 32 . . . dummy dielectric film, 34 . . . dummy conductive portion, 38 . . . interlayer dielectric film, 39 . . . linear part, 40 . . . gate trench portion, 41 . . . distal end portion, 42 . . . gate dielectric film, 44 . . . gate conductive portion, 52 . . . emitter electrode, 54 . . . contact hole, 60, 61 . . . mesa portion, 70 . . . transistor portion, 80 . . . diode portion, 81 . . . extended region, 82 . . . cathode region, 90 . . . edge terminal structure portion, 91 . . . region, 92 . . . guard ring, 93 . . . side surface, 94 field plate, 95 . . . gap, 98 . . . opening, 100 . . . semiconductor device, 102 . . . end side, 112 . . . gate pad, 130 . . . outer peripheral gate runner, 131 . . . active-side gate runner, 140 . . . protective film, 160 . . . active portion, 174 . . . channel stopper, 202 . . . second high concentration region, 203 . . . third high concentration region, 204 . . . region, 206 . . . upper part, 208 . . . lower part, 209 . . . region, 260 . . . lower region, 261 . . . lower region, 262 . . . equipotential surface, 302 . . . hydrogen peak portion, 304 . . . first high concentration region, 306, 308, 310 . . . equipotential surface, 312, 314 . . . peak, 313, 317 . . . flat portion, 318 . . . first peak, 320, 322, 324, 326 . . . slope, 323, 327 . . . flat portion, 330, 332, 334, 336, 338 . . . point, 350, 351, 352 . . . shielding member, 404 . . . fourth high concentration region, 502 . . . fifth high concentration region

What is claimed is:

1. A semiconductor device comprising:

a semiconductor substrate in which a bulk donor of a first conductivity type is entirely distributed;

an active portion provided in the semiconductor substrate; and an edge terminal structure portion provided in the semiconductor substrate, and provided between the active portion and an end portion of the semiconductor substrate on an upper surface of the semiconductor substrate, wherein:

the edge terminal structure portion has a first high concentration region of the first conductivity type which has a donor concentration higher than a doping concentration of the bulk donor in a region between the upper surface and a lower surface of the semiconductor substrate;

an upper surface of the first high concentration region is located on an upper surface side of the semiconductor substrate;

a lower surface of the first high concentration region is located on a lower surface side of the semiconductor substrate;

the first high concentration region has a hydrogen peak portion where a hydrogen concentration shows a peak in a hydrogen concentration distribution in a depth direction, and wherein the hydrogen peak portion is arranged on the upper surface side of the semiconductor substrate; and the hydrogen concentration in the first high concentration region is higher than the doping concentration of the bulk donor over the first high concentration region.

2. The semiconductor device according to claim 1, wherein the hydrogen peak portion contains helium.

3. The semiconductor device according to claim 1, wherein the edge terminal structure portion has a plurality of guard rings of a second conductivity type in contact with the upper surface of the semiconductor substrate.

4. The semiconductor device according to claim 3, wherein the edge terminal structure portion has a second high concentration region that is provided between two of the guard rings adjacent with each other, the second high concentration region having a donor concentration higher than the doping concentration of the bulk donor.

5. The semiconductor device according to claim 4, wherein the hydrogen peak portion is arranged to be located lower than the second high concentration region.

6. The semiconductor device according to claim 4, wherein:

the active portion has a base region of the second conductivity type which is arranged on the upper surface side of the semiconductor substrate, and a well region that has a higher doping concentration than the base region, and is also provided to be deeper than the base region; and a distance between the hydrogen peak portion and the second high concentration region in the depth direction is lower than a maximum value of a distance between the well region and each point of a closest one of the guard rings to the well region.

7. The semiconductor device according to claim 4, wherein the hydrogen peak portion is arranged in the second high concentration region.

8. The semiconductor device according to claim 7, wherein:

the second high concentration region contains hydrogen implanted from the upper surface of the semiconductor substrate;

the hydrogen peak portion contains hydrogen implanted from the lower surface of the semiconductor substrate;

a hydrogen concentration distribution of the second high concentration region in the depth direction has a first peak where a hydrogen concentration shows a peak; and the first peak is overlapped with the hydrogen peak portion.

9. The semiconductor device according to claim 7, wherein:

the second high concentration region contains hydrogen implanted from the upper surface of the semiconductor substrate;

the hydrogen peak portion contains hydrogen implanted from the lower surface of the semiconductor substrate;

a hydrogen concentration distribution of the second high concentration region in the depth direction has a first peak where a hydrogen concentration shows a peak; and the hydrogen peak portion is arranged between the first peak and the upper surface of the semiconductor substrate.

10. The semiconductor device according to claim 4, wherein the second high concentration region contains a hydrogen donor.

11. The semiconductor device according to claim 4, wherein the second high concentration region is provided from a position shallower than a lower end of each of the guard rings to a position deeper than the lower end of each of the guard rings between two of the guard rings adjacent with each other.

12. The semiconductor device according to claim 11, wherein the second high concentration region has an upper part in contact with the upper surface of the semiconductor substrate, and a lower part that is provided as a separate part from the upper part, and is provided from the position shallower than the lower end of each of the guard rings to the position deeper than the lower end of each of the guard rings.

13. The semiconductor device according to claim 4, wherein the second high concentration region is in contact with the upper surface of the semiconductor substrate.

14. The semiconductor device according to claim 4, wherein:

the first high concentration region is also provided in the active portion; and the active portion includes a base region of the second conductivity type which is arranged on the upper surface side of the semiconductor substrate, and a low concentration region of the second conductivity type which is arranged between the base region and the first high concentration region and has a lower doping concentration than the base region.

15. The semiconductor device according to claim 14, wherein the first high concentration region and the second high concentration region are continuously provided in the edge terminal structure portion.

16. The semiconductor device according to claim 3, wherein the hydrogen peak portion is arranged between a lower end of each of the guard rings and the lower surface of the semiconductor substrate.

17. The semiconductor device according to claim 3, wherein the first high concentration region is in contact with the guard rings.

18. The semiconductor device according to claim 4, wherein a dose amount of the donor of the second high concentration region is equal to or lower than $5\times10^{11}/cm^2$.

19. The semiconductor device according to claim 18, wherein the dose amount of the donor of the second high concentration region is equal to or higher than $1\times10^{11}/cm^2$.

20. The semiconductor device according to claim 18, wherein a peak value of the donor concentration in the second high concentration region is 10 times as high as the doping concentration of the bulk donor or higher.

21. The semiconductor device according to claim 18, wherein the peak value of the donor concentration in the second high concentration region is 10 times as high as a minimum value of the donor concentration in the first high concentration region or higher.

22. The semiconductor device according to claim 18, wherein a distance between a lower end of the second high concentration region and an upper end of the first high concentration region is equal to or lower than 50 μm.

23. The semiconductor device according to claim 18, wherein a distance between a lower end of the second high concentration region and an upper end of the first high concentration region is equal to or higher than 15 μm.

24. The semiconductor device according to claim 18, wherein a depth position of a lower end of the second high concentration region is away from the upper surface of the semiconductor substrate by 2 μm or more.

25. The semiconductor device according to claim 3, wherein:

the first high concentration region is also provided in the active portion;

the active portion includes a base region of the second conductivity type which is arranged on the upper surface side of the semiconductor substrate, and a low concentration region of the second conductivity type which is arranged between the base region and the first high concentration region and has a lower doping concentration than the base region; and the first high concentration region is provided up to a position above a lower end of the guard ring in the edge terminal structure portion.

26. The semiconductor device according to claim 1, wherein the first high concentration region has a hydrogen donor.

27. The semiconductor device according to claim 1, wherein the bulk donor is phosphorus or antimony.

28. The semiconductor device according to claim 1, wherein the first high concentration region is provided in a range that does not reach the active portion.

29. The semiconductor device according to claim 1, wherein the first high concentration region has an inner part, and an outer part that is provided on an outer side relative to the inner part, and has a longer length of the semiconductor substrate in a depth direction than the inner part.

30. The semiconductor device according to claim 1, wherein a bulk acceptor of a second conductivity type is entirely distributed in the semiconductor substrate.

31. The semiconductor device according to claim 30, wherein the bulk acceptor is boron.

32. The semiconductor device according to claim 1, wherein:

the active portion has a fourth high concentration region of the first conductivity type in which a donor concentration is higher than the doping concentration of the bulk donor in the region between the upper surface and the lower surface of the semiconductor substrate;

an upper surface of the fourth high concentration region is located on the upper surface side of the semiconductor substrate;

a lower surface of the fourth high concentration region is located on the lower surface side of the semiconductor substrate; and the donor concentration of the fourth high concentration region is different from the donor concentration of the first high concentration region.

33. The semiconductor device according to claim 1, wherein:

the active portion has a fourth high concentration region of the first conductivity type in which the donor concentration is higher than the doping concentration of the bulk donor in the region between the upper surface and the lower surface of the semiconductor substrate;

an upper surface of the fourth high concentration region is located on the upper surface side of the semiconductor substrate;

a lower surface of the fourth high concentration region is located on the lower surface side of the semiconductor substrate; and an upper end position of the fourth high concentration region is different from an upper end position of the first high concentration region.

34. The semiconductor device according to claim 1, wherein the first high concentration region includes a flat portion in which a carrier concentration is substantially uniform in the depth direction, and the hydrogen concentration distribution has a larger inclination than the carrier concentration in the flat portion.

* * * * *